(12) United States Patent
Marzin et al.

(10) Patent No.: US 10,992,305 B2
(45) Date of Patent: Apr. 27, 2021

(54) INITIALIZATION METHOD FOR PRECISION PHASE ADDER

(71) Applicant: Blue Danube Systems, Inc., New Providence, NJ (US)

(72) Inventors: Giovanni Marzin, Springfield, NJ (US); Yiping Feng, Skillman, NJ (US)

(73) Assignee: Blue Danube Systems, Inc., New Providence, NJ (US)

( * ) Notice: Subject to any disclaimer, the term of this patent is extended or adjusted under 35 U.S.C. 154(b) by 0 days.

(21) Appl. No.: 16/747,757

(22) Filed: Jan. 21, 2020

(65) Prior Publication Data

US 2020/0244275 A1    Jul. 30, 2020

Related U.S. Application Data

(60) Provisional application No. 62/798,646, filed on Jan. 30, 2019.

(51) Int. Cl.
| | |
|---|---|
| *H03L 7/113* | (2006.01) |
| *H03D 7/14* | (2006.01) |
| *H03L 7/10* | (2006.01) |
| *H03F 3/45* | (2006.01) |
| *H03K 4/92* | (2006.01) |

(Continued)

(52) U.S. Cl.
CPC .......... *H03L 7/104* (2013.01); *H03D 7/1458* (2013.01); *H03F 3/45219* (2013.01); *H03K 4/92* (2013.01); *H03L 7/087* (2013.01); *H03L 7/099* (2013.01); *H03L 7/113* (2013.01); *H03F 2200/171* (2013.01)

(58) Field of Classification Search
CPC .. H03D 7/1441; H03D 7/1458; H03D 7/1491; H03D 2200/0088; H03L 7/093; H03L 7/104; H03L 7/113
See application file for complete search history.

(56) References Cited

U.S. PATENT DOCUMENTS

| | | | |
|---|---|---|---|
| 7,180,377 B1 | 2/2007 | Leong et al. | |
| 8,553,826 B2 * | 10/2013 | Banu | H04B 15/02 375/356 |

(Continued)

*Primary Examiner* — Patrick O Neill
(74) *Attorney, Agent, or Firm* — Occhiuti & Rohlicek, LLP

(57) ABSTRACT

A method for initializing a phase adder circuit including a multiplier circuit with its two inputs receiving signals of frequency $f_o$, a mixer circuit, an amplifier circuit, a low pass loop filter, and a voltage controlled oscillator (VCO), the method including: during a first phase, determining a reference voltage which when applied to the VCO causes it to produce a signal having a frequency of $nf_0$; during a second phase, supplying a signal of frequency $nf_o$ to a first input of the mixer and a signal of frequency $(nf_o+\Delta f)$ to a second input of the mixer; and determining an adjustment signal which when applied to the amplifier circuit causes the amplifier circuit to output a signal having a DC component equal to the reference voltage; and during a third phase, forming a primary phase locked loop (PLL) circuit including the mixer, the amplifier circuit, the low pass loop filter and the VCO; and applying the adjustment signal to the amplifier circuit.

14 Claims, 41 Drawing Sheets

(51) Int. Cl.
  *H03L 7/087* (2006.01)
  *H03L 7/099* (2006.01)

(56) References Cited

U.S. PATENT DOCUMENTS

| | | |
|---|---|---|
| 10,693,417 B2 * | 6/2020 | Banu .................... H03D 7/1441 |
| 2007/0247248 A1 | 10/2007 | Kobayashi et al. |
| 2018/0269836 A1 | 9/2018 | Banu et al. |

* cited by examiner

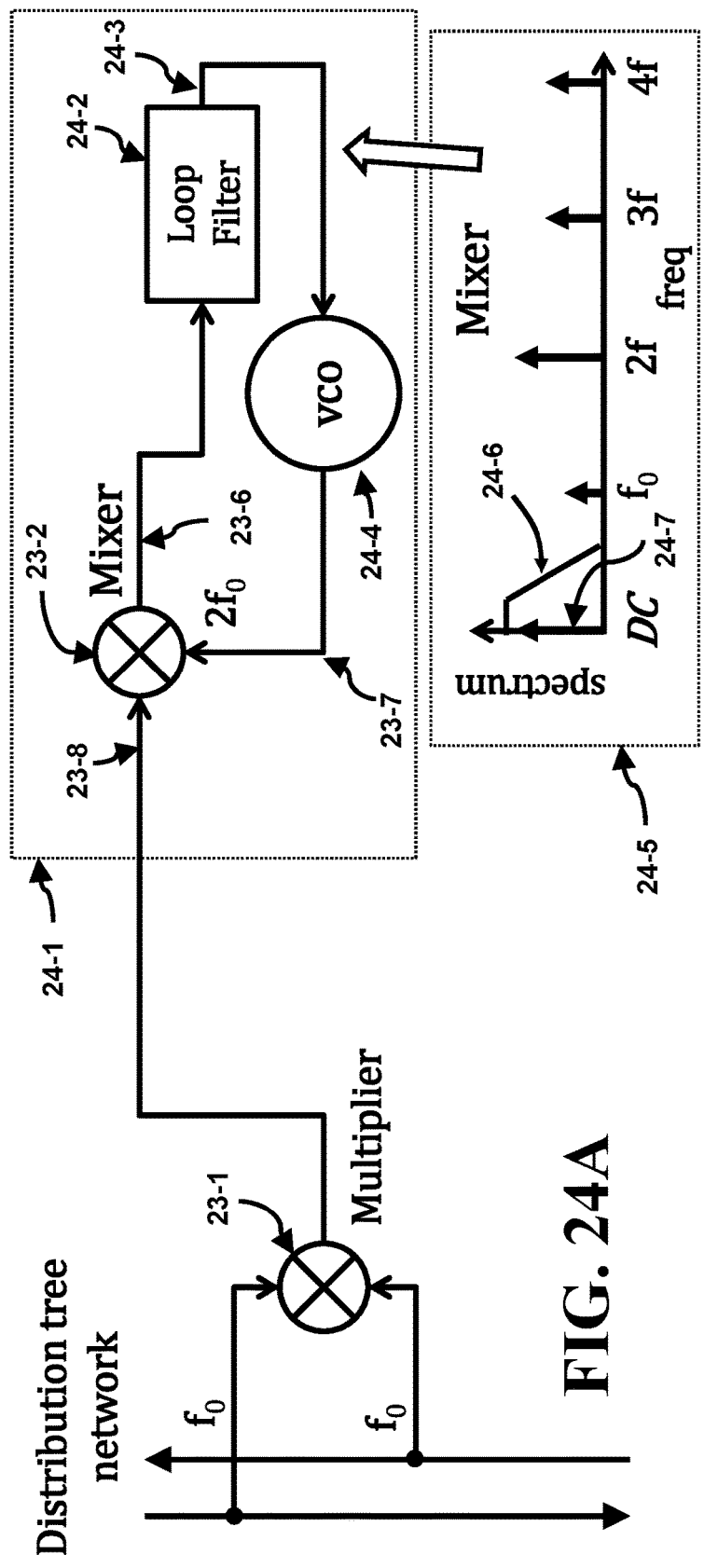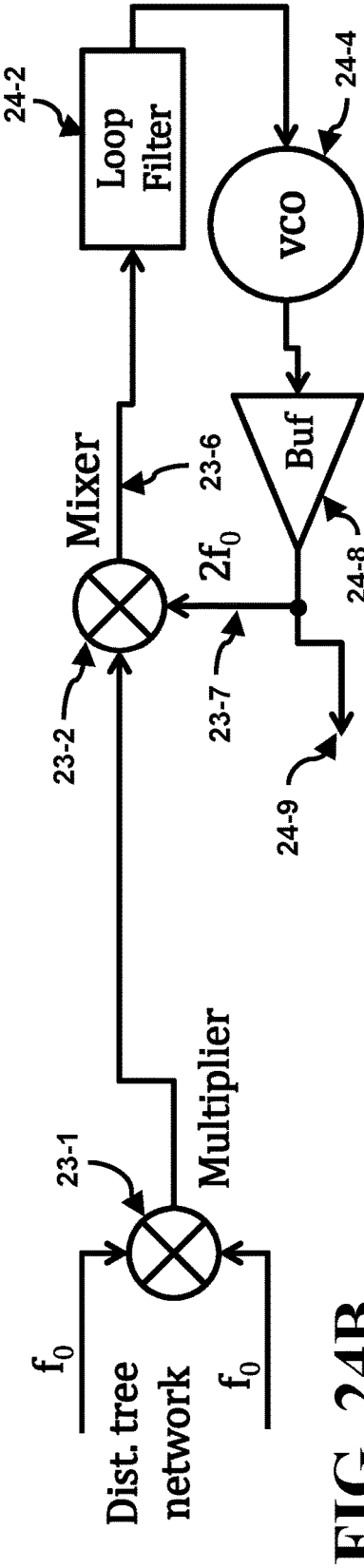
FIG. 24A
FIG. 24B

INITIALIZATION METHOD FOR PRECISION PHASE ADDER

This application claims the benefit under 35 U.S.C. 119(e) of Provisional Application Ser. No. 62/798,646, filed Jan. 30, 2019, entitled "Initialization Method for Precision Phase Adder," the entire contents of which are incorporated herein by reference.

TECHNICAL FIELD

Embodiments generally relate to methods for initializing and/or calibrating a phase adder circuit.

BACKGROUND

A general method for the distribution of phase coherent signals over long electrical distances is described in a patent by Mihai Banu and Vladimir Prodanov "Method and System for Multi-point Signal Generation with Phase Synchronized Local Carriers" U.S. Pat. No. 8,553,826, published Oct. 8, 2013, the disclosure of which is incorporated herein by reference in its entirety. One application of this method is the distribution of a local oscillator (LO) signal in the active arrays as described in in a patent by Mihai Banu, Yiping Feng, and Vladimir Prodanov "Low Cost, Active Antenna Arrays" U.S. Pat. No. 8,611,959, published Dec. 17, 2013, the disclosure of which is incorporated herein by reference in its entirety. Another application is high-speed clock distribution in very large silicon chips.

The method of U.S. Pat. No. 8,553,826 uses two tree distribution networks and a plurality of circuits called "S-Clients", which detect a fixed global network parameter called "synchronization flight time". Based on this parameter, the S-Clients generate signals, which are substantially phase coherent (practically identical phases). The quality of these S-Clients is critical for the precision of the entire system. In other words, in order to have small phase errors between the signals generated by the S-Clients, the latter must operate close to ideal S-Clients. When sinusoidal signals (single tones) are used, the generation of the phase coherent signals reduces to the simple operation of adding the phases of two signals propagating on the branches of the dual tree distribution networks. Therefore, phase adders form a class of simple S-Client circuits.

Conceptually, in terms of phase processing, a phase adding circuit is equivalent to an ideal single-side-band analog multiplier. A single-side-band analog multiplier accepts two tones at its two inputs and generates a single tone at its output. The phase of the output tone is the sum of the phases of the input tones. This is the result of simple trigonometry: the multiplication of two sinusoidal signals equals the sum of two terms: one with added phases and one with subtracted phases. Each term represents a single-side-band analog multiplier and the sums of both terms represent a double-side-band analog multiplier.

In practice, the realization of a single-side-band analog multiplier with ideal or close to ideal characteristics is difficult, especially if the input signals are at high frequencies. First, non-linear effects usually present in practice (enhanced at high frequencies), generate undesired spurious signals producing output phase errors. Second, all practical analog multipliers are double-side-band analog multipliers and removing one side band is prone to introducing additional output phase errors. Therefore, the application of the technique in U.S. Pat. No. 8,553,826 with sinusoidal signals is limited by the quality of phase adders that can be realized in practice.

SUMMARY

Phased arrays consist of a plurality of antennas distributed over a surface area. The plurality of antennas functions as a cohesive unit to send or receive a plurality of communication channels to different specific regions of space. Each of the antennas contributes a small portion of these communication channels. The coordination of transmitting or receiving signals over the surface area of the phased array requires a uniform timing reference. Providing a uniform timing reference over a surface area that has X and Y dimensions of typically many wavelengths of a carrier frequency of the communication channels is required. Phase adder circuits coupled to the network of the tree distribution signals of U.S. Pat. No. 8,553,826 provide this uniform timing reference by generating a reference product component for each of the plurality of antennas.

A phased array comprises a plurality of phase adder circuits coupled into the network of the tree distribution signal, where the network has a fixed global network parameter called "synchronization flight time" that is constant extending over the X and Y dimensions of the area of the phased array. Each instance of any of the plurality of phase adders that couples to the network and that uses this global network parameter generates a reference product component that has substantially the same phase and frequency as the copies of the reference product component generated by all remaining phase adders coupled to the network within the phased array. The plurality of reference product components generated by the phase adders provides a uniform timing reference for each of the antennas of the phased array.

In general, in one aspect, the invention features a method for initializing a phase adder circuit for use with a signal distribution network having a first line carrying a first signal of a frequency $f_o$ and a second line carrying a second signal of the frequency $f_o$. The phase adder includes a multiplier circuit with a first input electrically connected to the first line of the distribution network and a second input electrically connected to the second line of the distribution network, a mixer circuit electrically connected to the multiplier circuit, an amplifier circuit, a low pass loop filter, and a voltage controlled oscillator (VCO) with an input and an output. The method includes: during a first phase of operation, determining a reference voltage which when applied to the input of the VCO causes the VCO to produce at its output a signal having a frequency of $nf_o$, where n is a positive integer; during a second phase of operation, supplying a signal of frequency $nf_o$ to a first input of the mixer; supplying a signal of frequency $(nf_o+\Delta f)$ to a second input of the mixer, wherein n is an integer greater than zero, and $\Delta f$ is a frequency that is smaller than $f_o$; and determining an adjustment signal which when applied to the amplifier circuit causes the amplifier circuit to output a signal having a DC component equal to the reference voltage; and during a third phase of operation, forming a primary phase locked loop (PLL) circuit including the mixer, the amplifier circuit, the low pass loop filter and the VCO; and applying the adjustment signal to the amplifier circuit.

Other embodiments include one or more of the following features. Determining the reference voltage during the first phase of operation involves forming an initialization PLL circuit including the VCO, the loop filter, and a phase detector having a first input, a second input, and an output, with the first input of the phase detector electrically connected to the first line of the signal distribution network, the second input of the phase detector electrically connected to the output of the VCO, and the output of the phase detector electrically connected to an input of the low pass loop filter. Supplying the signal of frequency $(nf_o+\Delta f)$ to the second input of the mixer during the second phase of operation involves: electrically disconnecting the input of the loop filter from the output of the phase detector; and electrically connecting the input of the loop filter to a signal source providing a frequency selection signal that causes the VCO to output a signal of frequency $(nf_o+\Delta f)$. Determining the adjustment signal during the second phase of operation involves incrementally adjusting a bias level that is supplied to the amplifier circuit until a target value is found at which the amplifier circuit outputs the signal having a DC component substantially equal to the reference voltage, wherein the target value is the adjustment signal. The amplifier circuit has an input node and wherein the bias level that is supplied to the amplifier circuit is a bias current that is supplied to the input node of the amplifier circuit. Forming the primary phase locked loop (PLL) circuit during the third phase of operation involves: electrically disconnecting the input of the loop filter from the signal source providing the frequency selection signal; and electrically connecting the input of the loop filter to the output of the amplifier circuit. The number n is equal to 2. The quantity $\Delta f$ is much smaller than $f_0$. The method also involves: implementing the multiplier circuit as a double balanced triode interface; implementing the mixer circuit as a double balanced Gilbert mixer; and implementing the amplifier circuit as a folded cascode amplifier. The first and second signals are sinusoidal signals. The signal of frequency $nf_0$ that is supplied to a first input of the mixer during the second phase of operation is a sinusoidal signal and the signal of frequency $(nf_o+\Delta f)$ that is supplied to the second input of the mixer during the second phase of operation is a sinusoidal signal. The signal that is produced at the output of the VCO during the first phase of operation is a sinusoidal signal having a frequency of $nf_0$.

BRIEF DESCRIPTION OF THE DRAWINGS

FIG. 24A depicts the mixer of FIG. 23 used in forming a phase locked loop (PLL) to eliminate all higher order frequency components.

FIG. 24B depicts the mixer of FIG. 23 used in forming a phase locked loop (PLL) with a buffer to eliminate all higher order frequency components.

In the preceding figures, like elements and like components may be identified with like reference numbers.

The details of one or more embodiments of the invention are set forth in the accompanying drawings and the description below. Other features, objects, and advantages of the invention will be apparent from the description and drawings, and from the claims.

DETAILED DESCRIPTION

Use of Phase Adders for Coherent Distribution of Signals

Figure 1:
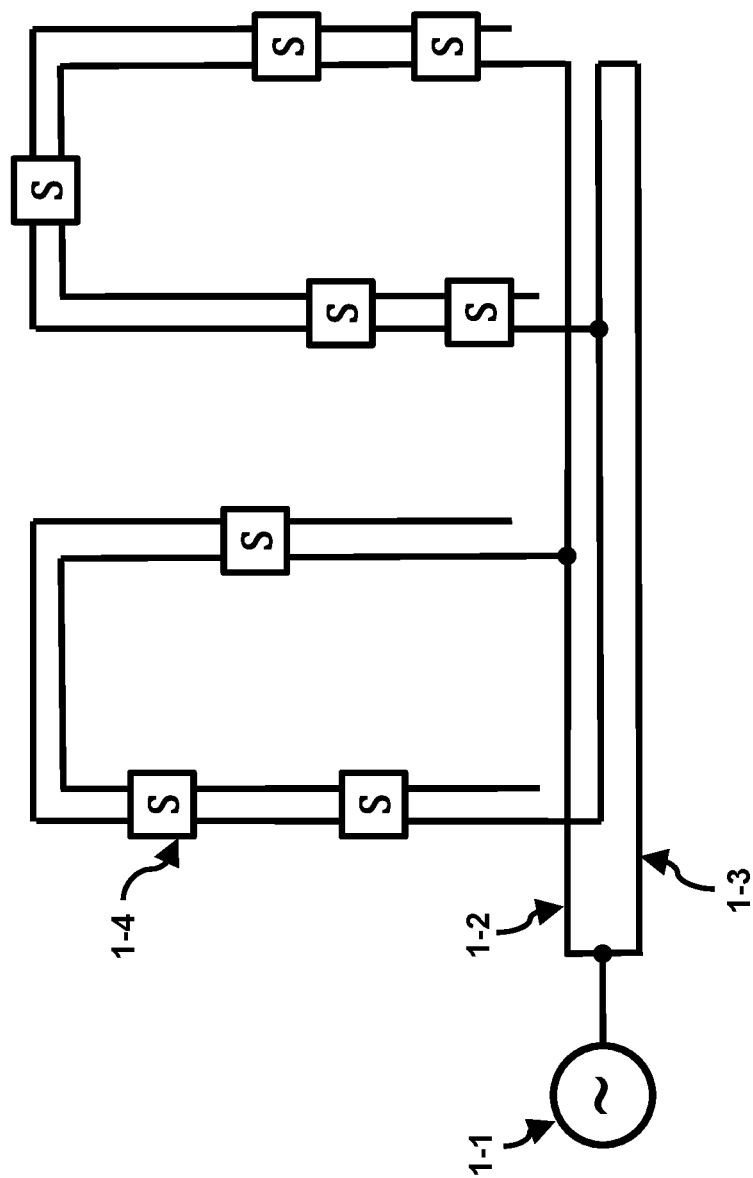
FIG. 1 depicts a distribution network with coherent output signals as described in U.S. Pat. No. 8,553,826.

FIG. 1 shows an embodiment of the signal distribution concept described in U.S. Pat. No. 8,553,826. The generator 1-1 excites two tree distribution networks (DTNs): distribution network 1-2 and distribution network 1-3. The two tree distribution networks are constructed such that at every place where S-Clients 1-4 sit, the sum of the signal travel times from the generator to each S-Client through both tree networks is a network constant called synchronization flight time. The S-Clients detect the synchronization flight time and generate globally phase coherent signals whose phases are functions of the synchronization flight time.

Figure 2:
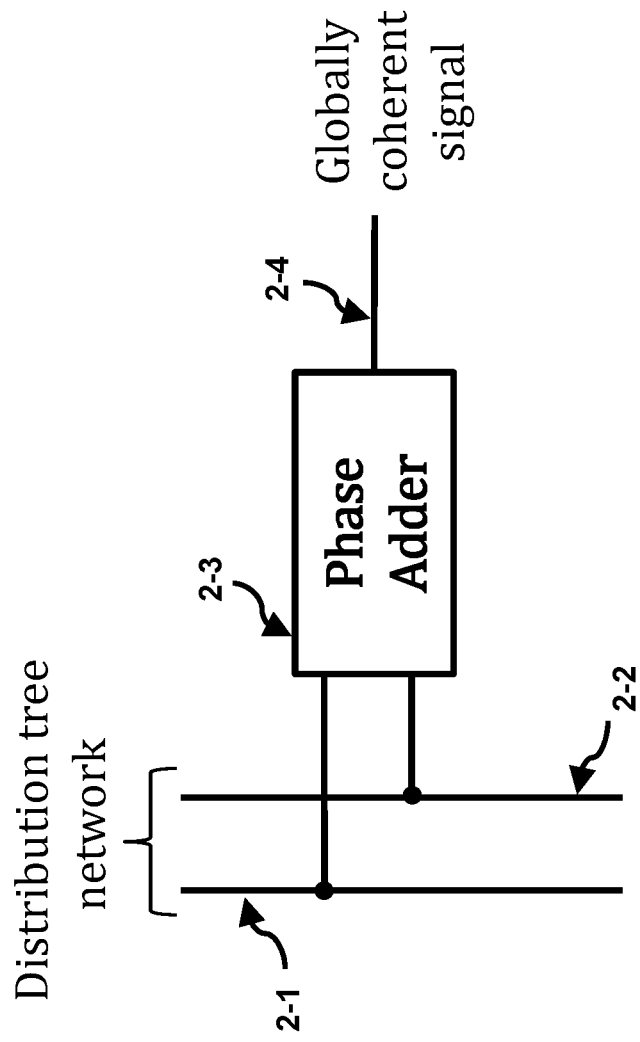
FIG. 2 depicts a block diagram of a phase adder used as an S-Client for the network in FIG. 1.

In the case where the signals generated by generator 1-1 in FIG. 1 are non-modulated carriers (periodic signals), the S-Clients need only add the phases of the local signals detected from the two tree distribution networks to generate globally coherent signals. FIG. 2 shows an implementation of the S-Client circuit. The phase adder 2-3 adds the phases of the signals traveling on the branch 2-1 of the first distribution tree and on the branch 2-2 of the second distribution tree. The phase of the output signal 2-4 is a constant corresponding to the constant synchronization flight time of the network.

The implementation of the phase adder 2-3 in FIG. 2 is conceptually simple if the signals traveling on the two tree networks are single tones (sinusoidal). In this case, the phase adder can be a single-side-band analog multiplier.

Phase Errors in Conventional High Frequency Analog Multipliers

Active devices, such as transistors and diodes, are non-linear devices. Conventional analog multipliers that use these non-linear devices generate intermodulation distortion when a first input signal multiplies a second input signal. The intermodulation distortion generates higher order harmonics of each of these two input signals, sums and differences between the frequencies of these input signals, and integer multiples of sums and differences between the frequencies of the two input signals. An analog multiplier typically generates the product component, which corresponds to the sum of the frequency of the two input signals. Filtering techniques attempt the removal all of the remaining components. However, filtering may not be able to eliminate all of the components. Some of the integer multiples of sums and differences between the two input frequencies can have a resultant frequency that is very near to the desired product component, or worst, overlaps the desired product component. These components of the intermodulation distortion generated by conventional analog multipliers introduce phase errors in the desired product component.

The intermodulation components that overlap or are very near the product component are spurs and degrade the quality of the product component. A filter may remove some of these intermodulation components near the product component. However, the filter may need a very sharp response requiring the need for a high order filter, which tends to be very costly. Secondly, these filters introduce their own phase error. The intermodulation components that overlap the desired product component are not removable and introduce phase error into the desired product component. Therefore, an analog multiplier with improved linear characteristics that reduces or eliminates the intermodulation distortion forming spurs would be very desirable.

Another type of multiplier is the single side band multiplier. The single side band multiplier uses image rejection to remove the intermodulation product of the difference between the frequencies of the two input signals. The first input signal is phase shifted 90° and coupled to a first analog multiplier. The second input signal couples to the first analog multiplier. These two signals multiply one another and the resultant product of the first analog multiplier comprising the upper and lower sidebands couples to a summing unit. Then, the first input signal couples to the second analog multiplier. The second signal is phase shifted 90° and coupled to the second analog multiplier. These two signals multiply one another and the resultant product of the second analog multiplier comprising the upper and lower sidebands couples to the summing unit. In an ideal situation, the summing unit combines these components together; the lower sidebands are 180° out of phase canceling each other out, while the upper sideband components are in phase, and add together providing the result. However, the input signals have a finite bandwidth and the phase shift devices have transfer curves over the finite bandwidth that is a function of frequency. Over this finite bandwidth, it is difficult to match the behavior of the single sideband circuit over this finite bandwidth. This introduces a phase error in the multiplied signal.

Intermodulation Products

Figure 3A:
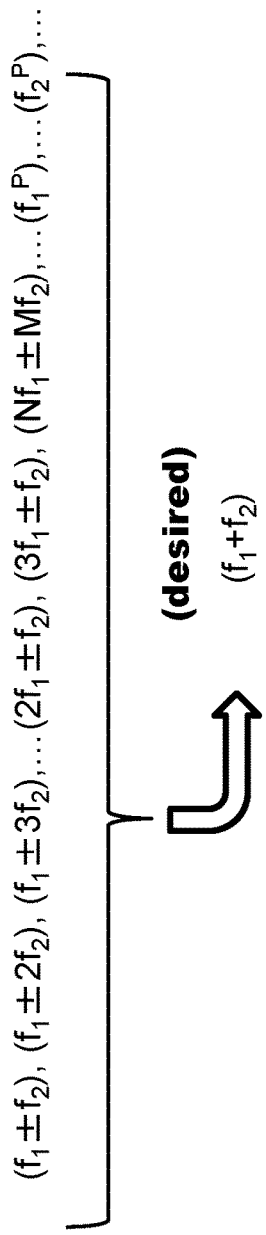
FIG. 3A depicts a conventional analog multiplier multiplying two tones each having a different frequency and a description of the intermodulation products produced by the non-linear operation of the analog multiplier.

FIG. 3A illustrates a conventional analog multiplier 3-1 that mixes two frequency tones of $f_1$ and $f_2$ to produce a resulting signal at the output node 3-2. Typically, conventional analog multipliers operate in the nonlinear region. The biasing of these devices in these analog multipliers cause the multiplication of these two frequency tones to generate a desired component along with a number of intermodulation products. One of the multiplication components is the frequency tone $(f_1+f_2)$ that is a summation of the two input frequency tones. The other multiplication component is the frequency tone $(f_1-f_2)$ that is a difference of the two input frequency tones. In addition to these components, there are a number of frequency tones generated at the output of the analog multiplier. These frequency tones include a sum and difference between the higher order harmonics of the two input frequency tones as indicated by EQU. 1. Due to the nonlinearity of the analog multiplier, the signal at the output node 3-2 contains frequency tone components that include these higher order terms of each frequency and summations or differences of various multiplicative factors between the two input frequency tones as presented in EQU. 1. The desired frequency tone $(f_1+f_2)$ is accompanied components that are undesirable and degrade the quality of the desired frequency tone.

$$(f_1 \pm f_2), (f_1 \pm 2f_2), (f_1 \pm 3f_2), \ldots (2f_1 \pm f_2), (3f_1 \pm f_2) \ldots, (Nf_1 \pm Mf_2) \ldots, f_1^P, \ldots, f_2^P, \ldots, \quad \text{(EQU. 1)}$$

Figure 3B:
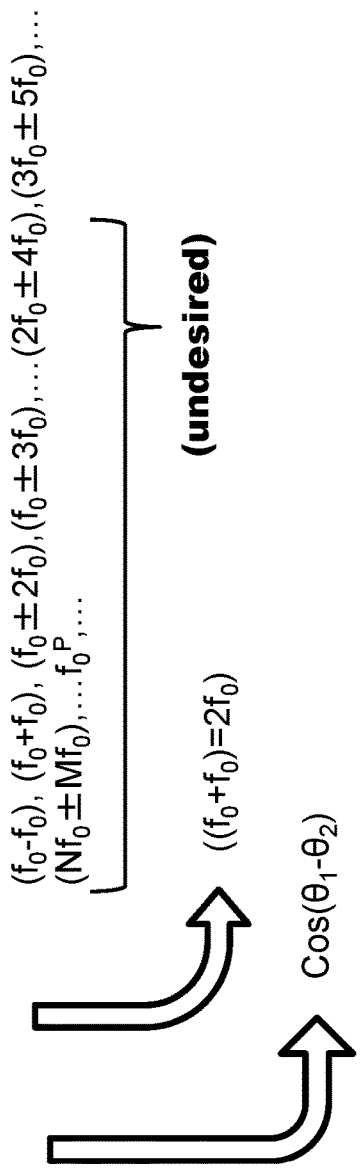
FIG. 3B depicts a conventional analog multiplier multiplying two tones each having the same frequency and a description of the intermodulation products produced by the non-linear operation of the analog multiplier.

FIG. 3B illustrates the conventional analog multiplier 3-1 that mixes two equal frequency tones of $f_0$ and $f_0$ to produce a resulting signal at the output node 3-3. As mentioned earlier, these analog multipliers operate in the nonlinear region and the multiplication of these two frequency tones generates a desired component along with a number of intermodulation products. The nonlinearity of the conventional analog multiplier is due to the operation of the devices within the conventional analog multiplier operating in the nonlinear region. One of the desired multiplication components may be the frequency tone that is simply the summation of the two input frequency tones $(f_0+f_0=2\,f_0)$. Another resulted component is the difference between the two input frequency tones $(f_0-f_0=0)$, which in this case has a DC voltage of $\cos(\theta_1-\theta_2)$, where $\theta_1$ and $\theta_2$ are the phases of the two input frequency tones.

In addition to these components, there are many additional frequency tones generated on the output of the analog multiplier. These frequency tones include a number of different frequency tones that consists of the sum and difference of multiples of the frequency tone as indicated by EQU. 2. Due to the nonlinearity of the analog multiplier, the signal at the output node 3-3 contains frequency tone components that include higher order terms of each of the input frequency tones and various other summations and differences of various multiplicative factors between the two input frequency tones as presented in EQU. 2.

$$\cos(\theta_1-\theta_2), (2f_0), (f_0+2f_0), (f_0+3f_0), \ldots (2f_0 \pm 3f_0), (3f_0 \pm 5f_0) \ldots, (Nf_0 \pm Mf_0) \ldots, f_0^P, \ldots, \quad \text{(EQU. 2)}$$

The desired multiplication component is where M=N=1 or $f_0+f_0=2\,f_0$ and all remaining components generated by the conventional analog multiplier 3-1 are undesired. The DC voltage, $f_0-f_0=\cos(\theta_1-\theta_2)$, generated by the analog multiplier is a function of phase of each of the equal frequency tones. Also, those intermodulation products where |M−N|=2, and P=2 are spurs and need to be reduced or eliminated since they have the same frequency as the desired $2\,f_0$ frequency term. Some of these spurs can be located 15 dB below the desired product component introducing as much as 10° of phase error. An analog multiplier that operates in a linear region can significantly minimize the generation of these intermodulation products. Such an analog multiplier would be a desirable device particularly if it can eliminate or significantly reduce the amplitude of the intermodulation products and spurs.

MOS Transistor Characteristics in the Triode Region

An analog multiplier with linear characteristics can reduce the magnitude of or eliminate some of the integer multiples of sums and differences between the two input frequency signals. This analog multiplier can significantly reduce or eliminate the spurs altogether. An analog multiplier with such a linear behavior would provide a purer or more ideal product component when the two input frequency signals multiply one another. One embodiment of a phase adder circuit presented in this specification when compared to conventional multipliers reduces the magnitude of the spurs from 15 dB down to 30 dB and reduces the phase error from 10° to less than 1°, respectively.

Figure 4A:
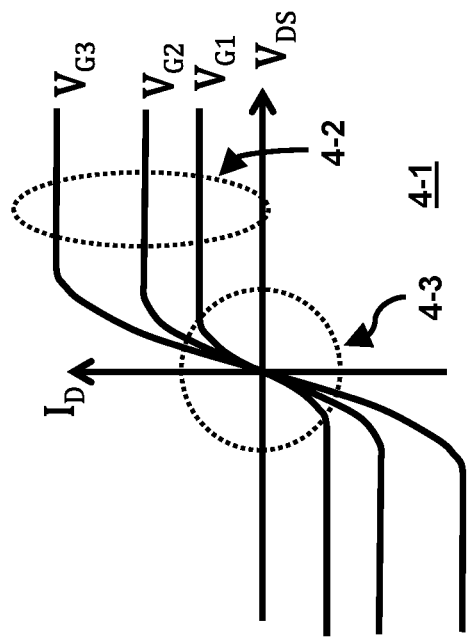
FIG. 4A depicts the I-V curves for a MOS transistor highlighting the transfer curves in the triode and saturation regions.

FIG. 4A illustrates the IV (current-voltage) characteristics 4-1 of an MOS transistor. Conventional analog multipliers typically operate MOS transistors in the saturation region 4-2. The non-linearity of the behavior of these MOS transistors operated in the saturation region is evident as indicated by the intermodulation products presented in EQU. 1 and EQU. 2.

Figure 4B:
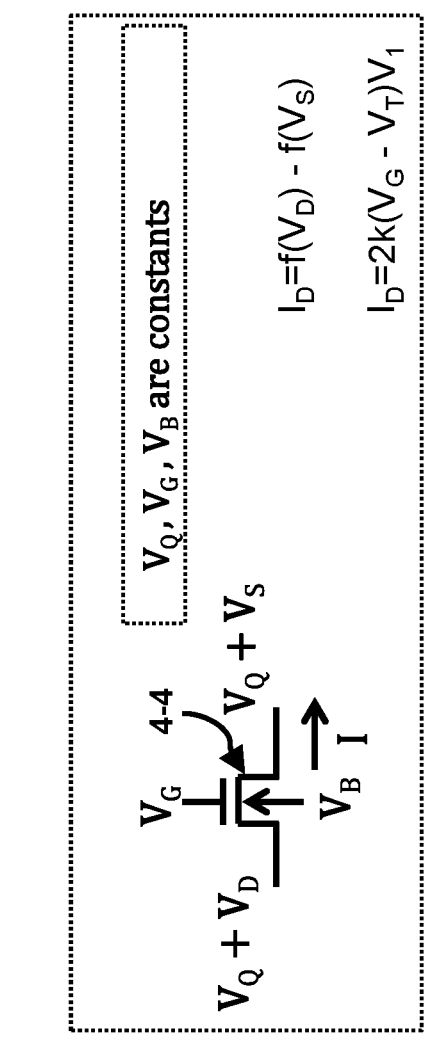
FIG. 4B depicts an embodiment of an MOS device configured to operate in the triode region.

However, the triode region 4-3 offers transistors that can operate as practically linear devices. Transistors biased to operate in the triode region create analog multipliers that behave practically linearly. FIG. 4B illustrates an MOS device 4-4 configured to illustrate the operation of the MOS device in the triode region. Assume that the voltages $V_Q$, $V_G$, and $V_B$ are constants and bias the transistor 4-4 to operate in the triode region. The current flowing in MOS device 4-4 is now a function of the two variable voltages $V_D$ and $V_S$ applied to the source and drain as indicated in EQU. 3. Note that if the gate voltage of the MOS transistor 4-4 is constant, the current through the device 4-4 can be represented to as:

$$I=f(V_D)-f(V_S) \quad \text{(EQU. 3)}$$

Each function in EQU. 3 can be further represented as a Taylor series expansion as indicated in EQU. 4:

$$f(V)=a_0+a_1V+a_2V^2+a_3V^3+a_4V^4+\ldots \quad \text{(EQU. 4)}$$

where $a_{0-n}=f(V_G, V_Q, V_T)$ and $V_T=f(V_B, V_Q)$.

Substituting EQU. 4 into EQU. 3 provides:

$$I=a_1(V_D-V_S)+a_2(V_D^2-V_S^2)+a_3(V_D^3-V_S^3)+a_4(V_D^4-V_S^4)+\ldots \quad \text{(EQU. 5)}$$

Let the variable voltage applied to the source and drain terminals have a differential component where (($V_D=V_1$) and ($V_S=-V_1$)) and substituting these equivalent values into EQU. 5 simplifies to:

$$I=2a_1V_1+2a_2(V_1^2-V_1^2)+2a_3(V_1^3+V_1^3)+2a_4(V_1^4-V_1^4)+\ldots \quad \text{(EQU. 6)}$$

Note that all of the even terms in EQU. 6 cancel and go to zero. In addition, the third order odd component is negligible since $a_3$ is approximately equal to zero. Furthermore, all the higher order odd coefficients are significantly less than $a_3$ and can be disregarded. By eliminating these terms and substituting $a_1=k(V_G-V_T)$ where k is one of parameters defining the transistor, EQU. 6 becomes:

$$I=2k(V_G-V_T)V_1 \quad \text{(EQU. 7)}$$

Since $V_G$ and $V_T$ are assumed constant, the MOS device 4-4 behaves as a linear resistor in the triode region 4-3.

Figure 4C:
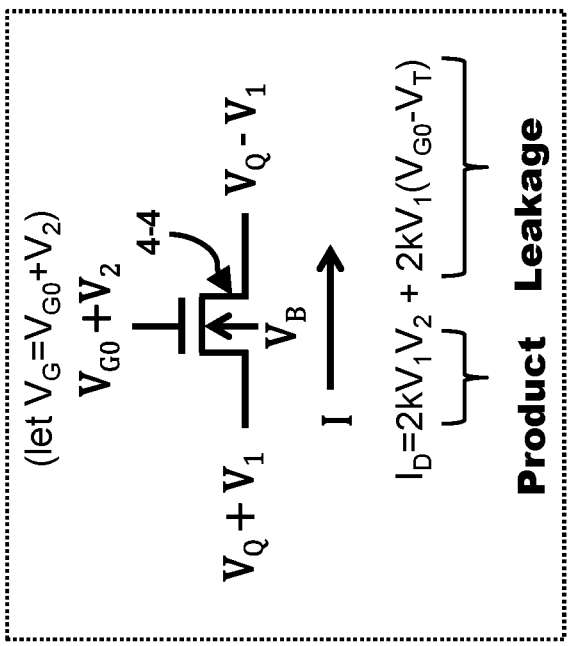
FIG. 4C depicts an embodiment of an MOS device configured to operate as a multiplier while operated in the triode region.

FIG. 4C introduces a second variable signal voltage $V_2$ applied to the gate of MOS transistor 4-4 as presented in EQU. 8:

$$V_G=V_{G0}+V_2 \quad \text{(EQU. 8)}$$

Substituting EQU. 8 into EQU. 7 and simplifying provides the current through MOS device 4-4 as EQU. 9 which consists of two parts: a reference product component and a leakage term.

$$I=2kV_1V_2+2kV_1(V_{G0}-V_T) \quad \text{(EQU. 9)}$$

The first term is a reference product component of $2 kV_1V_2$ representing the multiplication product. The second term is the leakage term $2 kV_1(V_{G0}-V_T)$ and represents the leakage component of the MOS device 4-4.

Figure 4D:
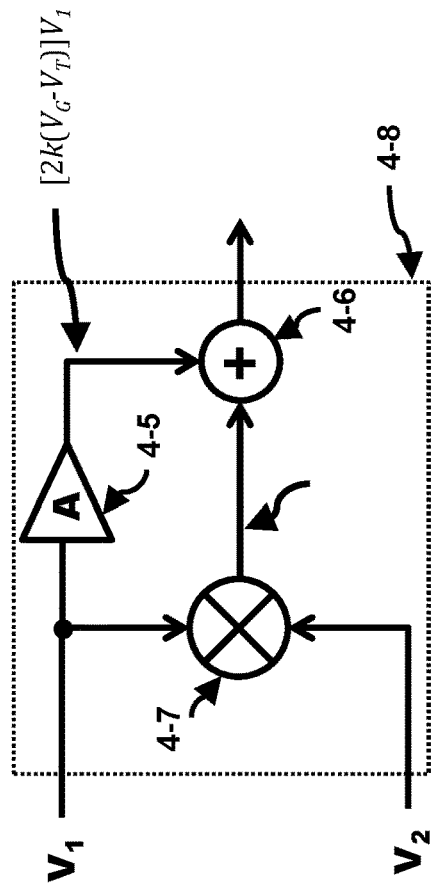
FIG. 4D depicts an embodiment of a circuit block representation of the triode transistor in FIG. 4C.

FIG. 4D illustrates a circuit model representation of the MOS device 4-8 configured as an analog multiplier operating in the triode region. The multiplier 4-7 represents the reference product component of $2 kV_1V_2$ corresponding to an ideal multiplication. The amplifier A has a magnitude of $2 k(V_{G0}-V_T)$ and multiplies one of the inputs $V_1$ to form the leakage component. The summer 4-6 combines the two terms of the ideal reference product component and a leakage component.

The MOS device 4-4 as configured in FIG. 4C is the triode transistor and exploits the linear properties of the MOS device to create an analog multiplier. The DC voltages $V_Q$, $V_B$, and $V_{G0}$ bias the operation of the transistor in the triode region. Differential signal voltages $V_1$ and $-V_1$ couple to the source/drain terminals while a second signal voltage $V_2$ couples to the gate. The triode transistor generates the current described in EQU. 9 when the transistor is biased in the triode region.

Figure 4E:
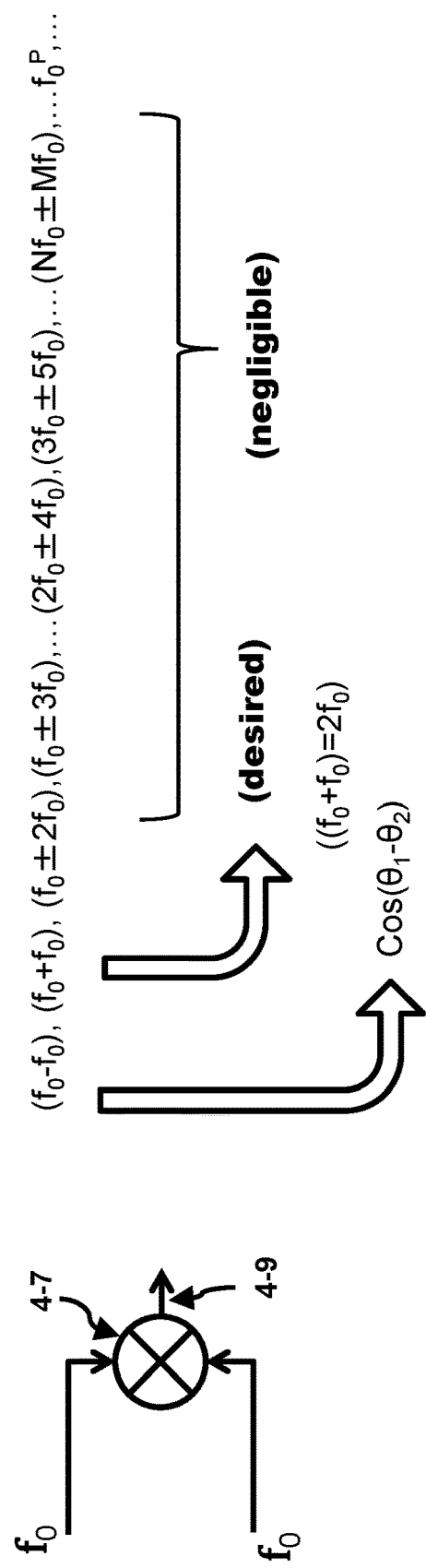
FIG. 4E depicts an embodiment of an ideal multiplier multiplying two tones each having the same frequency and a description of the intermodulation products produced by the operation of the triode multiplier.

FIG. 4E illustrates the reference product components mixing two equal frequency tones of tones $f_0$ in a triode multiplier 4-7. FIG. 4E presents the collection of intermodulation components at the output node 4-9. In the triode multiplier, the transistor operates in the triode region 4-3 of FIG. 4A where the MOS device exhibits linear behavior. The triode multiplier generates a frequency tone that is simply the summation of the two input frequency tones ($f_0+f_0=2 f_0$) known as the reference product component. Another resultant component is the difference between the two input frequency tones ($f_0-f_0=0$) known as the DC component. The DC component has a DC voltage equal to $\cos(\theta_1-\theta_2)$ where $\theta_1$ and $\theta_2$ are the phases of the two input frequency tones. All of the even order higher harmonics components (see EQU. 6) are equal to zero, while the coefficients for the third and odd higher order components are essentially zero. Therefore, all of the higher order components generated by the triode multiplier 4-7 in FIG. 4E are essentially zero or negligible. Thus, in total, by referring to FIG. 4D and FIG. 4E, the triode transistor generates three components: the product component at 2 $f_0$, the leakage component at $f_0$, and the DC component. The claimed functionally of the triode transistor can be implemented with either an N-channel or a P-channel MOS transistor. The disclosed material is exemplary and should be construed as illustrating, not limiting, the scope of the claims.

Implementing the Triode Multiplier

Figure 5:
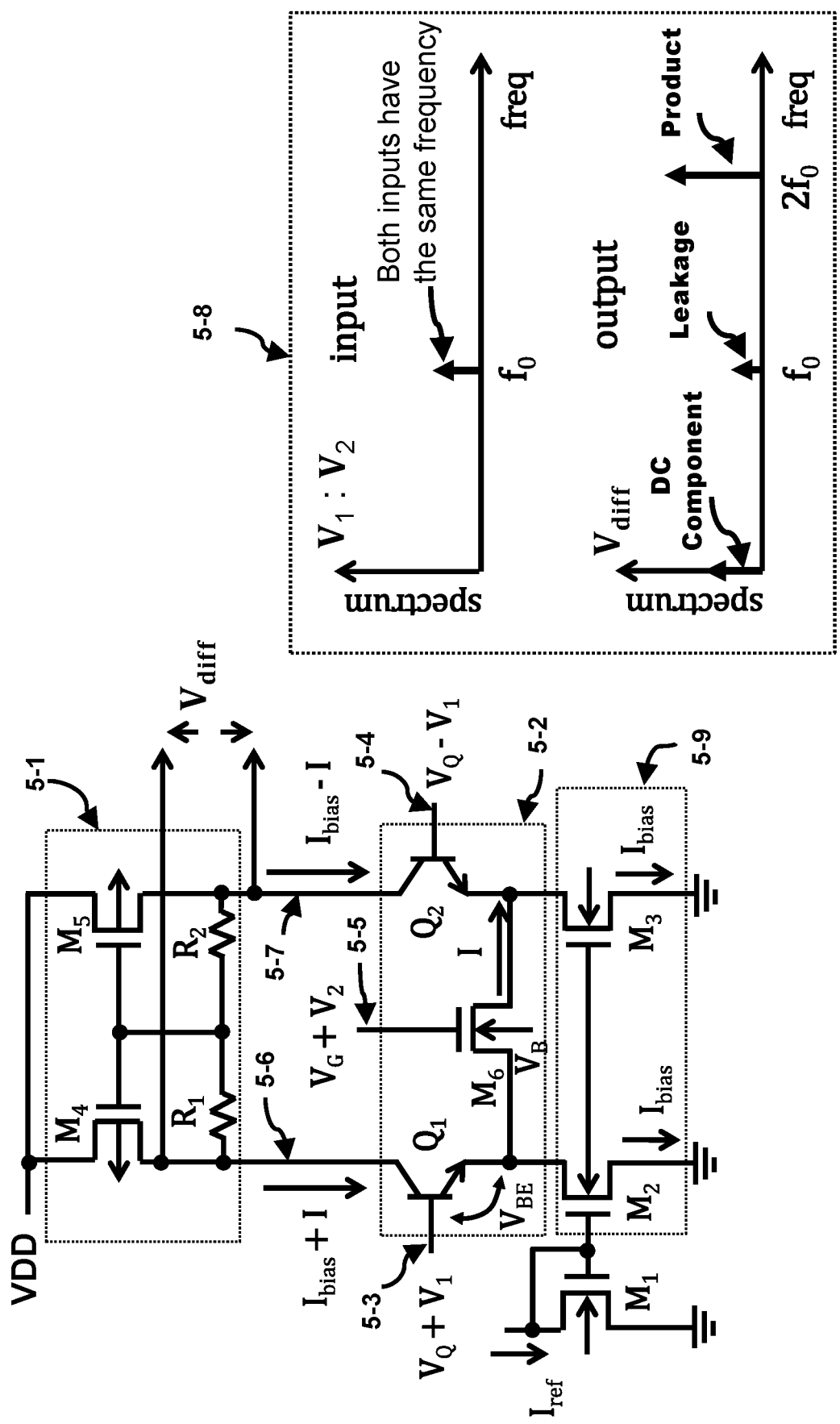
FIG. 5 depicts an embodiment of a circuit diagram of a differential triode multiplier formed with bipolar junction transistors (BJT) and a passive load along with the intermodulation products.

FIG. 5 illustrates a BiCMOS differential triode multiplier comprising the triode transistor using an N-channel MOS transistor M6. Transistors M1, M2, and M3 are N-channel MOS transistors, transistors M4 and M6 are P-channel MOS transistors and transistors Q1 and Q2 are bipolar junction transistors (BJT). The differential triode multiplier includes two circuit paths or legs between the power supplies of VDD and VSS. Transistor $M_4$ couples VDD to the collector of $Q_1$ and transistor $M_2$ couples VSS to the emitter of transistor $Q_1$ forming the first leg of the differential triode multiplier. Transistor $M_5$ couples VDD to the collector of $Q_2$ and transistor $M_3$ couples VSS to the emitter of transistor $Q_2$ forming the second leg of the differential triode multiplier. Transistors $M_2$ and $M_3$, located within the current source unit 5-9, are current sources that provide a current $I_{bias}$ to the first leg and the second leg, respectively. Transistors $M_4$ and $M_5$, located within the differential load circuit 5-1, form a passive load for the first leg and second leg of the differential triode multiplier, respectively.

The triode transistor $M_6$ couples the two legs of the differential amplifier at the emitters of transistors $Q_1$ and $Q_2$. The node 5-5 coupled to the gate of $M_6$ receives the signal voltage $V_2$, while the source and drain of the triode transistor $M_6$ receives the differential signal voltage of $V_1$ via the nodes 5-3 and 5-4 coupled to the base junctions of the $Q_1$ and $Q_2$ bipolar junction transistors (BJT), respectively. The applied differential signal voltage of $V_1$ at the bases of the BJT's each experiences a $V_{BE}$ drop. Each of the differential signal voltages of $V_1$ are down shifted by this voltage drop before being applied to the source and drain of the triode transistor $M_6$. The triode transistor $M_6$ multiplies the signal voltage $V_2$ times the "$V_{BE}$ shifted voltage $V_1$", hereinafter, unless specifically stated otherwise, referred as $V_1$. The transistor configuration of the three transistors, in this case $Q_1$, $Q_2$ and $M_6$, forms a triode interface 5-2. The transistor $Q_1$ and $Q_2$ interface the triode transistor to the differential triode multiplier. The triode interface represents the circuit block performing the multiplication and is between a load 5-1 and a current source 5-9. The DC voltages $V_Q$, $V_G$, and $V_B$ bias the operation of the triode transistor in the triode region. Adjustment of these DC voltages also controls the gain of the overall circuit.

The multiplication of $V_1$ times $V_2$ causes a current I represented by EQU. 9 to flow through the triode transistor $M_6$ as depicted in FIG. 5. Current I adds to the bias current $I_{bias}$ in the first leg of the differential triode multiplier while the same current I subtracts from the bias current $I_{bias}$ in the other leg of the differential triode multiplier. Each leg of the differential triode multiplier connects to a differential load circuit 5-1. The differential triode multiplier generates a differential output signal voltage $V_{diff}$ between legs 5-6 and 5-7 across the differential load circuit.

The current $I_{ref}$ in the diode connected MOS transistor $M_1$ adjusts the bias current $I_{bias}$. Transistors $M_2$ and $M_3$ in the current source unit 5-9 mirror the bias current $I_{bias}$ into the legs of the differential triode multiplier. A scaling of the physical dimensions of transistors $M_2$ and $M_3$ compared to the physical dimension of transistor $M_1$ sets the $I_{bias}$ current within each leg of the triode multiplier circuit. The current $I_{ref}$ adjusts the current $I_{bias}$. Typically, each leg of the differential triode multiplier has identical characteristics, for example, transistor $Q_1$ is identical to $Q_2$, transistor $M_4$ is identical $M_5$, etc.

The differential load circuit 5-1 uses a common mode voltage determined by the resistor divider $R_1$ and $R_2$ network between the two legs and applies this common mode voltage between the resistors to each gate of the P-channel devices, $M_4$ and $M_5$, within the differential load circuit 5-1. This self-biasing of transistors $M_4$ and $M_5$ provides a stable load for the triode multiplier circuit.

An adjustment of the DC voltages of $V_Q$ or $V_G$ varies the gain of the multiplier. The final biasing values of $V_Q$ or $V_G$ after an adjustment should set the triode transistor $M_6$ in the triode region so that the transistor behaves as a triode multiplier.

The inputs of the circuit receive two signal voltages, $V_1$ and $V_2$ (as illustrated in the top spectrum within 5-8). Both of these two signal voltages are operating at a frequency of $f_0$. The triode multiplier circuit generates an output spectrum (shown in the lower spectrum of 5-8) of three components: the product component at 2 $f_0$, the leakage component at $f_0$, and the DC component. The product component at 2 $f_0$ provides the multiplication of the two frequency tone signals operating at $f_0$ at the inputs. The leakage component at $f_0$ and the DC component are undesirable in the output spectrum of the triode multiplier circuit when generating a desired product component. Circuit techniques described in the latter sections remove the leakage component at $f_0$ and the DC component.

The triode transistor within the triode multiplier circuit eliminates the even order harmonics and minimizes the odd order harmonics when compared to conventional analog multipliers. Transistors operated in the triode region generate intermodulation terms having a lower magnitude or eliminate some of the terms altogether. This advantageously allows the triode multiplier circuit to have a greater amplification over the conventional analog multiplier while still maintaining a lower noise floor than the conventional analog multiplier. The triode multiplier circuit provides a cleaner output signal while providing a larger magnitude signal at $V_{diff}$. The difference in the effective noise floor between the triode multiplier circuit and a conventional analog multiplier can be as much as 15 dB.

Figure 6:
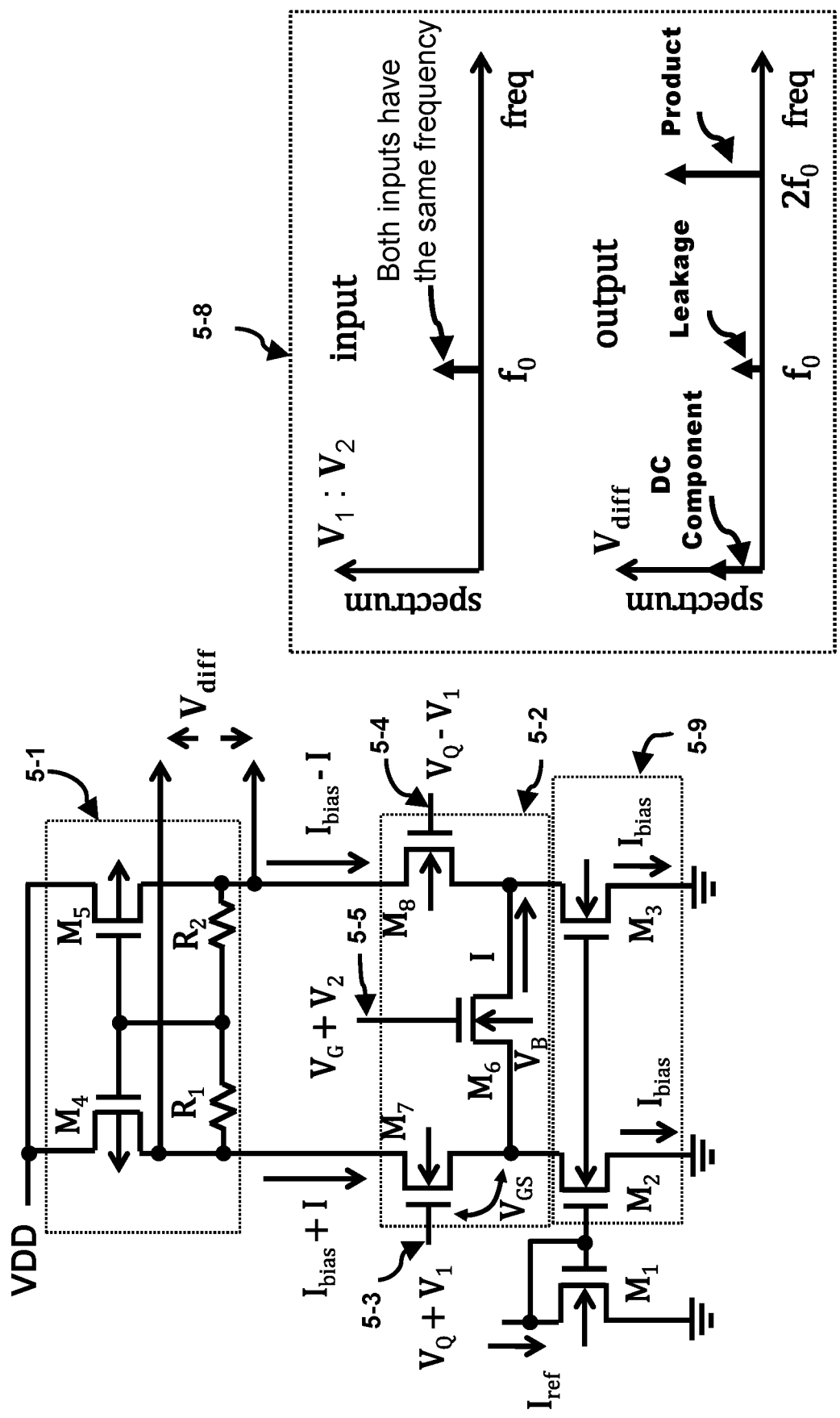
FIG. 6 depicts an embodiment of a circuit diagram of a differential triode multiplier formed with MOS transistors and a passive load along with the intermodulation products.

FIG. 6 illustrates a similar differential triode multiplier as that provided in FIG. 5 except MOS transistors $M_7$ and $M_8$ replace the BJT transistors $Q_1$ and $Q_2$, respectively. The transistors $M_7$ and $M_8$ shift the applied input signal voltage of $V_1$ by the gate to source voltage ($V_{GS}$) of the transistors $M_7$ and $M_8$. The transistor configuration of the three transistors, in this case $M_7$, $M_8$ and $M_6$, have the same configuration as before and are still considered to form a triode interface 5-2. Those of skill in the art will understand that alternative configurations of the present disclosure of the triode interface can substitute the BJTs with MOS transistors (as illustrated) or any other comparable semiconductor device such as a field effect transistor (FET), Schottky transistor, Darlington transistor, insulated gate bipolar transistor, junction field effect transistor, or the like. However, the triode transistor $M_6$ should be a device that displays MOS characteristics.

The claimed ideal multiplication of the N-channel MOS transistor $M_6$ can be implemented by P-channel MOS device as a suitable alternative embodiment for the triode transistor. One embodiment of a circuit using the P-channel as a triode multiplier may require the remaining components of the triode interface within the triode multiplier circuit replaced with their complimentary values.

Two equal frequency tone signals $V_1$ and $V_2$, each at frequency $f_0$ as illustrated in the top spectrum within 5-8, are applied to the inputs of the circuit in FIG. 6. The triode multiplier generates an output spectrum (shown in the lower spectrum of 5-8) of three components: the product component at 2 $f_0$, the leakage component at $f_0$, and the DC component. The product component at 2 $f_0$ provides the multiplication of the two frequency tones at $f_0$. The leakage component at $f_0$ and the DC component are undesirable in the triode multiplier. Various circuit technique embodiments remove these components as described in the latter sections.

Figure 7:
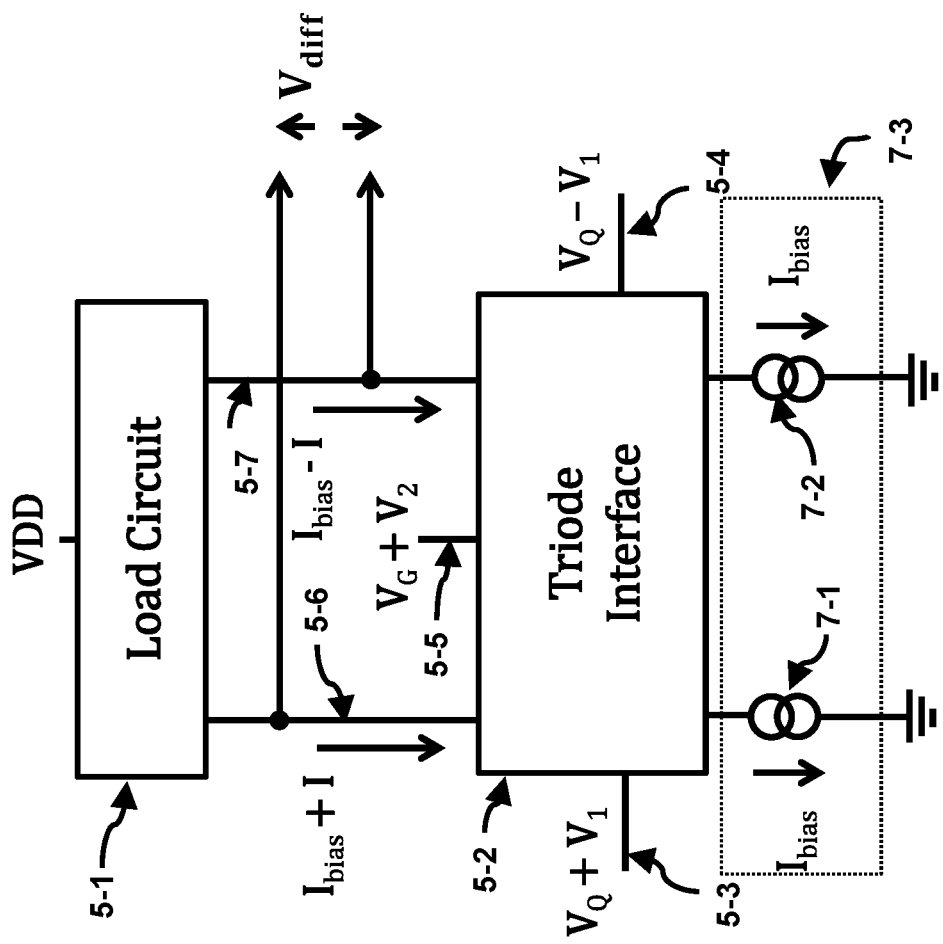
FIG. 7 depicts an embodiment of a block diagram of a differential triode multiplier.

FIG. 7 illustrates a block diagram for both of the differential triode multiplier circuits illustrated in FIG. 5 and FIG. 6. The differential load circuit 5-1 couples the triode interface 5-2 to VDD. The current source unit 7-3 couples the triode interface 5-2 to VSS. The current source symbols 7-1 and 7-2 each sourcing a current of $I_{bias}$ represents the current source transistors $M_2$ and $M_3$ within the current source unit 5-9 of the multipliers shown in FIG. 5 and FIG. 6. These figures illustrate a common mode differential load circuit within 5-1. The choice of the stated common mode differential load circuit does not rule out other suitable choices known to the art, as for example, loads comprising resistive or reactive components.

Nodes 5-3 and 5-4 form a differential input, with an AC signal of $+V_1$ applied to node 5-3 and an AC signal of $-V_1$ applied to node 5-4, i.e., an AC signal that is 180° out of phase with the AC signal applied to node 5-3. Another AC signal $+V_2$ is applied to node 5-5. The triode interface 5-2 multiplies the signal voltage of $V_2$ at node 5-5 with the signal voltage of $V_1$ applied to nodes 5-3 and 5-4, respectively. The leg 5-6 carries current ($I_{bias}$+I) while the leg 5-7 carries current ($I_{bias}$−I). Reversing the polarity of the signal voltage of $V_1$ applied to nodes 5-3 and 5-4 would cause the currents flowing in the leg 5-6 to carry a current ($I_{bias}$−I) while the leg 5-7 would carry a current ($I_{bias}$+I). A differential signal voltage $V_{diff}$ forms between the two legs 5-6 and 5-7 located between the differential load circuit and the triode interface. (Note: the two inputs represented by nodes 5-3 and 5-4 can also be referred to as a differential input of the multiplier circuit with a first input line represented by node 5-3 and a second input line represented by node 5-4.)

The differential triode multipliers of FIG. 5, FIG. 6, and FIG. 7 will be referred to as "single-balanced" in comparison to "double-balanced" differential triode multipliers to be discussed next.

Eliminating the Leakage Component

Figure 8A:
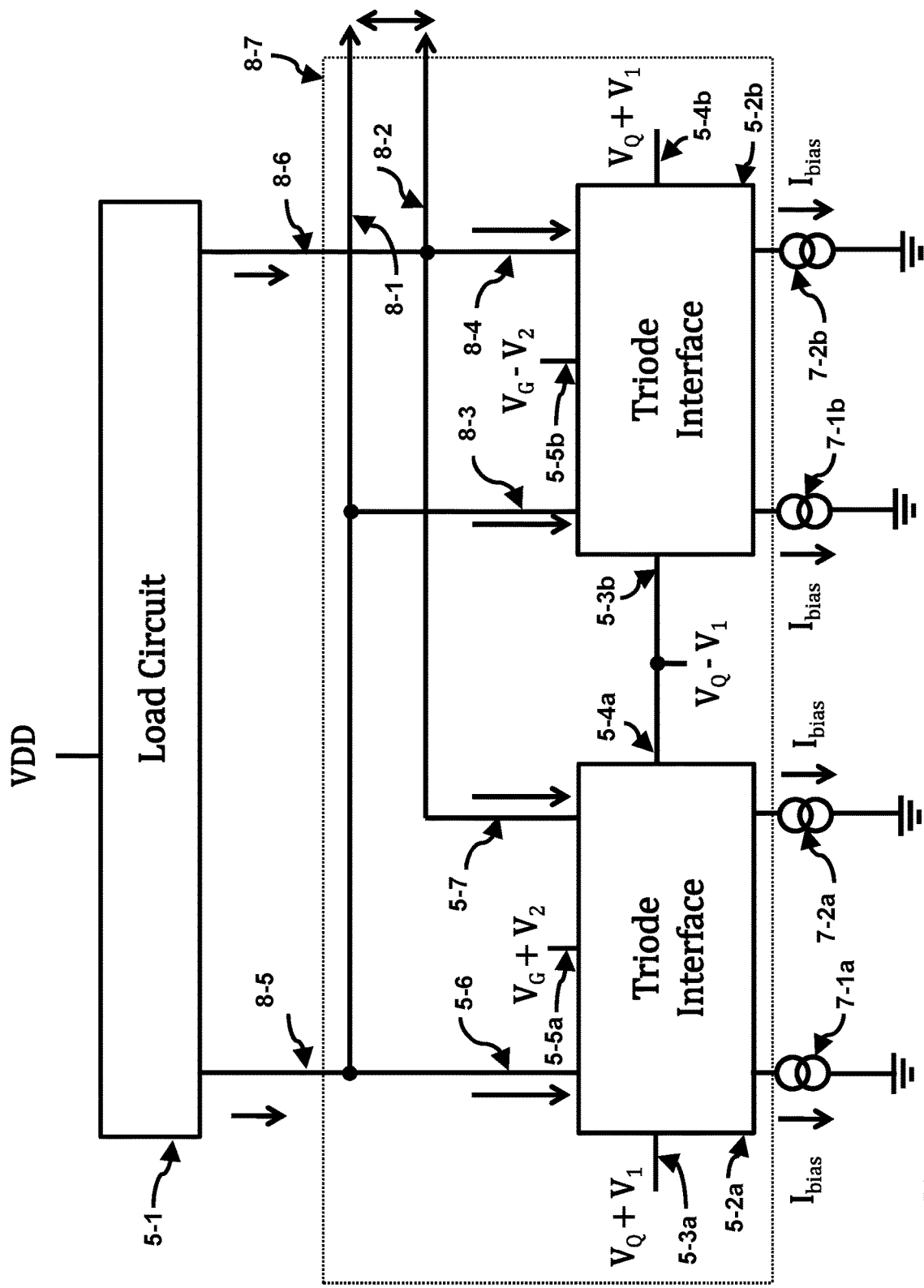
FIG. 8A depicts an embodiment of a block diagram of a differential triode multiplier configured to eliminate the leakage component.

The triode interface 5-2 generates an output spectrum of three components: the product component at 2 $f_0$, the leakage component at $f_0$, and the DC component. The product component at 2 $f_0$ provides the multiplication of the two frequency tones at $f_0$ applied to the inputs. The leakage component at $f_0$ and the DC component are undesirable in the triode multiplier circuit if the final desired result is a reference product component of 2 $f_0$. FIG. 8A illustrates a block diagram of a triode multiplier where an additional triode interface is added to the block diagram of FIG. 7 to eliminate the leakage component at $f_0$. The combination of the two triode interfaces 5-2a and 5-2b and the network interconnecting the legs of the two triode interfaces coupling to the load circuit as illustrated inside the dotted block forms the double-balanced triode interface 8-7.

Note that the double-balanced triode interface configuration means that the two triode interface circuits are interconnected such that their outputs are connected in parallel (i.e., node 5-6 connected to node 8-3 and node 5-7 connected to node 84) while the inputs are connected in a reversed fashion (i.e., node 5-3a connected to node 5-4b and node 5-4a connected to node 5-3b). Also, node 5-5a of triode interface circuit 5-2a and node 5-5b of triode interface circuit 5-2b represent a differential input to the double balanced triode interface, with the AC signal applied to node 5-5a being 180° out of phase from the AC signal applied to node 5-5b, i.e., $+V_2$ versus $-V_2$.

The differential output voltage $V_{diff}$ includes a first AC component on a first output node 8-1, a second AC component on a second output node 8-2, and a common mode DC voltage. The first AC component is substantially phase shifted 180° from the second AC component. Both AC components include substantially the same DC voltage. Similarly, the differential input voltage $V_1$ includes a first AC component on a first input node 5-3a, a second AC component on a second output node 5-4a, and a common mode DC voltage $V_Q$. The first AC component is substantially phase shifted 180° from the second AC component. Both AC components contain substantially the same DC voltage $V_Q$. Finally, the differential input voltage $V_2$ includes a first AC component on a first input node 5-5a, a second AC component on a second input node 5-5b, and a common mode DC voltage $V_G$. The first AC component is substantially phase shifted 180° from the second AC component. Both AC components contain substantially the same DC voltage $V_G$.

The triode interface 5-2a multiplies the positive signal voltage of $V_2$ at node 5-5a with both the positive signal voltage of $V_1$ applied to node 5-3a and the negative signal voltage of $V_1$ applied to node 5-4a. Using EQU. 9, the leg 5-6 is found to carry a current of $2 k(V_1)(V_2)+2 k(V_1)(V_{G0}-V_T)$ while the leg 5-7 carries a current of $2 k(-V_1)(V_2)+2 k(-V_1)(V_{G0}-V_T)$. The second triode interface 5-2b multiplies the negative signal voltage of $V_2$ at node 5-5b with both the negative signal voltage of $V_1$ applied to node 5-3b and the positive signal voltage of $V_1$ applied to node 5-4b. The leg 8-3 carries a current of $2 k(-V_1)(-V_2)+2 k(-V_1)(V_{G0}-V_T)$ while the leg 8-4 carries a current of $2 k(V_1)(-V_2)+2 k(V_1)(V_{G0}-V_T)$. The current in leg 5-6 combines with the current in leg 8-3 to form the current $4 k(V_1)(V_2)$ in leg 8-5. EQU. 9 shows that the leakage component cancels while the product component doubles with a positive amplitude. The current in leg 5-7 combines with the current in leg 8-4 to form the current $-4 k(V_1)(V_2)$ in leg 8-6. EQU. 9 shows that the leakage component cancels while the product component doubles with a negative amplitude. In addition, the multiplication result of the two single frequency tones at $(f_0-f_0)$ causing a DC component is added to each of the two outputs 8-1 and 8-2 of the circuit. The $V_{diff}$ output contains the desired peak-to-peak difference signal of $8 k V_1 V_2$ plus the same DC component applied to each output. The DC component is a function of the phase difference between V1 and V2.

Figure 8B:
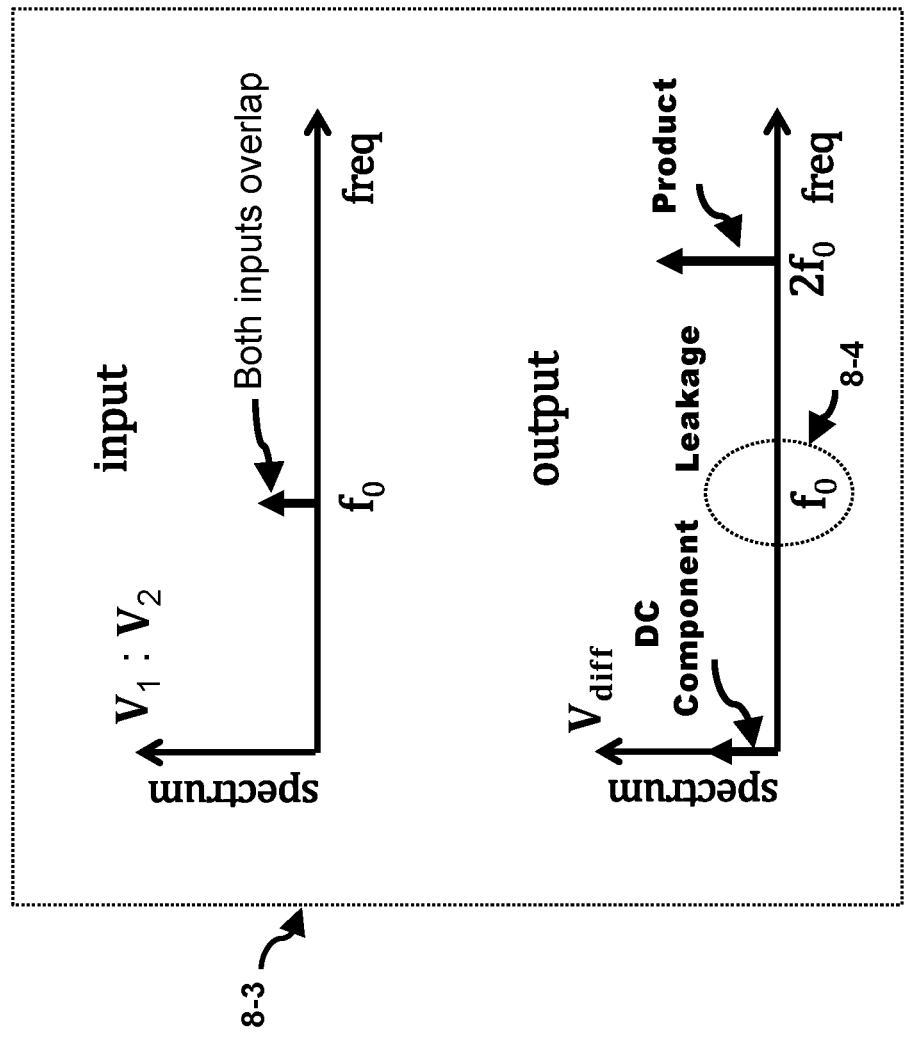
FIG. 8B depicts the elimination of the leakage component of the intermodulation products of FIG. 8A.

FIG. 8B illustrates the input and output spectrum 8-3 of the circuit in FIG. 8A. The input spectrum in the top waveform shows overlapping frequency tones of $f_0$ applied to both inputs $V_1$ and $V_2$. The lower waveform illustrates the elimination of the leakage component at $f_0$ 8-4 while the DC component remains. When the double-balanced differential triode multiplier of FIG. 8A is used as phase adder for the network of FIG. 1, the DC component varies as the double-balanced differential triode multiplier couples from one location in the distribution tree network to another location in the distribution tree network. The variation of this DC component makes the extraction of the reference product component at $2 f_0$ more difficult, since the variation of the common mode voltage of the multiplication result can be large.

Figure 9:
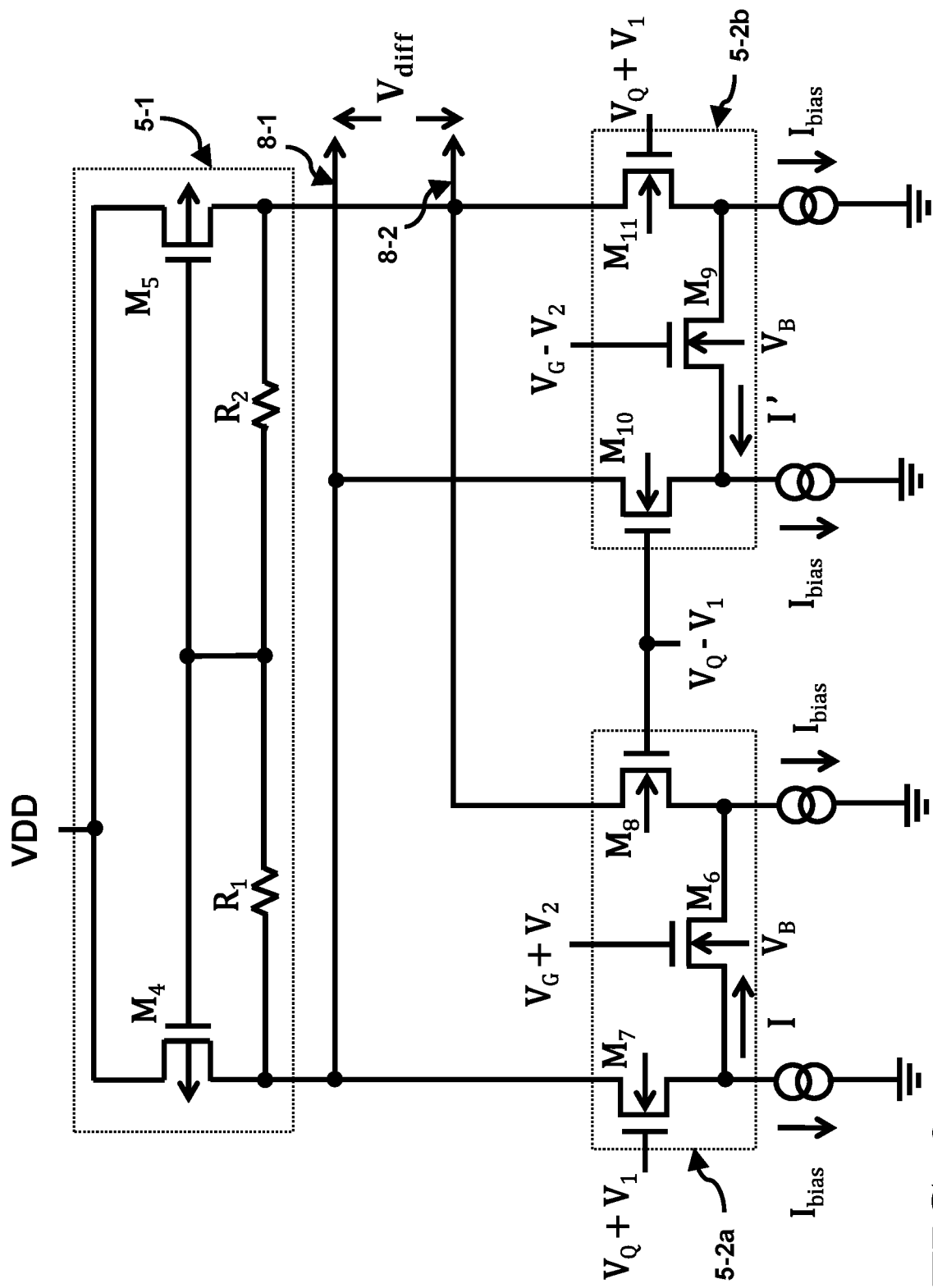
FIG. 9 depicts an embodiment of a circuit diagram a differential triode multiplier configured to eliminate the leakage component of the intermodulation products.

FIG. 9 presents one embodiment when the block diagram components of FIG. 8A are replaced with equivalent circuit schematics. The differential load circuit 5-1 uses a common mode voltage determined by the resistor divider $R_1$ and $R_2$ network between the two legs and applies this common mode voltage between the resistors to each gate of the P-channel devices, $M_4$ and $M_5$, within the differential load circuit. The self-biasing of transistors $M_4$ and $M_5$ provides a stable load for the double-balanced differential triode multiplier circuit.

Both of the triode interfaces (5-2a and 5-2b) use MOS transistors to form the circuit configuration of the double-balanced triode interface. For example, the triode interface 5-2a include MOS transistors $M_7$, $M_8$ and $M_6$, while triode interface 5-2b includes MOS transistors $M_{10}$, $M_{11}$ and $M_9$. The transistors $M_7$ and $M_8$ shift the applied input signal voltage of $V_1$ to transistor $M_6$ by the gate to source voltage $V_{GS}$ of the transistors $M_7$ and $M_8$. The transistors $M_{10}$ and $M_{11}$ shift the applied input signal voltage of $V_1$ to transistor $M_9$ by the gate to source voltage $V_{GS}$ of the transistors $M_{10}$ and $M_{11}$.

Eliminating the DC Component

Figure 10A:
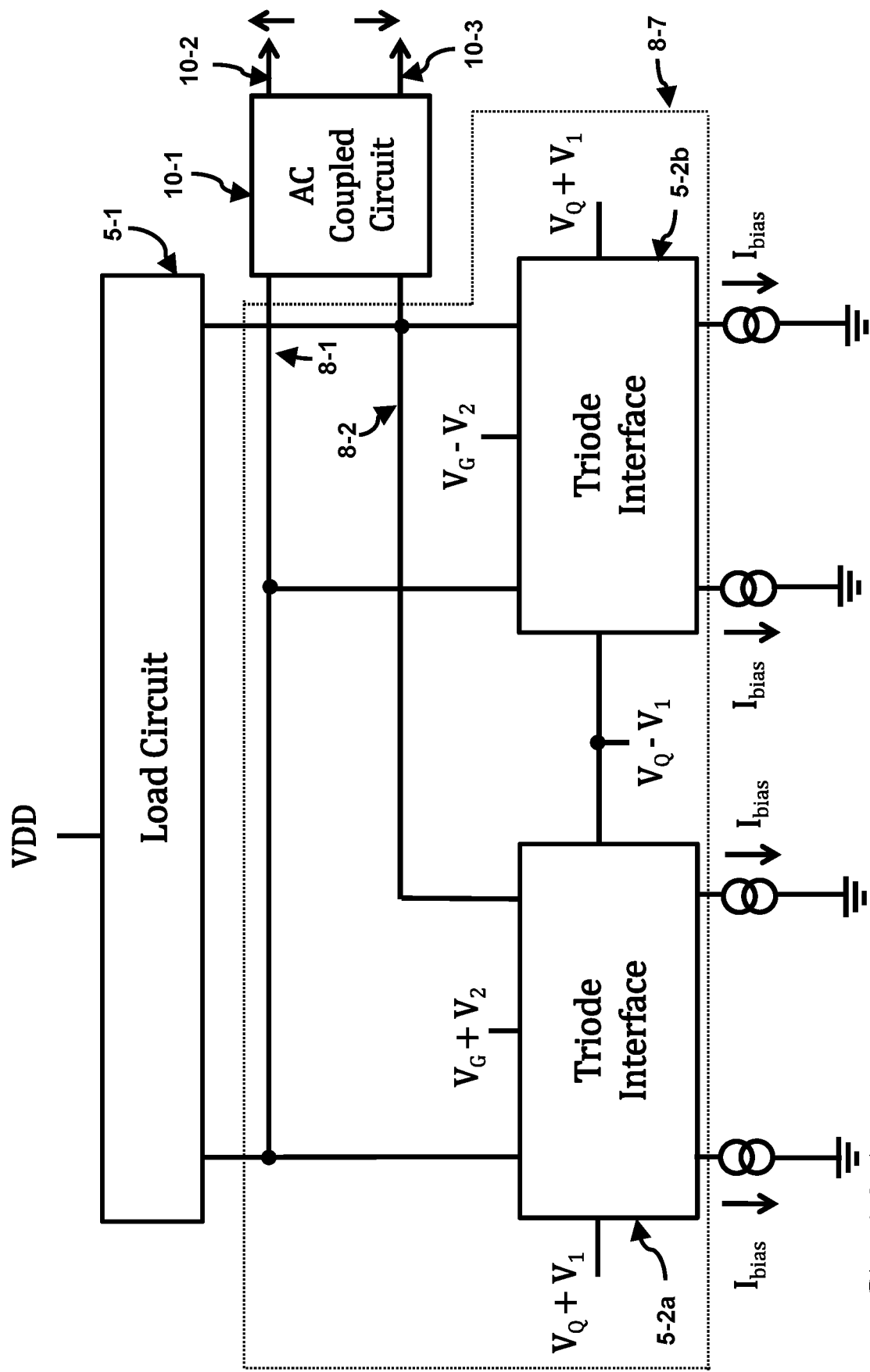
FIG. 10A depicts an embodiment of a block diagram a differential triode multiplier configured to eliminate the leakage component and DC component of the intermodulation products.

FIG. 10A depicts one embodiment of eliminating the DC component generated by the double-balanced differential triode multiplier, which is a function of position of where the triode multiplier couples to the signals of the distribution tree network 2-1.

The triode multiplier configuration of FIG. 10A generates an output spectrum that eliminates the leakage component at $f_0$ as discussed earlier. However, the DC component still accompanies the desired product component at $2 f_0$. One embodiment to remove the DC component is placing an AC coupled circuit 10-1 at the output nodes of the triode multiplier as illustrated in FIG. 10A. The high pass AC coupled circuit removes the DC component while allowing the desired product component at $2 f_0$ to pass to the two output nodes 10-2 and 10-3 providing the resultant signal $V_{diff}$ at nodes 10-2 and 10-3.

Figure 10B:
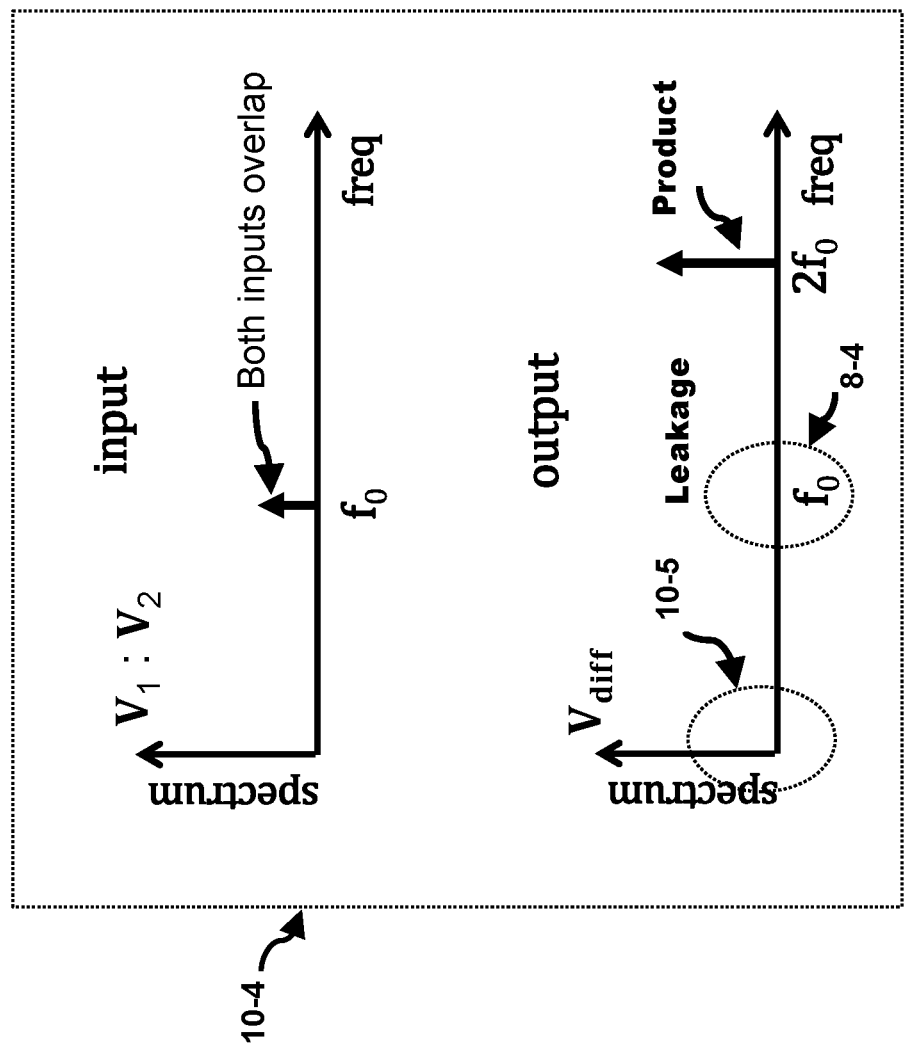
FIG. 10B depicts only the reference product component of the intermodulation products remaining at the output of FIG. 10A.

FIG. 10B illustrates the input and output spectrum 10-4 for the circuit in FIG. 10A. The input spectrum in the top waveform shows the two overlapping frequency tones of $f_0$ applied to $V_1$ and $V_2$. The lower waveform illustrates the elimination of the leakage component at $f_0$ 8-4 due to the double-balanced triode interface configuration as discussed earlier. The AC coupled circuit removes the DC component from the output as illustrated within the region 10-5 of the lower spectrum plot. The product component at $2 f_0$ is found at the output nodes 10-2 and 10-3 in FIG. 10A.

Figure 11:
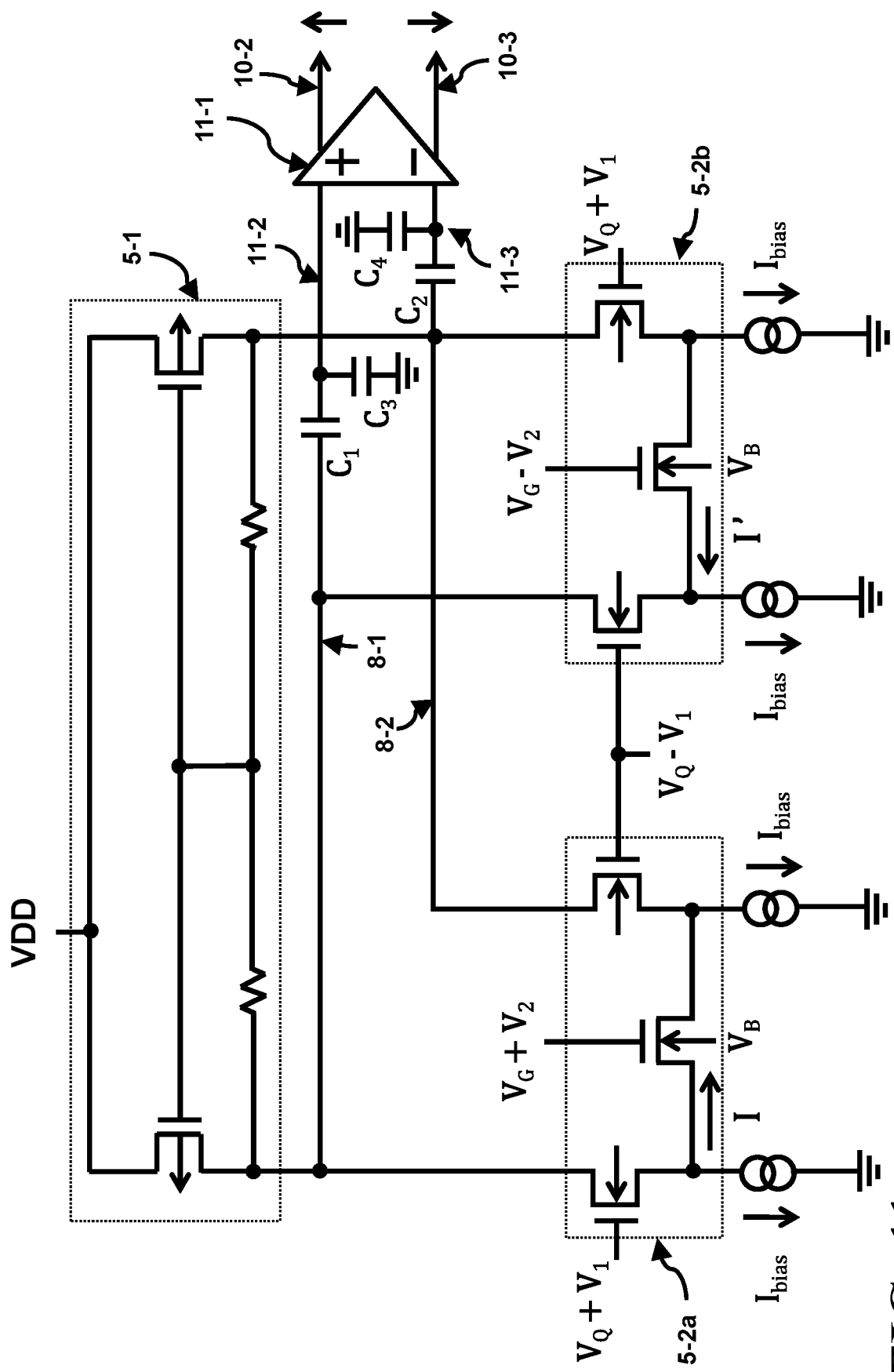
FIG. 11 depicts an embodiment of a circuit diagram of a differential triode multiplier configured to eliminate the leakage component and DC component of the intermodulation products.

FIG. 11 illustrates one embodiment of the AC coupled circuit using coupling capacitors $C_1$ and $C_2$ to block the DC component of $\cos(\theta_1-\theta_2)$ on nodes 8-1 and 8-2. Capacitor $C_1$ couples the AC component from node 8-1 to node 11-2. Capacitor $C_2$ couples the AC component from node 8-2 to node 11-3. Nodes 11-2 and 11-3 receive the desired product component at $2 f_0$. The differential amplifier 11-1 amplifies the signals on nodes 12-2 and 11-3 and generates the resultant signal output at nodes 10-2 and 10-3. Each of the coupling capacitors $C_1$ and $C_2$ fabricated on a silicon substrate have an associated parasitic capacitor of $C_3$ and $C_4$, respectively. The parasitic capacitors leak a portion of the coupled AC signal to the substrate. The coupling capacitor along with its associated parasitic capacitor forms a voltage divider and reduces the transfer of the desired product component at 2 $f_0$ to the differential amplifier 11-1. Thus, the efficiency of this capacitive coupling network depends on the ratio of the coupling capacitor to its corresponding parasitic capacitor. A coupling network with a minimal parasitic capacitance increases the efficiency of the transfer. The choice of the stated AC coupled circuit of coupling capacitor does not rule out other suitable choices known to the art, such as any other reactive component or combination of such components configured to transfer the AC components but block the DC component.

Figure 12:
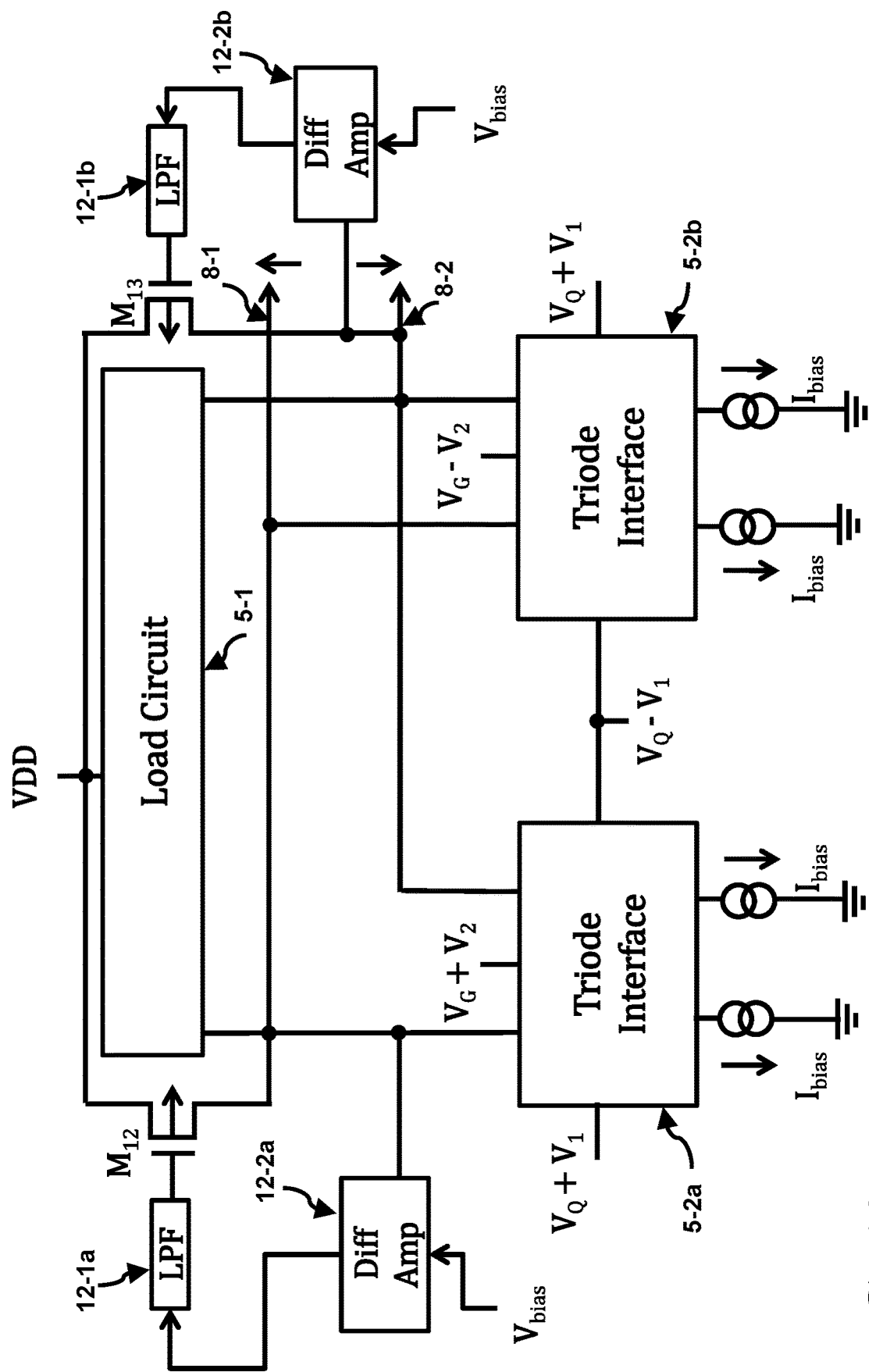
FIG. 12 depicts an embodiment of a block diagram of a differential triode multiplier configured to eliminate the leakage component of the intermodulation products and adjust the DC level of the differential outputs.

FIG. 12 illustrates a block diagram of an embodiment to compensate for the DC component due to the frequency difference component $\cos(\theta_1 - \theta_2)$, which varies as a function of position with regard to where the triode multiplier, one embodiment of the phase adder, couples to the signals of the distribution tree network. Instead of eliminating the DC component using coupling capacitors as presented in FIG. 11, a feedback technique adjusts the DC component on each output node to maintain the DC component constant at a predetermined value of $V_{bias}$. For example, a feedback circuit made up of a differential amplifier 12a-2, a low pass filter 12-1a, and P-channel transistor M12 is connected to output 8-1. The differential amplifier 12-2a receives a reference voltage $V_{bias}$ and samples the signal at the output 8-1. The output of the differential amplifier is filtered with the low pass filter 12-1a and applied to the P-channel transistor $M_{12}$. Transistor $M_{12}$ adjusts the voltage of the signal at the output node 8-1. This feedback loop maintains the DC component of the voltage of the output node at the fixed reference voltage $V_{bias}$.

Similarly, a differential amplifier 12-2b receives the same reference voltage $V_{bias}$ and samples the signal of the output node 8-2. The output of the differential amplifier is filtered with a low pass filter 12-1b and applied to the P-channel transistor $M_{13}$. Transistor $M_{13}$ couples the output node 8-2 to VDD. This feedback loop adjusts the voltage of the output node 8-2 to $V_{bias}$. Each output node 8-1 and 8-2 has a DC component set to a voltage of $V_{bias}$.

The output signal between nodes 8-1 and 8-2 contains the desired product component at 2 $f_0$ and this DC component. The DC component remains constant independent of where the triode multiplier, or this embodiment of the phase adder, couples into the signals of the distribution tree network. As the phase adder couples into different locations into the distribution tree network, the feedback loops adjusts the DC component to remain constant independent of location. The feedback loop technique allows extraction of the desired product component at 2 $f_0$ since its associated DC component remains constant independent of where the triode multiplier couples to the network of the distribution signal.

Figure 13:
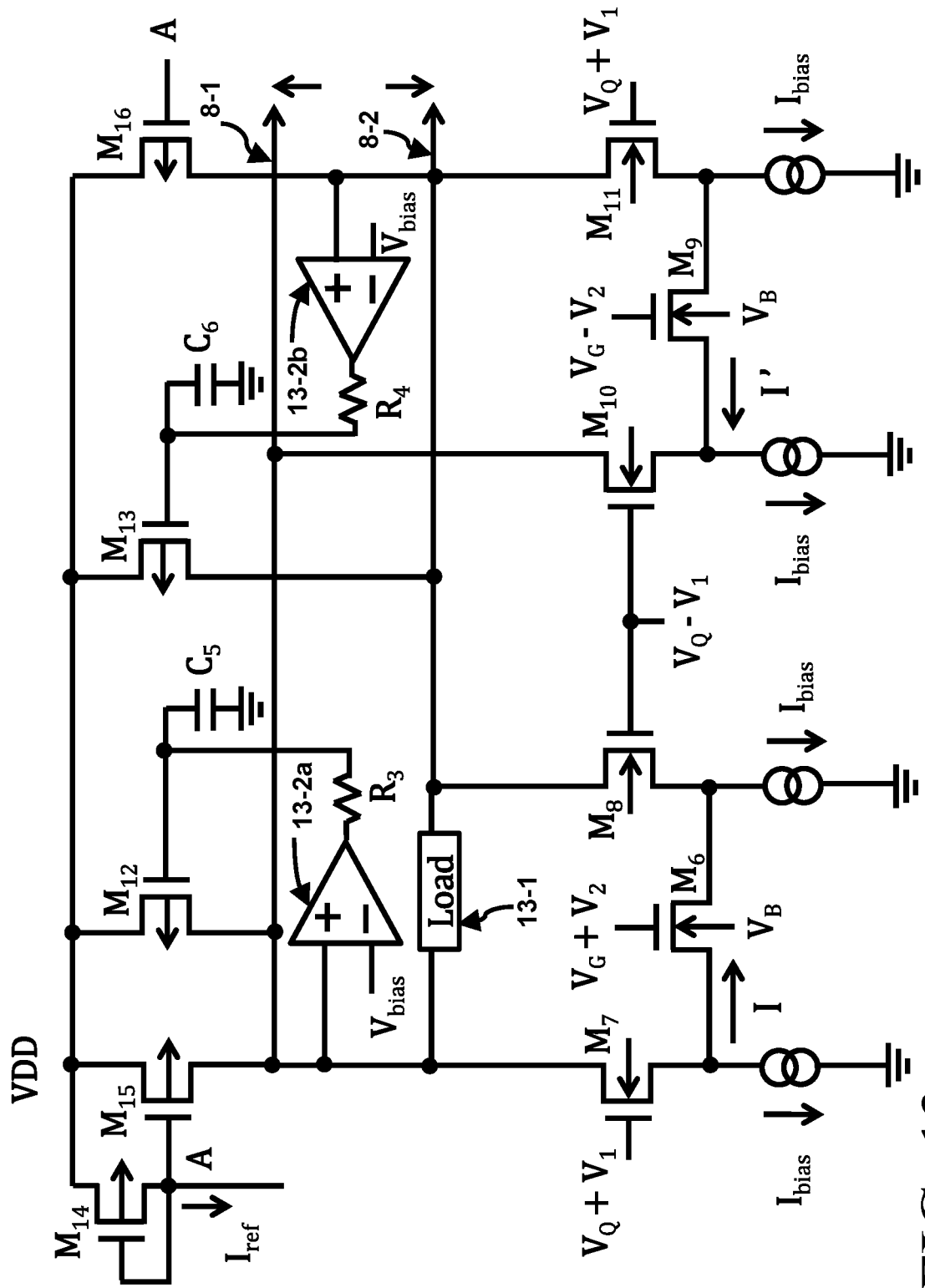
FIG. 13 depicts an embodiment of a circuit diagram of a triode multiplier formed with MOS transistors using two triode interfaces, a passive load, and AC coupling configured to eliminate the leakage component and adjust the DC level of the differential outputs.

FIG. 13 replaces the block diagrams of FIG. 12 with circuit schematics that present one embodiment of using the feedback technique to adjust the DC component. The differential load circuit 5-1 is replaced with another circuit embodiment that includes a load element 13-1 coupled between current mirrors $M_{15}$ and $M_{16}$. A diode connected transistor $M_{14}$ provides a reference current $I_{ref}$ and the generated voltage at node A is applied to current mirrors $M_{15}$ and $M_{16}$. A load element 13-1, such as a resistor or a transistor configured as a resistance, couples the two output nodes 8-1 and 8-2.

A description of the feedback loop coupled to the node 8-1 follows. A high gain differential amplifier 13-2a couples to the output node 8-1 and the reference voltage $V_{bias}$. The output of the differential amplifier couples to a low pass filter formed by $R_3$ and $C_5$. A P-channel transistor $M_{12}$ connects the output node 8-1 to VDD. The output of the low pass filter couples to the gate of transistor $M_{12}$ and forms a feedback loop that adjusts the voltage on output 8-1 to $V_{bias}$. If the voltage at node 8-1 is above $V_{bias}$, the voltage at the output of the differential amplifier increases. The RC network passes this signal to the gate of $M_{12}$ causing a reduction in the conductivity of transistor $M_{12}$. This decreases the current in $M_{12}$ and causes a drop in the voltage on node 8-1. The voltage on node 8-1 approaches that of the voltage $V_{bias}$. Similarly, if the voltage at node 8-1 is below $V_{bias}$, the voltage at the output of the differential amplifier decreases. The RC network passes this signal to the gate of $M_{12}$ causing a increase in the conductivity of transistor $M_{12}$. This increases the current in $M_{12}$ and causes a rise in the voltage on node 8-1. The voltage on node 8-1 approaches that of the voltage $V_{bias}$ if the gain of the differential amplifier 13-2a is high. In practice, the voltage on node 8-1 matches the voltage $V_{bias}$.

Similarly, for the other output node 8-2, a high gain differential amplifier 13-2b couples to the other output node 8-2 and the same reference voltage $V_{bias}$. The output of the differential amplifier couples to a low pass filter formed by $R_4$ and $C_6$. A P-channel transistor $M_{13}$ connects the output node 8-2 to VDD. The output of the low pass filter couples to the gate of transistor $M_{13}$ and forms a second feedback loop that adjusts the voltage on output node 8-2 to $V_{bias}$ until the voltage on node 8-2 matches the voltage $V_{bias}$.

The differential output signal $V_{diff}$ formed between nodes 8-1 and 8-2 contains the desired product component at 2 $f_0$ and a DC component that is constant independent of where the triode multiplier couples to the signals of the distribution tree network. The DC component remains constant due to the feedback loop independent of where the triode multiplier couples into the signals of the distribution tree network. The feature allows extraction of the desired product component at 2 $f_0$ since its associated DC component remains constant independent of where the triode multiplier, or this embodiment of phase adder, couples to the network of the distribution signal.

Figure 14:
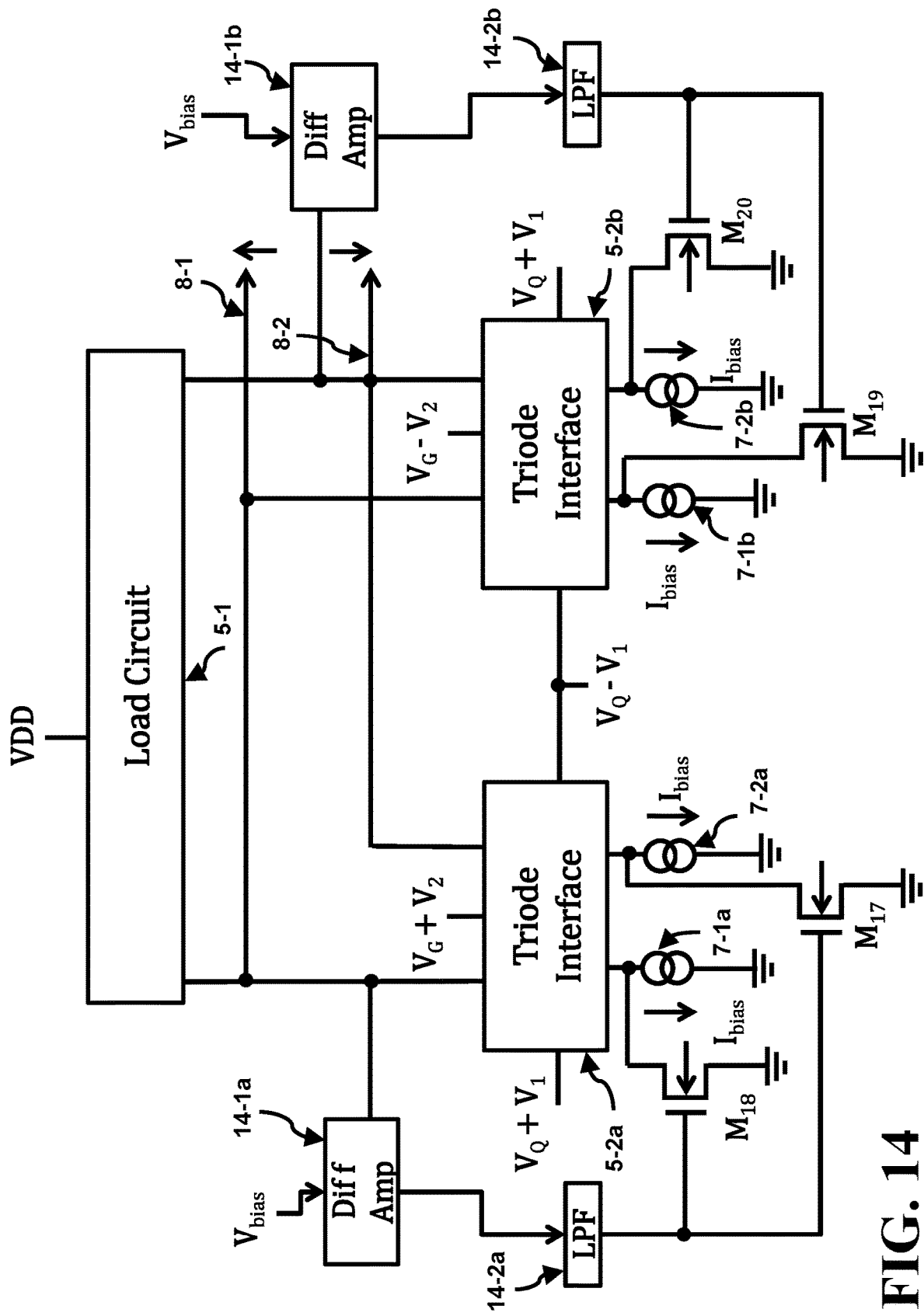
FIG. 14 depicts an embodiment of a block diagram of another differential triode multiplier configured to eliminate the leakage component of the intermodulation products and adjust the DC level of the differential outputs.

FIG. 14 illustrates another embodiment of a feedback technique to adjust the voltage of the DC component at the output nodes of the circuit. A high gain differential amplifier 14-1a couples to the output node 8-1 and the reference voltage of $V_{bias}$. The output of the differential amplifier is applied to a low pass filter 14-2a. An N-channel transistor $M_{18}$ is placed in parallel with the current source 7-1a which provides current to one leg of the triode interface 5-2a. A second N-channel transistor $M_{17}$ is placed in parallel with current source 7-2a which provides current to another leg of the triode interface 5-2a. The low pass filter 14-2a drives the gates of transistors $M_{18}$ and $M_{17}$. The output of the low pass filter couples to the gate of transistor $M_{18}$ and forms a first self-feedback loop that adjusts the voltage on output 8-1.

Similarly, for the other output node 8-2, a high gain differential amplifier 14-1b couples to one of the output node 8-2 and the same reference voltage of $V_{bias}$. The output of the differential amplifier is applied to a low pass filter 14-2b. An N-channel transistor $M_{20}$ is placed in parallel with the current source 7-2b while another and channel transistor $M_{19}$ is placed in parallel with another current source 7-1b associated with triode interface 5-2b. The low pass filter 14-2b drives the gates of transistors $M_{19}$ and $M_{20}$. The output of the low pass filter couples to the gate of transistor $M_{20}$ and forms a second self-feedback loop that adjusts the voltage on output node 8-2.

The first and second feedback loops interact with one another via cross-feedback loops. In the first feedback loop transistor $M_{17}$ augments the current source 7-2a that influences the second self-feedback loop controlling the voltage of the output node 8-2. Simultaneously, the second feedback loop transistor $M_{19}$ augments the current source 7-1b that influences the first self-feedback loop controlling the output voltage 8-1. The self-feedback and cross-feedback loops eventually stabilize and maintain the output voltage and nodes 8-1 and 8-2 at a DC voltage of $V_{bias}$.

Figure 15:
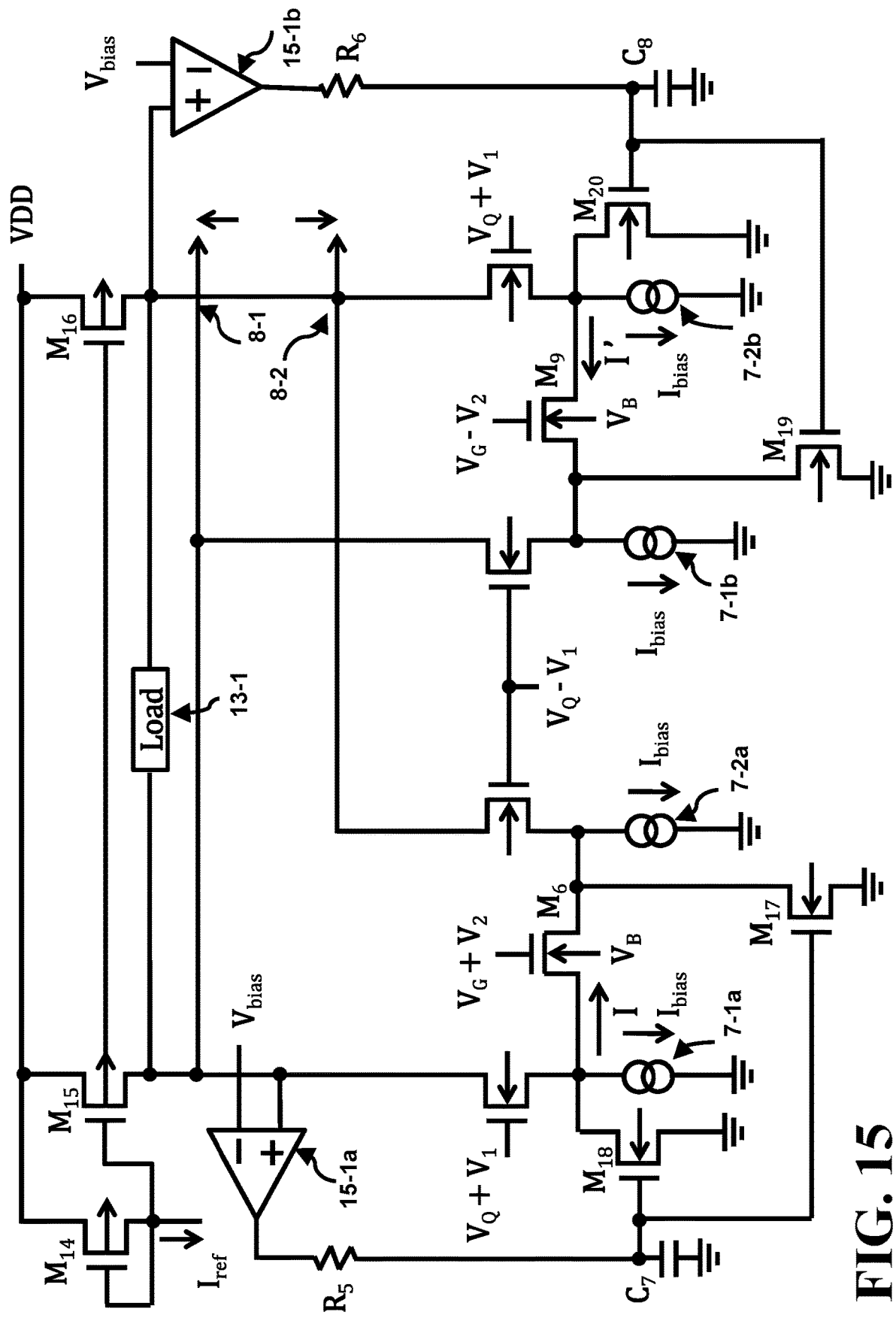
FIG. 15 depicts an embodiment of a circuit diagram of FIG. 14 formed with MOS transistors configured to eliminate the leakage component and adjust the DC level of the differential outputs.

The output signal between nodes 8-1 and 8-2 contains the desired product component at 2 $f_0$ and a common DC voltage. The common voltage on nodes 8-1 and 8-2 contain the DC component of $V_{bias}$ determined by the feedback loops. The DC voltage on nodes 8-1 and 8-2 is constant independent of where the triode multiplier, or this embodiment of the phase adder, couples into the signals of the distribution tree network. The desired product component at 2 $f_0$ can be extracted from the output signal between the nodes 8-1 and 8-2 when its DC component remains constant independent of position. FIG. 15 replaces the block diagrams of the differential load circuit 5-1 of the differential amplifiers 14-1, the low pass filters 14-2, and the triode interfaces 5-2 with their corresponding circuit schematics.

Figure 16:
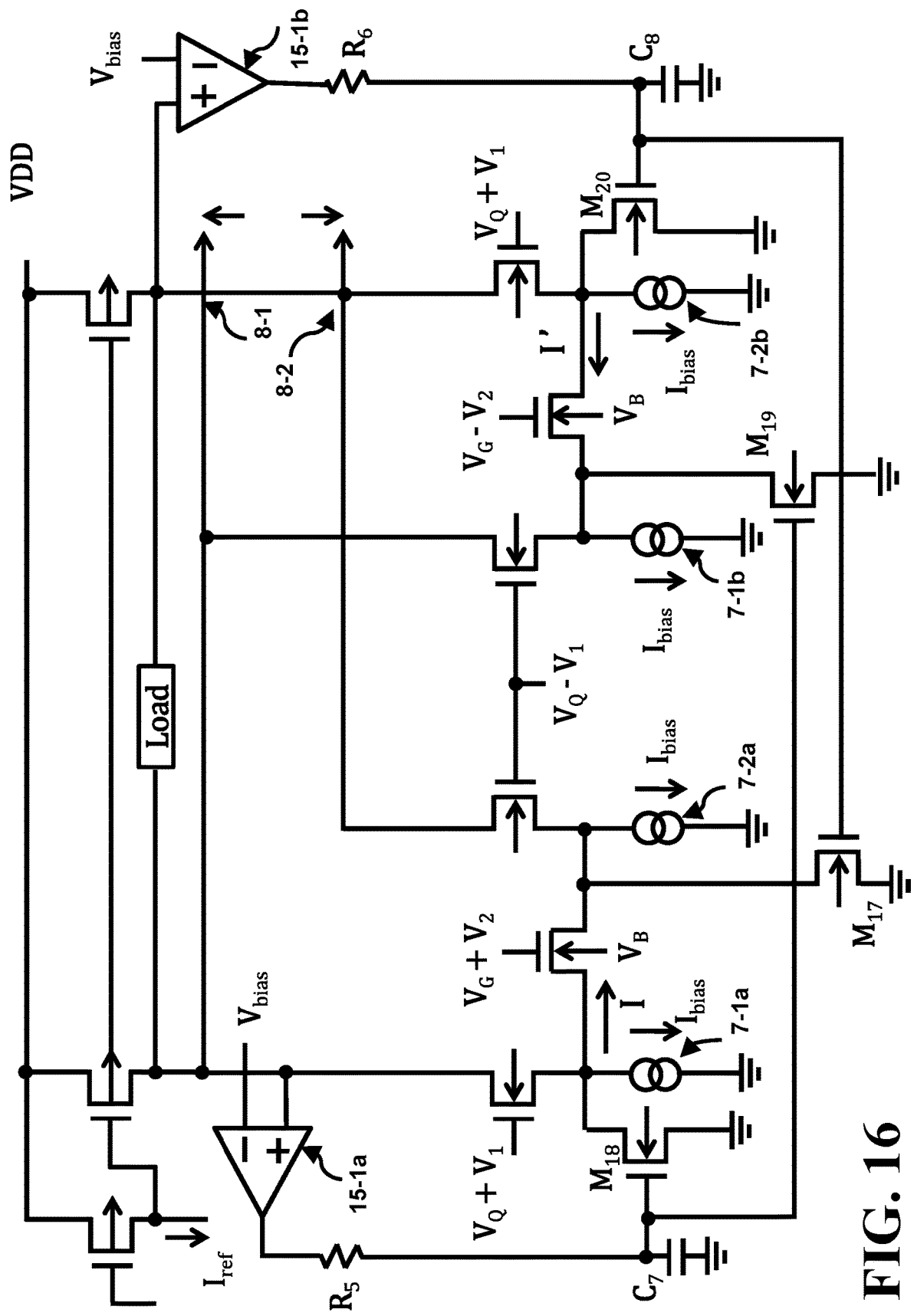
FIG. 16 depicts another embodiment of a circuit diagram of FIG. 14 formed with MOS transistors configured to eliminate the leakage component and adjust the DC level of the differential outputs.

FIG. 16 depicts an embodiment that eliminates the cross feedback loop described in FIG. 15. A high gain differential amplifier 15-1a couples to one of the output nodes 8-1 and a reference voltage of $V_{bias}$. A low pass filter comprising $R_5$ and $C_7$ couples the output of the differential amplifier to the gates of two N-channel transistors $M_{18}$ and $M_{19}$. Transistor $M_{18}$ is placed in parallel with the current source 7-1a while transistor $M_{19}$ is placed in parallel with another current source 7-1b. Both transistors $M_{18}$ and $M_{19}$ supplement currents to current sources 7-1a and 7-1b. Both of these current sources share a common output node 8-1 within the load. This first feedback loop adjusts the voltage on output 8-1 to match the voltage of $V_{bias}$.

Similarly, for the other output node 8-2, a high gain differential amplifier 15-1b couples to one of the outputs 8-2 and a reference voltage of $V_{bias}$. A low pass filter comprising $R_6$ and $C_8$ couples the output of the differential amplifier to the gates of two N-channel transistors $M_{20}$ and $M_{17}$. Transistor $M_{20}$ is placed in parallel with the current source 7-2b while transistor $M_{17}$ is placed in parallel with another current source 7-2a. Both transistors $M_{20}$ and $M_{17}$ supplement the currents of current sources 7-2b and 7-2a to form a second feedback loop that adjusts the voltage on output 8-2. This embodiment of the feedback loop eliminates the cross feedback loops of FIG. 14 and FIG. 15.

The output signal between nodes 8-1 and 8-2 contains the desired product component at 2 $f_0$ and a DC component that is constant independent of where the triode multiplier couples to the signals of the distribution tree network. The desired product component at 2 $f_0$ can be easily extracted when its DC component remains constant independent of position.

Figure 17:
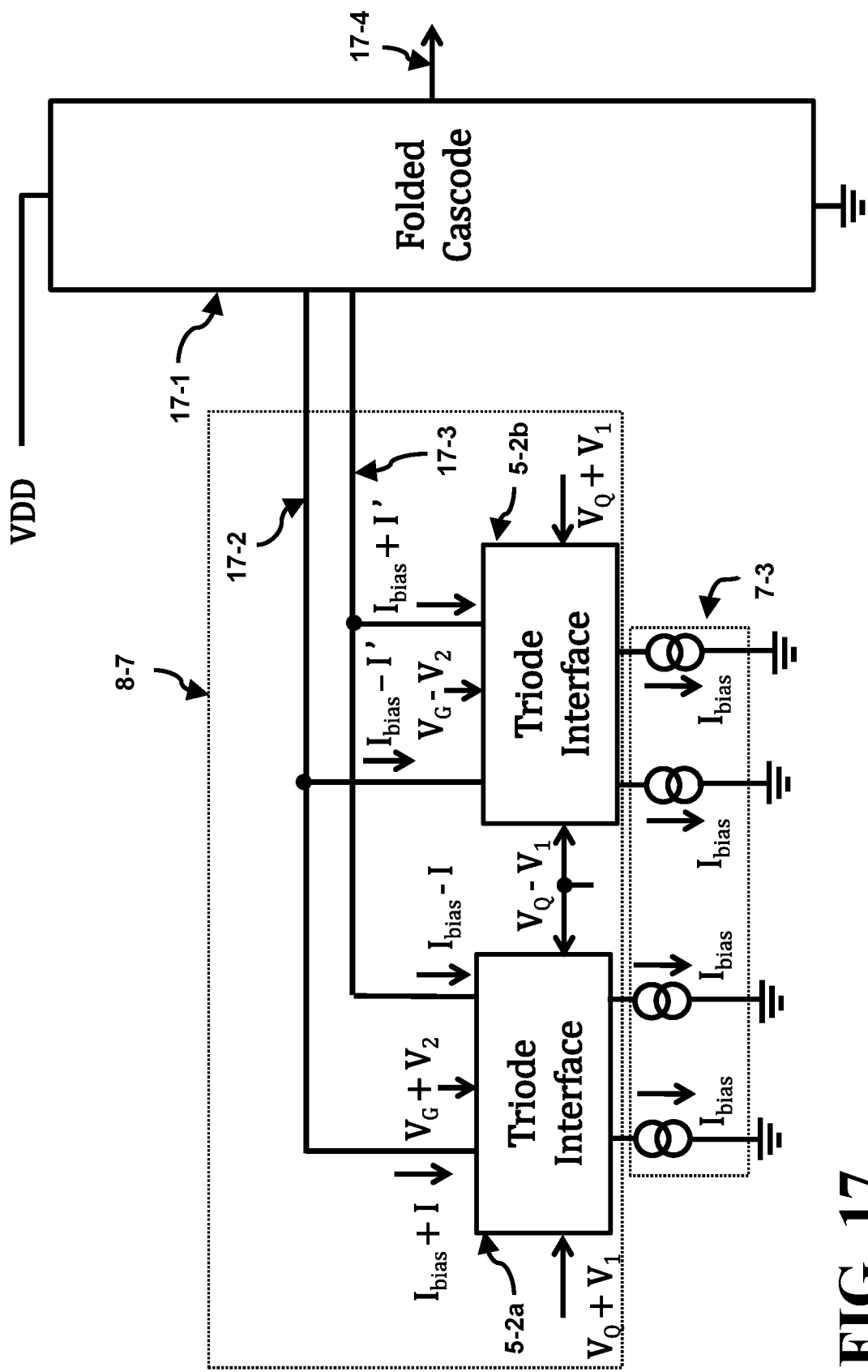
FIG. 17 depicts an embodiment of a block diagram of two triode interfaces coupled to a folded cascode configured to eliminate the leakage component of the differential outputs.

FIG. 17 presents a diagram of a double-balanced triode interface 8-7 and the current source unit 7-3 coupled to a folded cascode 17-1. The folded cascode amplifier provides a load for the double-balanced triode interface and amplifies the signal from the double-balanced triode interface at nodes 17-2 and 17-3. The amplified signal is available at the output 17-4 of the folded cascode.

Figure 18:
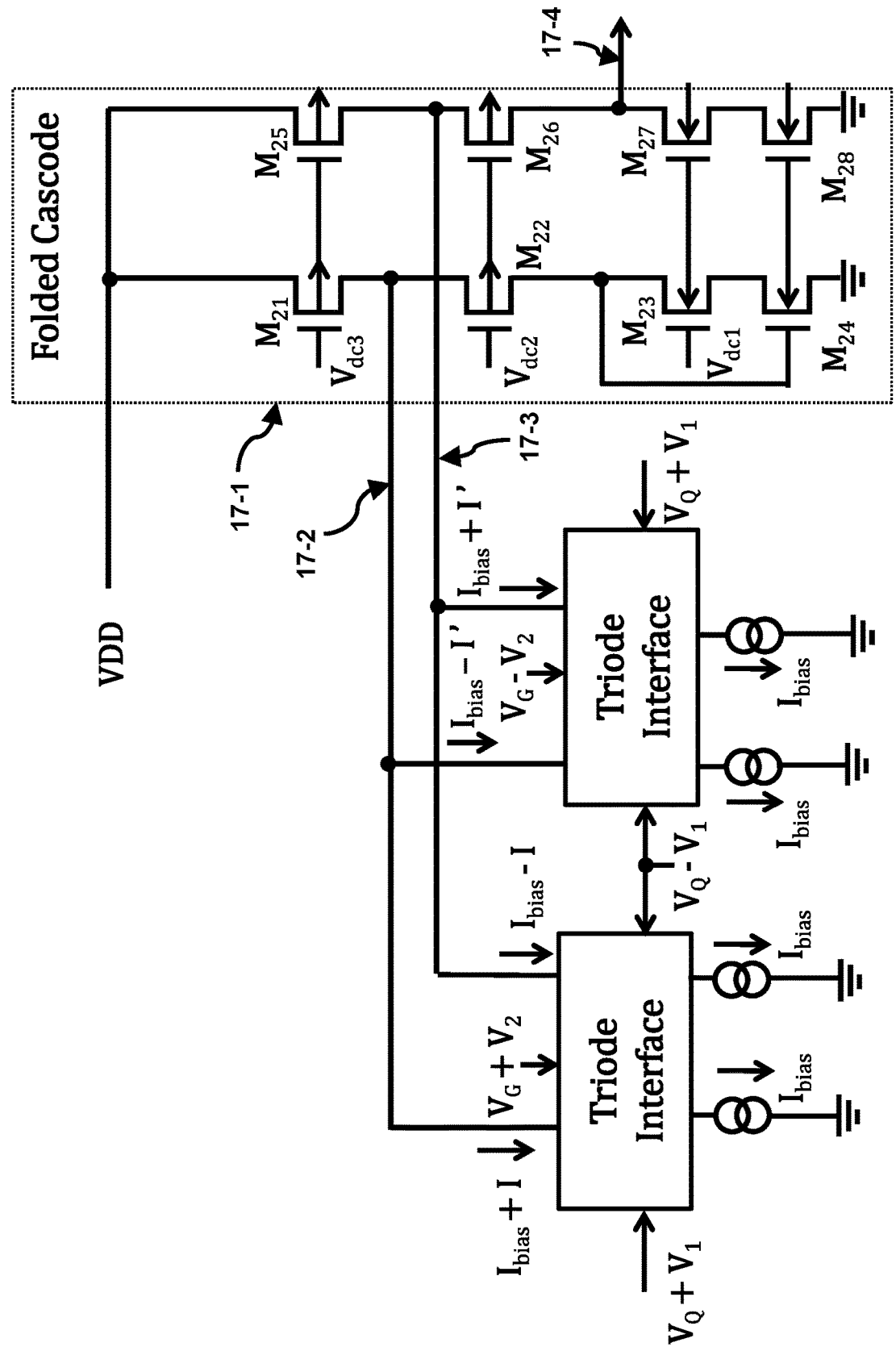
FIG. 18 depicts an embodiment of a circuit diagram of the folded cascode configured to eliminate the leakage component of the differential output.

FIG. 18 presents the circuit diagram of the folded cascode 17-1. The folded cascode includes two stacks of series connected transistors. The first stack consists of the P-channels transistors $M_{21}$ and $M_{22}$ and the N-channel transistors $M_{23}$ and $M_{24}$. The second stack consists of the P-channels transistors $M_{25}$ and $M_{26}$ and the N-channel transistors $M_{27}$ and $M_{28}$. A biasing block (not illustrated) provides the voltages $V_{dc1}$, $V_{dc2}$, and $V_{dc3}$. The P-channel transistors $M_{22}$ and $M_{26}$ are the cascode transistors biased by the voltage $V_{dc2}$. The P-channel transistors $M_{21}$ and $M_{25}$ provide a current source to the double-balanced triode interface 8-7 and the two P channel transistors $M_{22}$ and $M_{26}$ in the two stacks. The current provided by $M_{21}$ is split between or is shared by the left legs of the two triode interface circuits and the left leg (i.e., transistor $M_{22}$) of the folded cascode amplifier; and the current provided by $M_{25}$ is split between or is shared by the right legs of the two triode interface circuits and the right leg (i.e., transistor $M_{26}$) of the folded cascode amplifier. The N-channel transistors form the cascode current mirror. The N channel transistors $M_{23}$ and $M_{27}$ form the cascode component of the current mirror. A voltage $V_{dc1}$ biases transistors $M_{23}$ and $M_{27}$. The transistors $M_{24}$ and $M_{28}$ form the remainder of the current mirror biased by tapping a node between $M_{22}$ and $M_{23}$ in the first stack. The current through nodes 17-2 and 17-3 of the double-balanced triode interface directly connect to the source/drain node of transistors $M_{21}$ and $M_{22}$ and the source/drain node of transistors $M_{25}$ and $M_{26}$, respectively. The folded cascode provides a current source to the double-balanced triode interface and generates rail-to-rail swings at the output 17-4 for small current changes through nodes 17-2 and 17-3 caused by the double-balanced triode interface. The folded cascode offers a large gain, a large output impedance and stability.

Figure 19:
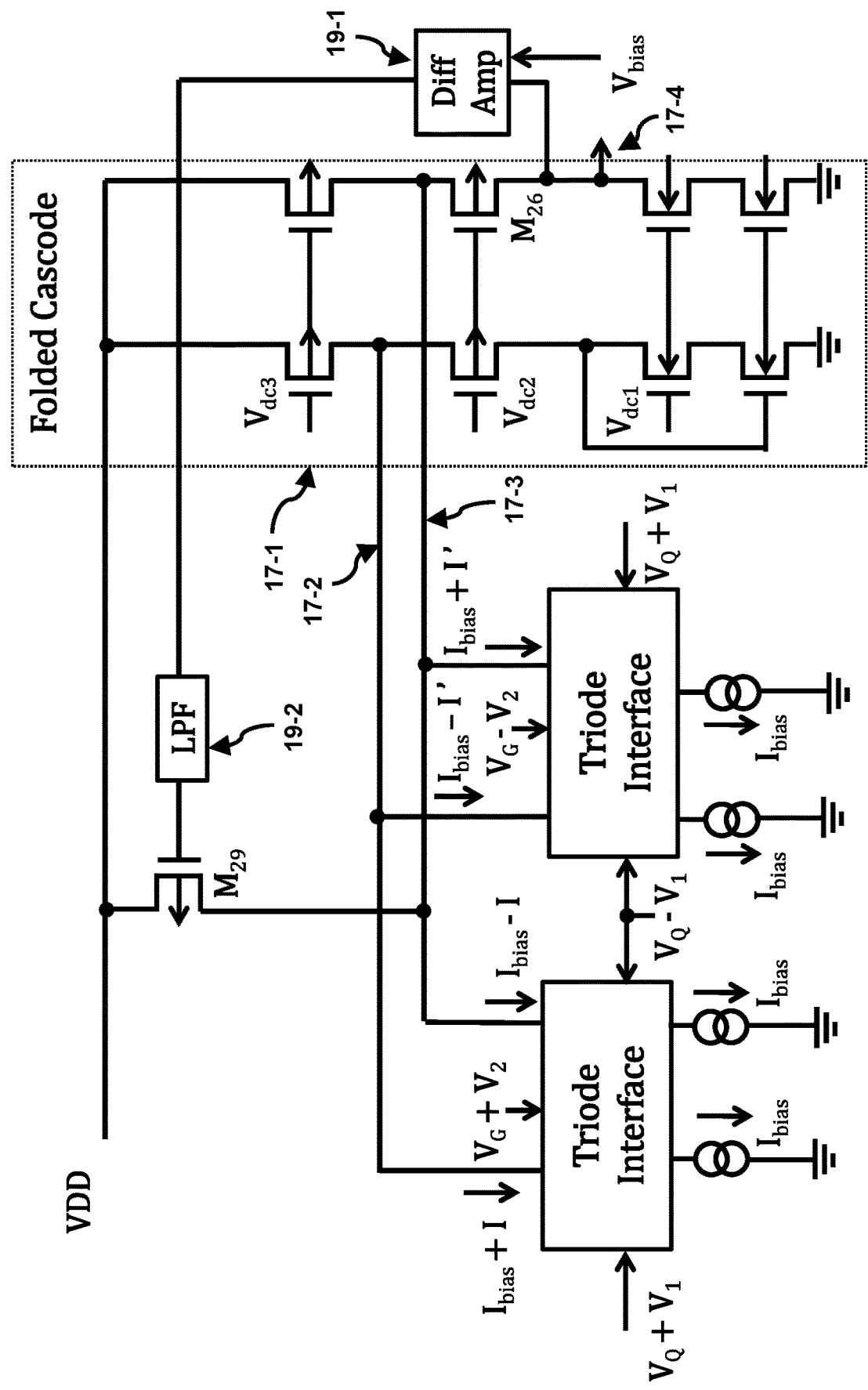
FIG. 19 depicts an embodiment of a diagram of the folded cascode and feedback configured to eliminate the leakage component and adjust the DC level of the differential output.

FIG. 19 presents one embodiment of using feedback to set the DC voltage at the output of the folded cascode 17-1. The output node 17-4 of the folded cascode and a reference voltage $V_{bias}$ both couple to a differential amplifier 19-1. A low pass filter 19-2 couples the output of the differential amplifier to the gate of transistor $M_{29}$. The drain of $M_{29}$ couples to node 17-3. The differential amplifier, the low pass filter, $M_{29}$ and $M_{26}$ form a feedback loop. The feedback loop adjusts the output of the folded cascode to match the reference voltage $V_{bias}$.

The output signal at node 17-4 contains the desired product component at 2 $f_0$ and a DC component that is constant independent of where the triode multiplier couples to the signals of the distribution tree network. The desired product component at 2 $f_0$ can be easily extracted when the common mode voltage of the DC component at node 17-4 remains constant independent of position.

Figure 20:
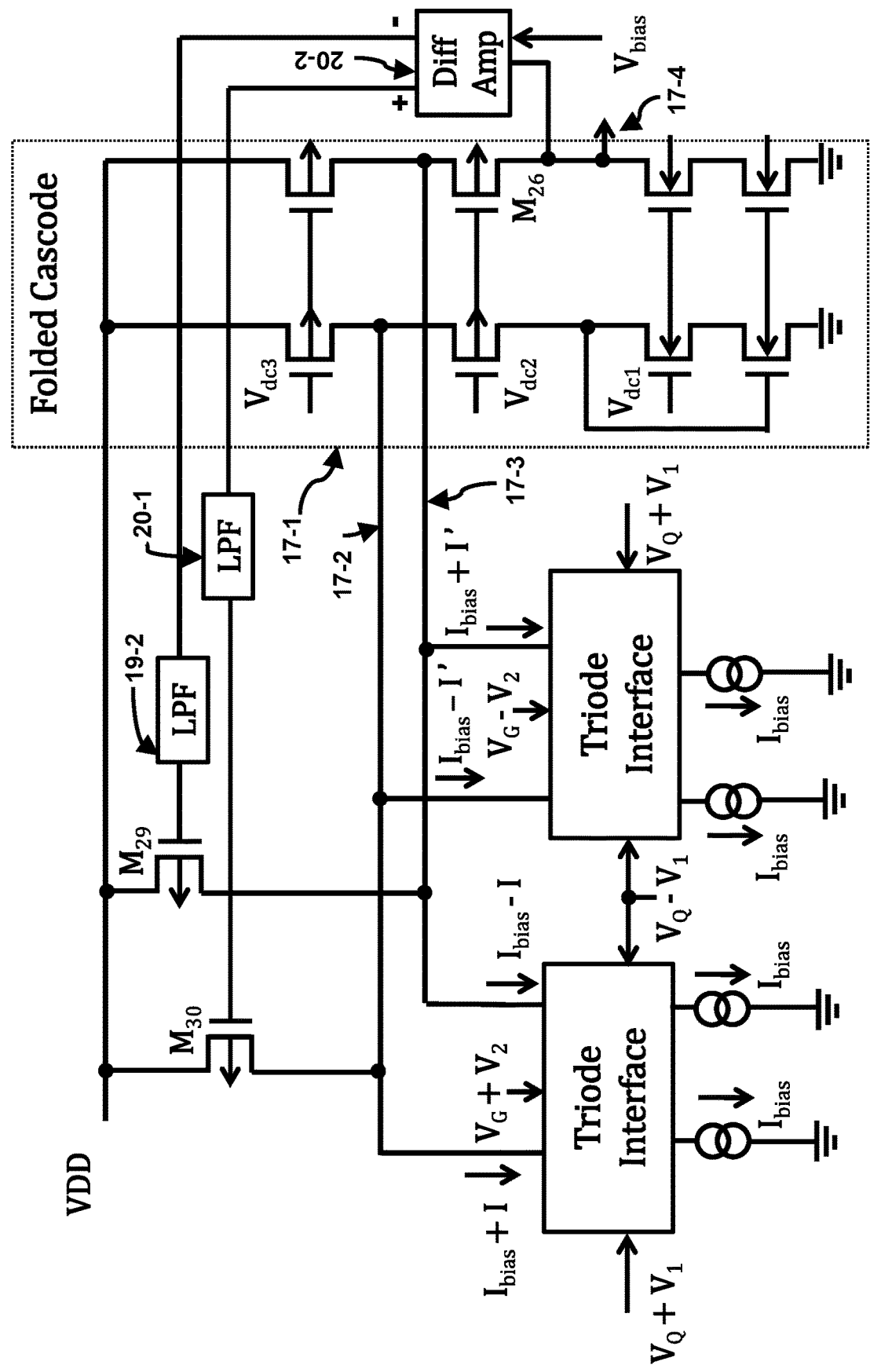
FIG. 20 depicts another embodiment of a diagram of the folded cascode and feedback configured to eliminate the leakage component and adjust the DC level of the differential output.

FIG. 20 illustrates another embodiment of using feedback to set the voltage at the output of the folded cascode 17-1. The output node 17-4 of the folded cascode and a reference voltage $V_{bias}$ both couple to a differential amplifier with a differential output 20-2. The low pass filter 19-2 couples a first output of the differential amplifier to the gate of transistor $M_{29}$. The low pass filter 20-1 couples a second output of the differential amplifier to the gate of transistor M30. The drain of $M_{29}$ couples to lead 17-3 while the drain of $M_{30}$ couples to lead 17-2. The differential amplifier, the low pass filter, $M_{29}$, the first stack, and $M_{26}$ form a feedback loop. The feedback loop adjusts the output of the folded cascode the match the reference voltage $V_{bias}$.

FIGS. 12-16 use feedback techniques to maintain the common mode voltage of the output node of the circuit at a reference voltage specified by $V_{bias}$. The output signal at these output nodes contains the desired product component at $2 f_0$ and the DC component corresponding to the common mode voltage that due to feedback is constant independent of where the triode multiplier couples to the signals of the distribution tree network. The output nodes 8-1 and 8-2 include both the desired differential product component at $2 f_0$ and a DC component corresponding to the common mode voltage that is now set to $V_{bias}$. The DC component remains constant independent of where the triode multiplier couples to the signals of the distribution tree network. The desired differential product component at $2 f_0$ can easily be extracted from a node where the common mode voltage of the differential signal remains constant.

FIGS. 19-20 use feedback techniques to maintain the DC voltage of the output node of the circuit at a reference voltage specified by $V_{bias}$. The output signal at this output node contains the desired product component at $2 f_0$ and the DC component corresponding to this DC voltage. The feedback technique maintains the DC voltage constant independent of where the triode multiplier couples to the signals of the distribution tree network. The output node 17-4 includes both the desired product component at $2 f_0$ and a DC component that is now set to a voltage of $V_{bias}$.

Eliminating Leakage and DC Components with a Tank Circuit

Figure 21:
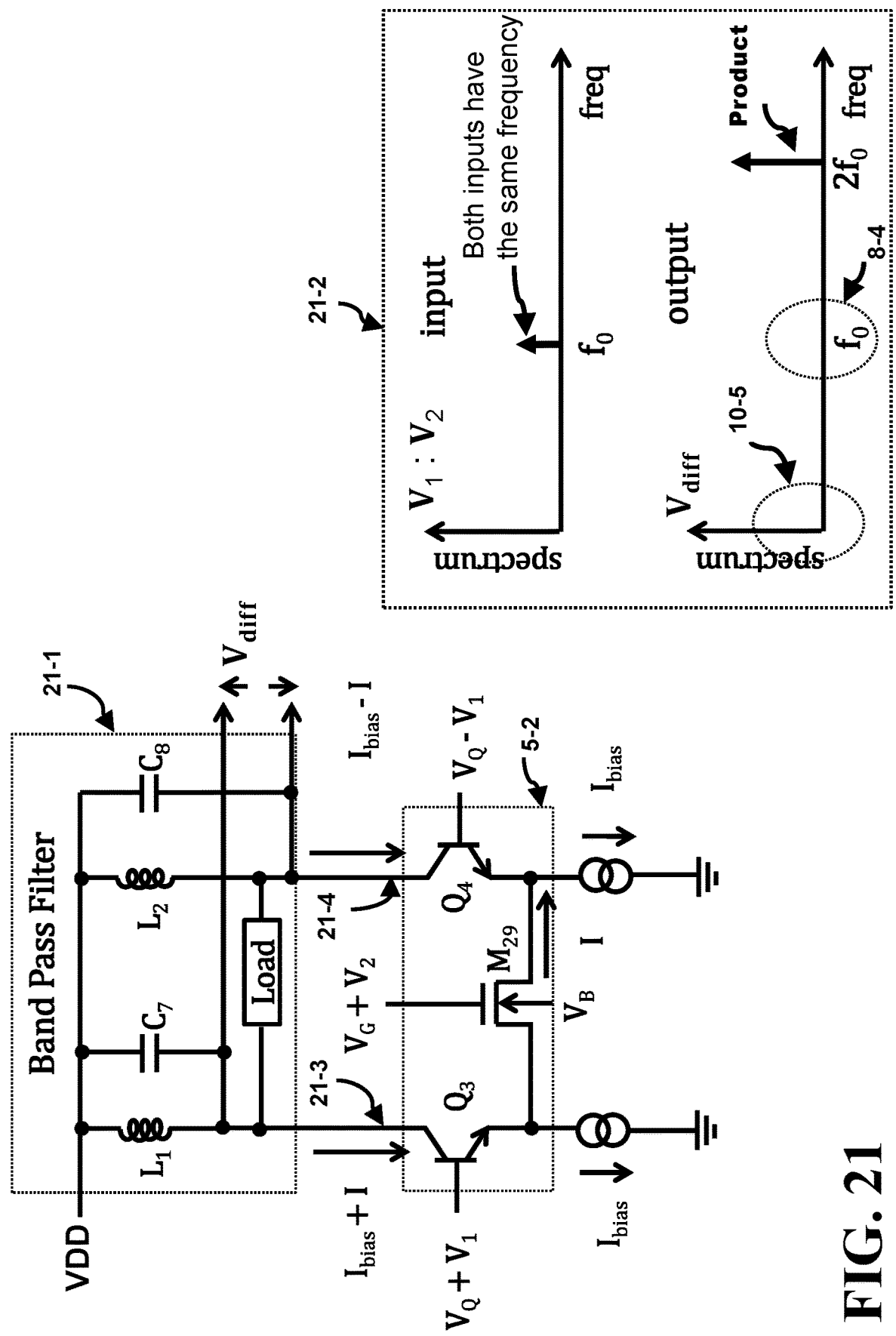
FIG. 21 depicts an embodiment of a circuit diagram of a differential triode multiplier in a differential triode multiplier formed with BJTs where an active load eliminates the DC component and the leakage component of the intermodulation products.

As described earlier, the triode interface 5-2 within the triode interface generates three components: the reference product component, the leakage component, and the DC component. FIG. 21 illustrates how a bandpass filter 21-1 used as the load of a triode interface can eliminate both the leakage component and a DC component simultaneously. Instead of using a double-balanced triode interface comprising two triode interfaces; only one triode interface is required. Each leg of the triode interface couples to a tank circuit. Output node 21-3 couples to a tank circuit formed by $L_1$ and $C_7$. Output node 21-4 couples to a tank circuit formed by $L_2$ and $C_8$. The output nodes 21-3 and 21-4 of the multiplier couple via a load.

Figure 22:
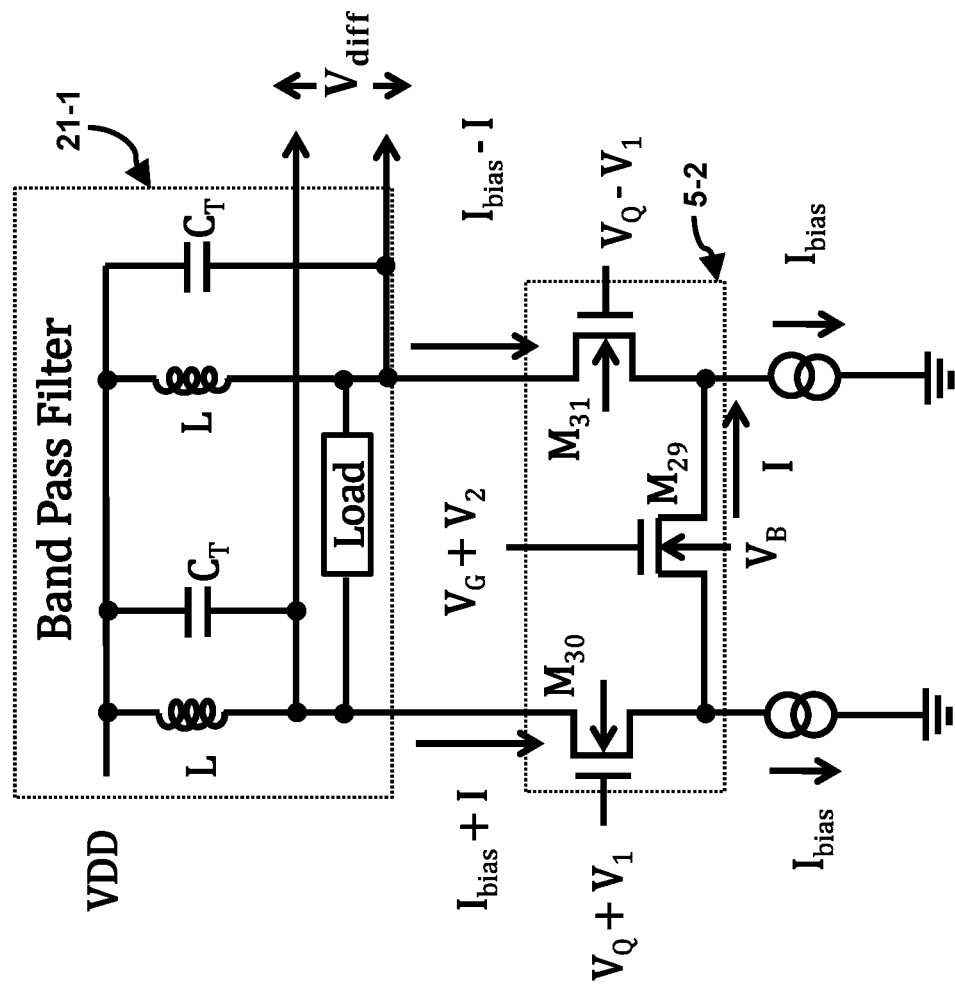
FIG. 22 depicts an embodiment of a circuit diagram of a differential triode multiplier in a differential triode multiplier formed with MOS transistors where an active load eliminates the DC component and the leakage component of the intermodulation products.

As illustrated in the spectrum plots of 21-2, two equal frequency tone signals, $V_1$ and $V_2$, each at frequency $f_0$ and illustrated in the top spectrum within 21-8 are applied to the inputs of the triode interface 5-2. The triode interface 5-2 generates all three terms: the product component at $2 f_0$, the leakage component at $f_0$, and the DC component. These three components from the triode interface couple to the bandpass filter 21-1. Each of the tank circuits within this load is tuned to a frequency of $2 f_0$; thus, the bandpass filter has a high impedance at the frequency of $2 f_0$ and has a very low impedance components at $f_0$ and DC. The leakage component at $f_0$ and the DC component are filtered out leaving only the frequency component at $2 f_0$. The product component at $2 f_0$ provides the ideal multiplication of the two frequency tones at $f_0$ applied to the inputs of the triode interface. The output signal $V_{diff}$ only contains the spectrum of the product component at $2 f_0$ as illustrated in the lower spectrum plot in 21-2. Note that the DC component at 10-5 and the leakage component at $f_0$ have been filtered out by the bandpass filter. FIG. 22 illustrates the triode interface 5-2 comprised of only MOS devices. The output signal $V_{diff}$ of the circuit in FIG. 22 only contains the spectrum of the reference product component as illustrated in the lower spectrum plot in 21-2 of FIG. 21.

PLL Phase Adding Circuit

Figure 23:
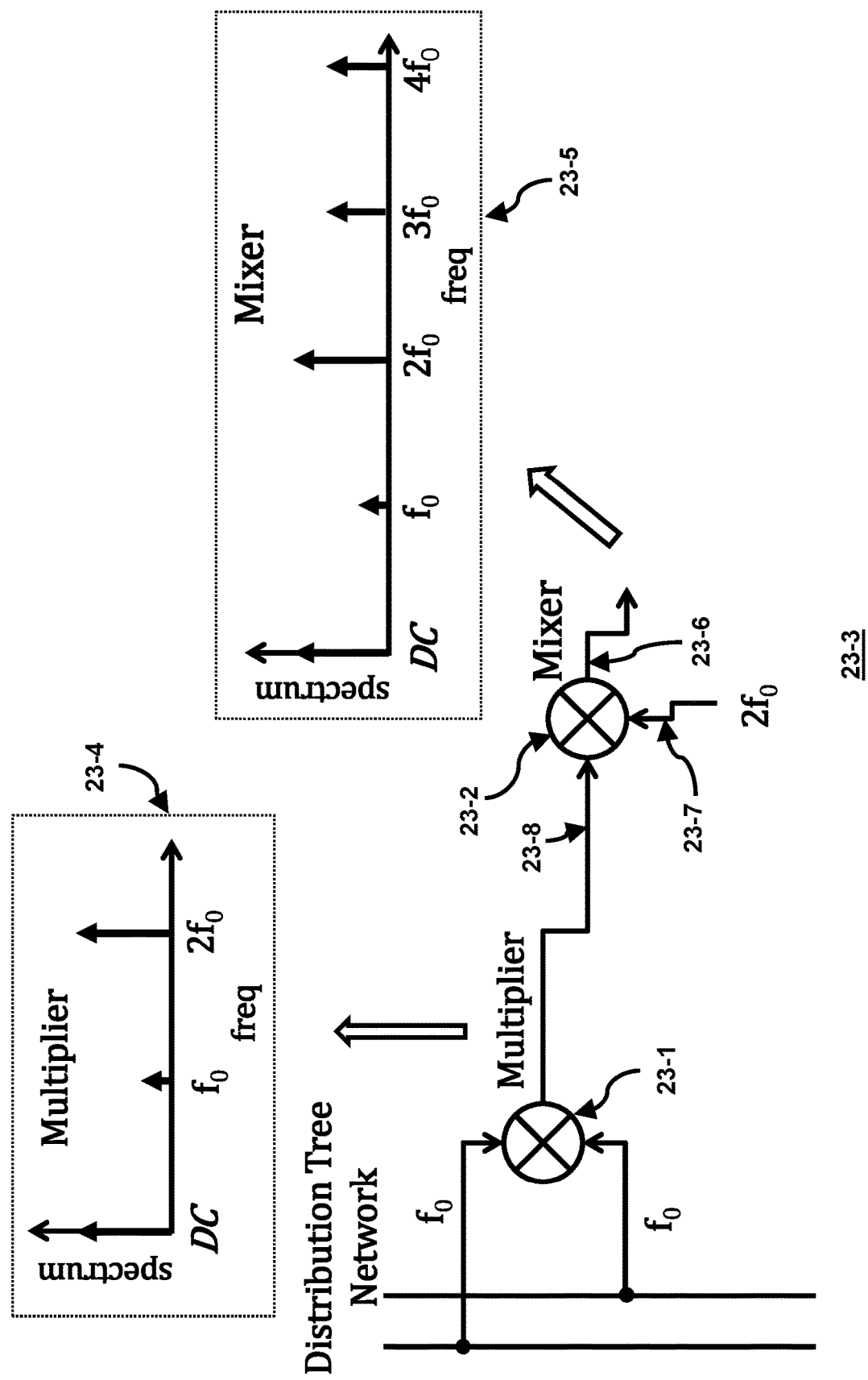
FIG. 23 depicts an embodiment of a triode multiplier multiplying two equal tones with the resultant tone at twice the frequency mixed in a mixer with a second tone having twice the frequency along with each respective frequency spectrum.

A phase locked loop and a triode multiplier can together generate the product component at $2 f_0$ and generate a second orthogonal product component at $2 f_0$. The diagram of the circuit 23-3 illustrated in FIG. 23 presents spectrum plots at two locations within the embodiment of the circuit. A multiplier 23-1 configured as a triode multiplier multiplies two signals coupled from a distribution tree network. Each of the coupled signals have a frequency $f_0$ and generate the spectrum illustrated within block 23-4. This spectrum contains the three components of the triode multiplier as described earlier. These components include the DC component, the leakage component at frequency $f_0$, and product component at frequency $2 f_0$. The first input node 23-8 of the mixer 23-2 receives this spectrum with the three resultant components illustrated in 23-4.

The second input 23-7 of the mixer receives a frequency tone at a frequency of $2 f_0$. The mixer 23-2 mixes these three resultant components from the analog multiplier 23-1 with the frequency tone at a frequency of $2 f_0$. The block 23-5 presents the resultant output spectrum at the output 23-6 of the mixer as a function of frequency. The components include the mixing of $2 f_0$ with DC that generates the $2 f_0$ component, the mixing of $2 f_0$ with $f_0$ that generates an $f_0$ component and a $3 f_0$ component, and the mixing of $2 f_0$ with $2 f_0$ that generates a DC component and a $4 f_0$ component.

FIG. 24A completes the embodiment of the circuit 23-3 illustrated in FIG. 23 by incorporating a phase lock loop (PLL) 24-1 with the mixer. The PLL includes a loop formed with the existing mixer 23-2, a loop filter 24-2, and a voltage controlled oscillator (VCO) 24-4 where the output of the VCO couples to the mixer. The output 23-6 of the mixer 23-2 couples to the input of the loop filter 24-2. The output 24-3 of the loop filter 24-2 couples to the input of the VCO 24-4 and the output of the VCO couples back to a second input node 23-7 of the mixer. The VCO generates a frequency tone at $2 f_0$ and applies this frequency tone to the second input of the mixer.

With the PLL included, the output node 23-6 of the mixer generates the spectrum 24-5. This spectrum is similar to the spectrum 23-5 presented in FIG. 23; however, in 24-5 the loop filter 24-2 applies a low pass filter mask 24-6 to the spectrum. Due to the low pass filtering 24-6 of the loop filter, the DC component on node 24-3 is the only component remaining at the output 24-3 of the loop filter. The loop filter eliminates the remaining higher frequency components: $f_0$, $2 f_0$, $3 f_0$, and $4 f_0$ within the spectrum plot of 24-5. The VCO 24-4 receives the DC component on node 24-3 from the loop filter. The operation of the PLL adjusts the phase of the tone frequency at $2 f_0$ at the output of the VCO coupled to the second input node 23-7 of the mixer. The loop of the VCO adjusts itself to the reference tone frequency at $2 f_0$ provided to the first input node 23-8 of the mixer by the multiplier 23-1. In the process of the phase adjustment of the PLL, the DC component on node 23-6 reduces in magnitude. As the magnitude of the voltage of the DC component reduces, the frequency tone at 2 f0 at the output of the VCO becomes closer to being orthogonal (90 degree phase difference) to the frequency tone at 2 f0 of the signal applied to the input node 23-8 of the mixer. Eventually, the PLL reduces the DC component to zero. At this point, the VCO locks. The locked VCO generates a frequency tone at $2 f_0$ at the input node 23-7 to the mixer that is phase shifted from the frequency tone at $2 f_0$ applied to the first input node 23-8 of the mixer by 90° (this also represents the desired output signal of the circuit). The circuit configuration of the analog multiplier, mixer, and PLL illustrated in FIG. 24A is another embodiment of a phase adder.

The active antenna array requires a plurality of phase adders. Each phase adder generates a reference product component at a frequency tone at 2 $f_0$. Each antenna element of the active antenna array requires at least one separate reference product component operating at a frequency tone of 2 $f_0$. Thus, each instance of an antenna in an active antenna array requires a corresponding instance of a phase adder. Furthermore, each instance of the reference product component applied to each antenna needs to synchronized in phase and frequency to every other instance of the reference product component that is applied to every other antenna within the antenna array. Each one of the plurality of phase adders couples into the distribution tree network at different physical locations. The signals of the distribution tree network have a fixed global network parameter called "synchronization flight time". Based on this parameter, the phase adder generates a reference product component, which is essentially phase coherent (practically identical phase) to every other instance of reference product component generated by the remaining plurality of phase adders. Any phase adder that couples into the signals of the distribution tree network at any location therefore generates a reference product component that is phase coherent to every other instance of phase adder coupled into the signals of the distribution tree network. The signals of the distribution tree network guarantee a phase coherency over the entire area that the array of an active antenna array occupies. For further details of using a plurality of phase adders in an active antenna array, see Mihai Banu, Yiping Feng, and Vladimir Prodanov "Low Cost, Active Antenna Arrays" U.S. Pat. No. 8,611,959, published Dec. 17, 2013, the disclosure of which is incorporated herein by reference in its entirety.

FIG. 24B illustrates an embodiment of a phase adder where the PLL loop includes a buffer 24-8. The buffer can drive larger loads without significantly affecting the performance of the PLL. The buffer 24-8 provides the reference product component at 2 $f_0$ back to the second input node 23-7 of the mixer. The buffer can drive larger loads via the output lead 24-9. The signal on lead 24-9 provides the reference product component at 2 $f_0$ to at least one antenna of the phased array. The remaining phase adders coupled to different portions of the distribution tree network provide their own version of the reference product component at 2 $f_0$. All instances of the reference product component at 2 $f_0$ generated by their respective phase adder is globally in phase over the entire phased array. This global reference product component at 2 $f_0$ presented to each antenna enables the accurate steering of the various beams of the communication channels established by the phased array.

Figure 25:
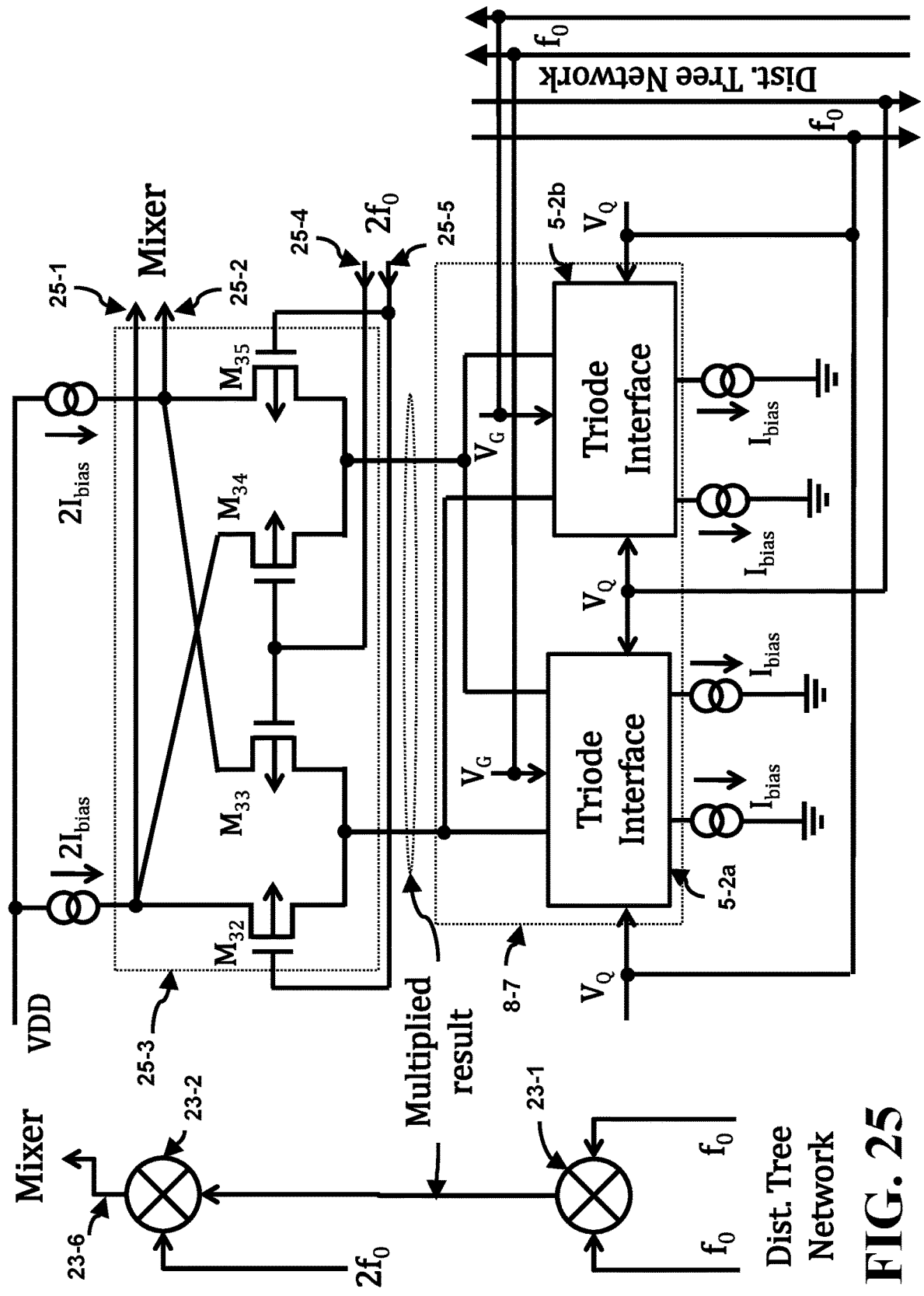
FIG. 25 depicts an embodiment of an equivalent circuit/block model representing the multiplier and mixer of FIG. 23.

FIG. 25 presents a side-by-side comparison between the model initially presented in FIG. 23 comprising the analog multiplier 23-1 and the mixer 23-6 and the corresponding circuit and block equivalents shown to the right. The first and second inputs of the analog multiplier 23-1 couple to the frequency tones of $f_0$ coupled from the distribution tree network. The corresponding circuit implementation presents a double-balanced triode interface 8-7 receiving the differential frequency tone of $f_0$ from the network of the distributional tree signals. Note that the double-balanced triode multiplier 8-7 and the Gilbert mixer 25-3 are electrically stacked together so that the bias currents that are provided to the multiplier circuit by the current source section also serve as bias currents for the mixer circuit.

The analog multiplier 23-1 generates a multiplied result. The double-balanced triode interface 8-7 generates a corresponding multiplied result on its two output leads as shown. A first input of the mixer 23-2 receives the multiplied result, the second input of the mixer receives a frequency tone of 2 $f_0$ and the output 23-6 provides the mixed signal result. The corresponding circuit of the mixer 23-2 is the double-balanced Gilbert mixer 25-3 that receives the multiplied result from the double-balanced triode interface 8-7 as the multiplied result and a balanced dual frequency tone of 2 $f_0$ on input leads 25-4 and 25-5 as a second input. The differential outputs 25-1 and 25-2 of the double-balanced Gilbert mixer provide the mixed signal result.

Figure 26:
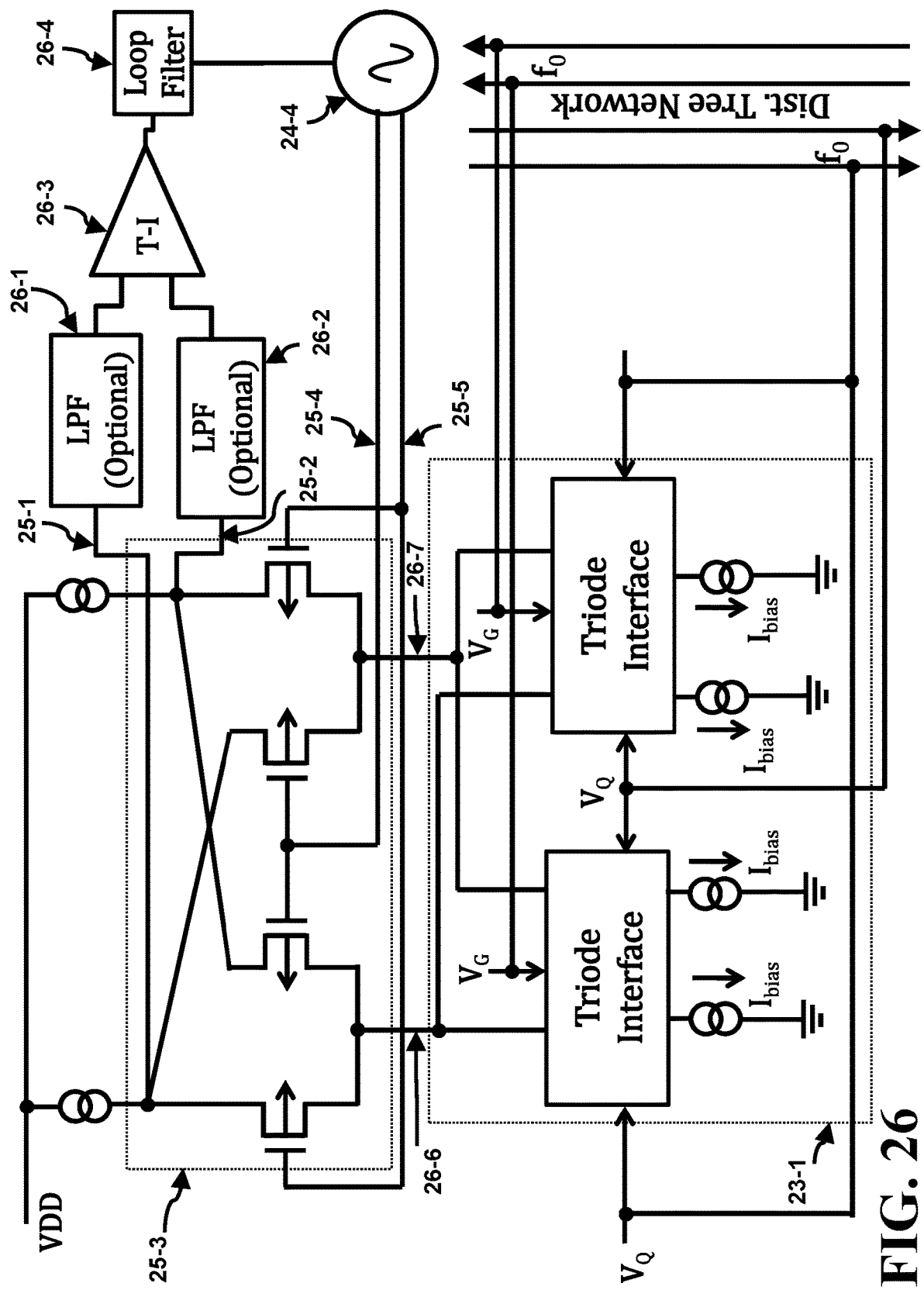
FIG. 26 depicts an embodiment of an equivalent circuit/block model using an amplifier representing the multiplier and PLL of FIG. 24A.

FIG. 26 illustrates one embodiment describing the components necessary to form a phase adder using a PLL formed with the double-balanced Gilbert mixer 25-3. Low pass filters 26-1 and 26-2 optionally filter the outputs of the double-balanced Gilbert mixer 25-1 and 25-2, respectively. These filtered outputs couple to an amplifier 26-3. The amplifier couples to the input of a loop filter 26-4. The loop filter passes the DC component and eliminates the $f_0$ components and their harmonics. The output of the loop filter couples to the VCO 24-4. The differential outputs of the VCO operating at 2 $f_0$ couple to the gates of the double-balanced Gilbert mixer 25-3. This final phase adder circuit is the equivalent to the circuit described in FIG. 24A.

The multiplied result on leads 26-6 and 26-7 from the double-balanced triode interface comprising the ideal 2 $f_0$ multiplied component mixes in the double-balanced Gilbert mixer 25-3 with the 2 $f_0$ output signals 25-4 and 25-5 from the VCO 24-4. The operation of the PLL causes the 2 $f_0$ output of the VCO to become orthogonally locked to the reference 2 $f_0$ current signals on leads 26-6 and 26-7 generated by the double-balanced triode interface.

Figure 27:
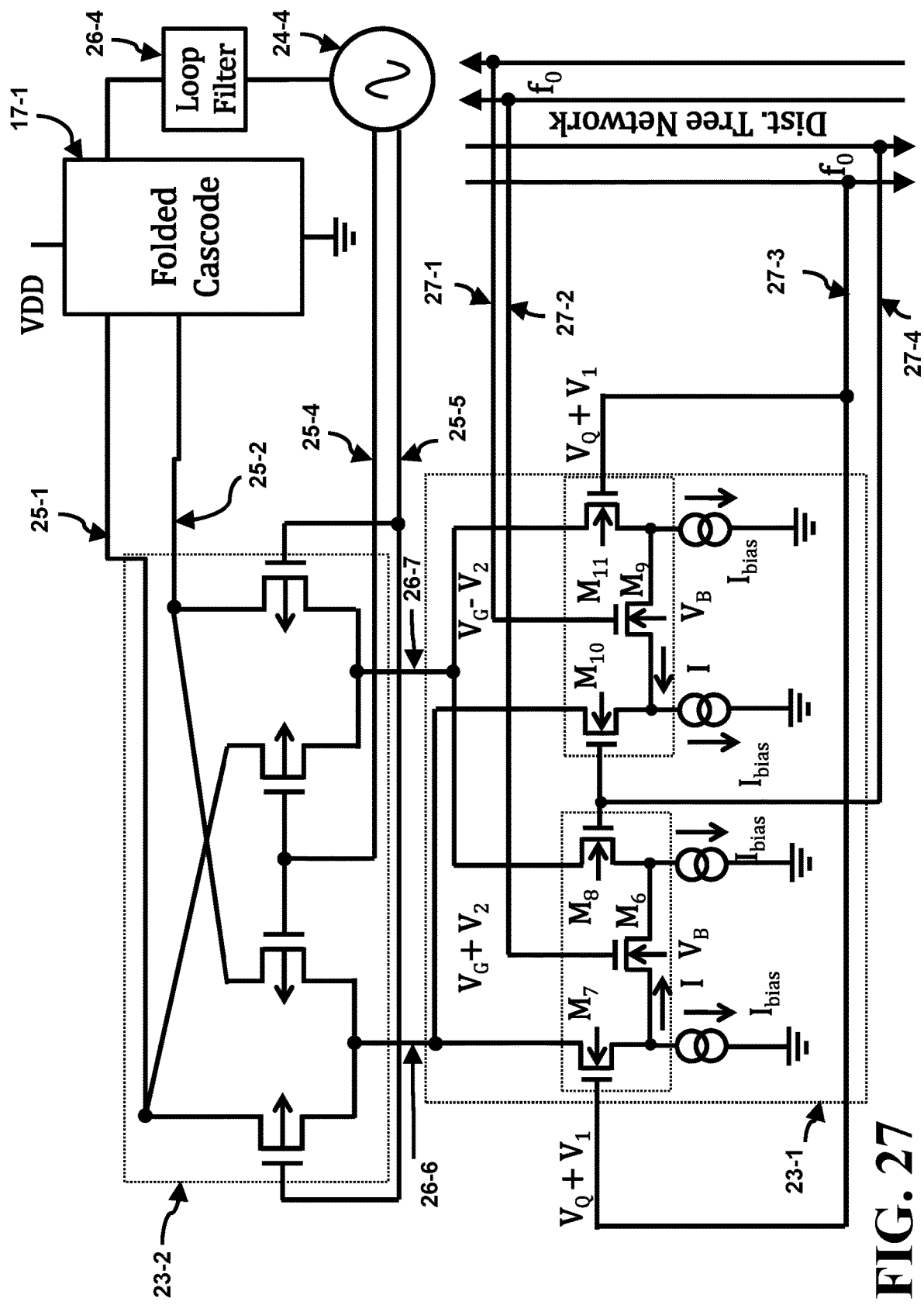
FIG. 27 depicts an embodiment of an equivalent circuit/block model using a folded cascode representing the multiplier and PLL of FIG. 24A.

FIG. 27 illustrates another embodiment of the phase adder using other components to form a PLL with the double-balanced Gilbert mixer 25-3. The double-balanced Gilbert mixer outputs 25-1 and 25-2 couple to a folded cascode 17-1. The output of the folded cascode is DC filtered by the loop filter 26-4 and applied to the VCO 24-4.

The distribution tree network couples a first differential signal carrying a differential reference product component tone $f_0$ flowing in a first direction and couples a second differential signal carrying frequency tone $f_0$ in a second opposite direction to the multiplier. The first differential signals 27-3 and 27-4 couple to transistors $M_7$, $M_8$, $M_{10}$, and $M_{11}$. These transistors switched the $I_{bias}$ current in each of the triode interfaces. The second differential signals 27-1 and 27-2 couple to the gates of the triode transistors M6 and M9. These transistors control the current flow I between the legs of the triode interfaces. The magnitude of the current flow I is typically much less than the magnitude of the current $I_{bias}$.

Figure 28:
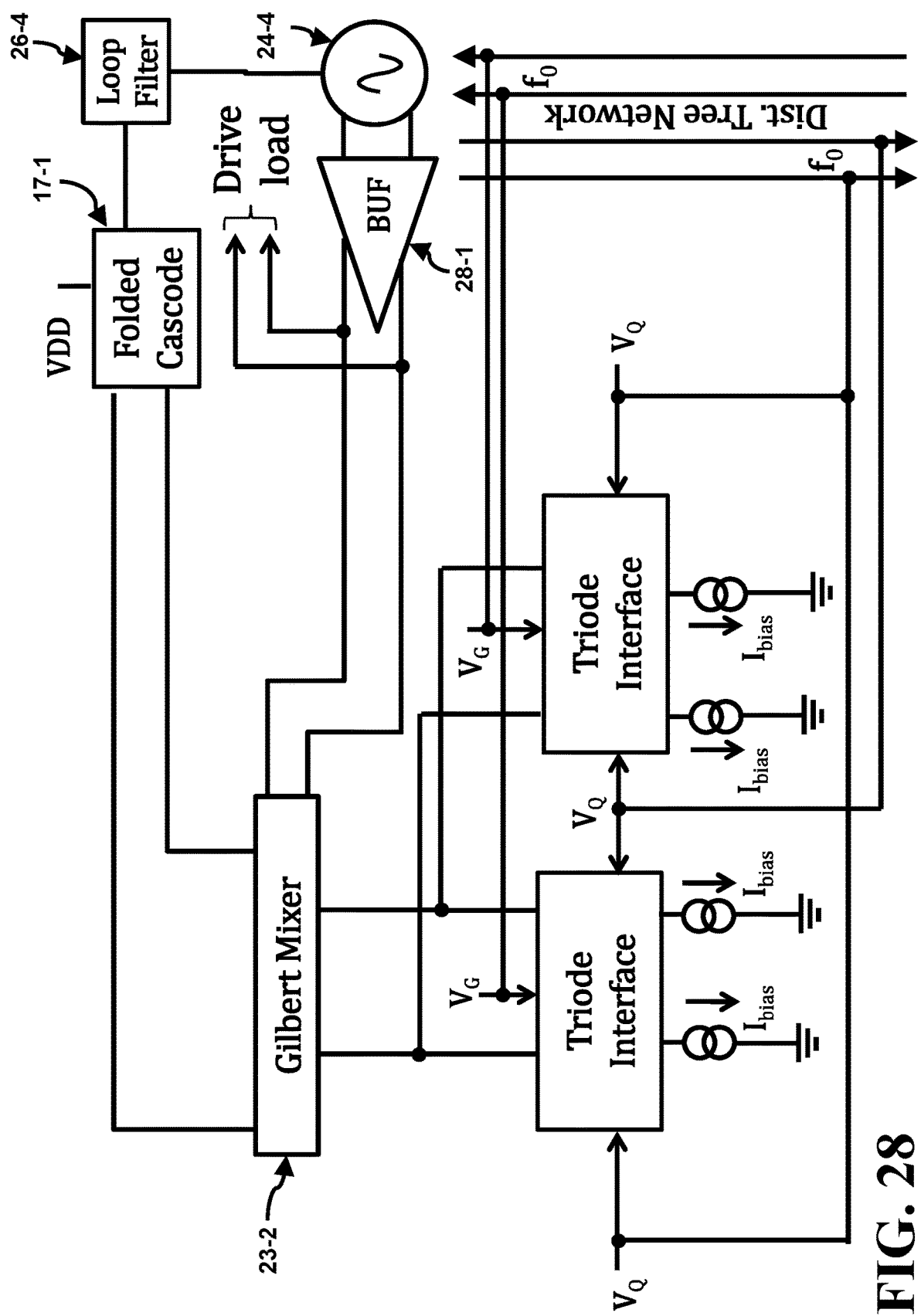
FIG. 28 depicts an embodiment of an equivalent circuit/block model using a folded cascode representing the multiplier and PLL which includes the buffer of FIG. 24B.

FIG. 28 illustrates a block diagram of FIG. 27 with an additional component added within the PLL loop. The additional component is a differential buffer 28-1. The differential buffer is part of the PLL loop and can drive large loads without influencing the performance of the PLL, otherwise the operation is similar to that of FIG. 26.

Figure 29:
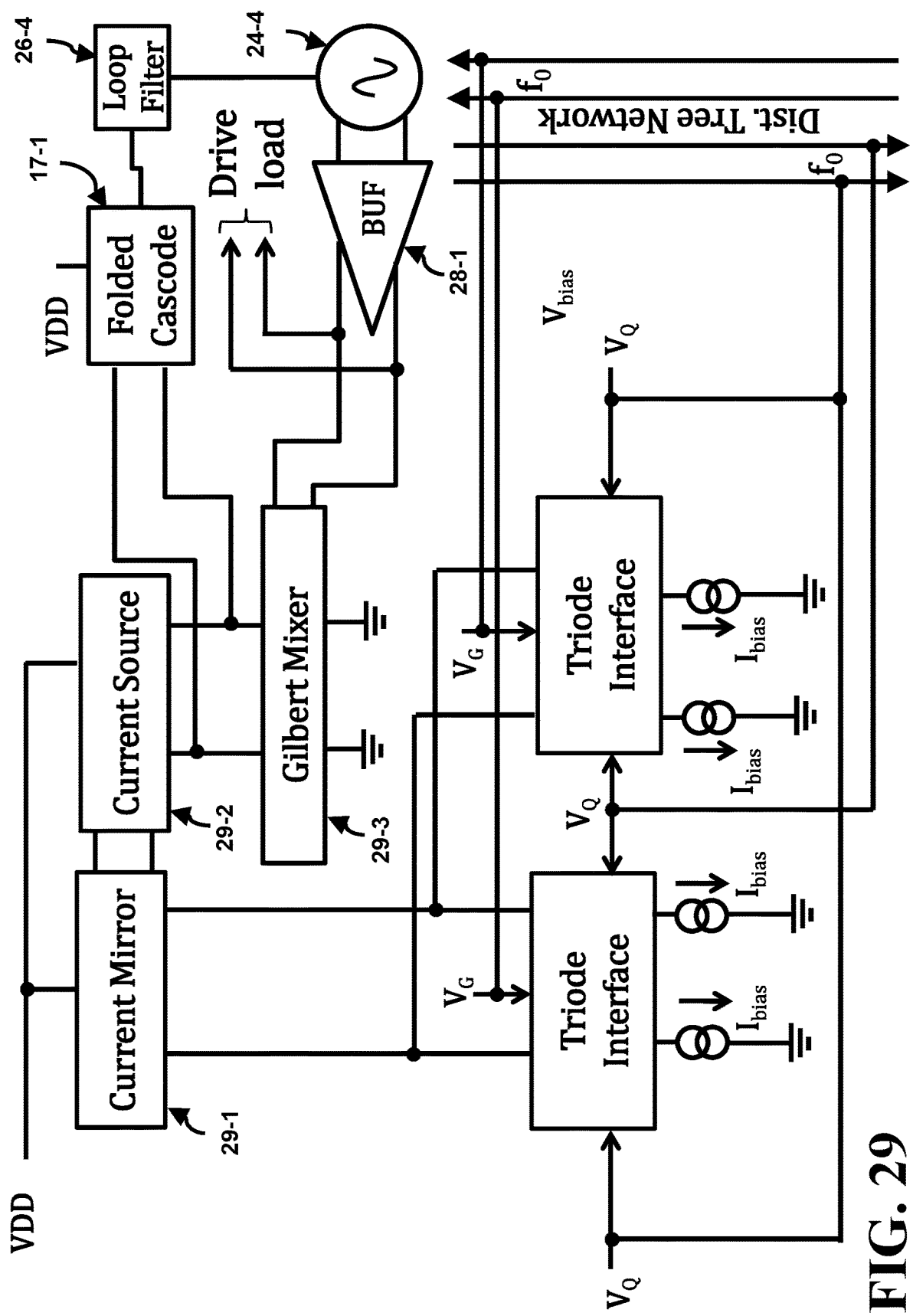
FIG. 29 depicts an embodiment of an equivalent circuit/block model for low voltage operation using a folded cascode representing the multiplier and PLL which includes the buffer of FIG. 24B.

FIG. 29 illustrates an embodiment of a phase adder where the transistor stack of the triode interface and double-balanced Gilbert mixer are partitioned to provide additional voltage headroom in case the power supply is reduced. The multiplied result from the double-balanced triode interface couples to a current mirror 29-1. The current mirror controls the current source 29-2 and provides current to a double-balanced Gilbert mixer 29-3 implemented using N-channel transistors. The PLL consists of the components double-balanced Gilbert mixer, the folded cascode 17-1, the loop filter 26-4, the VCO 24-4, and the buffer 28-1.

Note that most of the above-described circuits are preferably fabricated on a single integrated circuit chip on which much greater uniformity among the characteristics and performance of the devices is more easily achievable. This includes, for example, the circuits illustrated by FIGS. 5-7, 8A, 9, 10A, 11-21, 24A, 24B, and 25-29.

Removing Phase Errors Due to Practical Impairments

The practical realizations of the phase adding circuits disclosed in the previous sections may have non-negligible output phase errors due to transistor mismatches, bias variations, temperature variations, undesired signal coupling, etc. In other words, the output phase of the practical realizations will be different from the ideal sum of the two input phases by an error value. Next, techniques to reduce or eliminate these practical phase errors are described. These techniques are also referred as calibration methods.

In the case of the PLL-based phase-adding circuits, such as those of FIG. 24A and FIG. 24B, a major source of output phase errors is the generation of undesired DC offsets throughout the circuit. For example, any signal propagating through a transistor, which is a nonlinear device, can generate DC spurs, which can potentially end up through various mechanisms, at the output of the phase adder and at the input of the VCO because the PLL loop filter allows DC to pass. When in lock, the PLL drives the total DC signal at the input of the VCO to zero. Since this total DC signal at the input of the VCO is composed of the desired DC signal and the sum of all DC errors, when the PLL is in lock, the desired DC signal will equal the negative of the sum of all DC errors. This creates phase errors at the output of the VCO, which is the output of the realized phase adder.

A method for minimizing or eliminating the phase errors mentioned above is to calibrate out the DC errors at the input of the VCO. This can be done by first shifting the signal frequency at the second input of the mixer (23-7 in FIG. 23) from $2 f_0$ to $2 f_0+\Delta f$, where $\Delta f$ is a small frequency shift compared to $f_0$. This makes the desired phase adding DC component at the input of the VCO zero because the two input signals of mixer (23-2 in FIG. 23) have different frequencies. The only remaining DC component at the input of the VCO is the sum of all DC errors. Notice that shifting only the signal frequency of the second input of the mixer is a minimally invasive action to the phase adder circuit, leaving all other component connections and signals of the phase adder intact, including most of the DC error generating mechanisms in the circuit. In parallel with shifting only the signal frequency of the second input of the mixer, the PLL loop must be broken so the input of the VCO is not forced to zero by the loop. Next, one can monitor the DC errors (e.g. compare to a set value) and calibrate them out with an additional circuit. After this calibration is performed, the PLL loop is reconnected to the original configuration.

The following presents implementations of this concept together with adding PLL locking aid mechanisms.

Figure 30A:
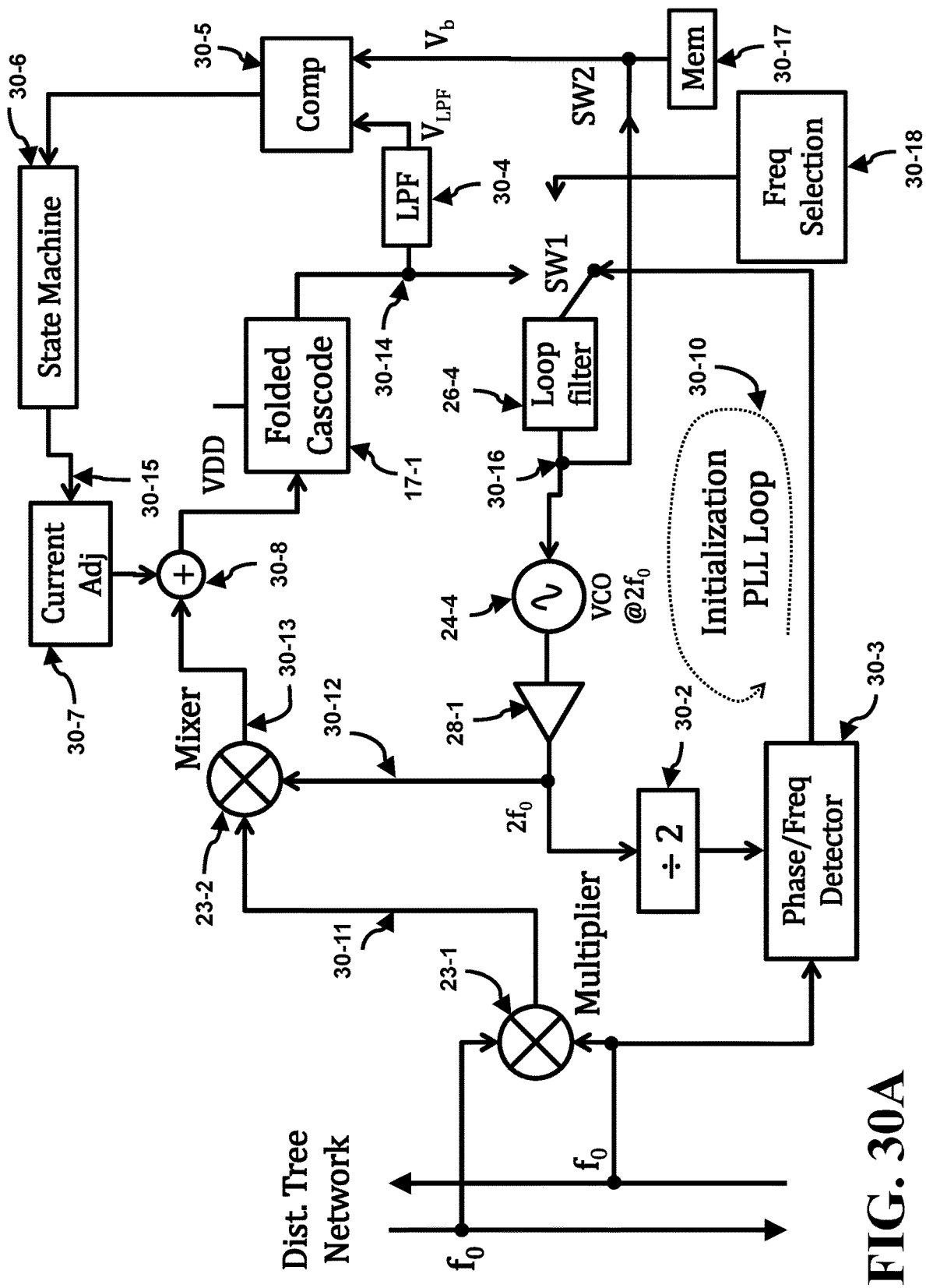
FIG. 30A depicts a first switch configuration to prepare the generation of the loop voltage for a PLL including the voltage controlled oscillator (VCO) operating at 2 $f_o$.

FIG. 30A illustrates one embodiment of a calibration circuit used to calibrate a phase adder. The phase adder circuit illustrated in FIG. 27, for example, can use this calibration circuit to calibrate the Primary PLL within the phase adder. A side-by-side comparison of FIG. 30A and FIG. 27 would highlight common components within each of these circuits. For example, the circuit schematics for the analog multiplier 23-1 and the mixer 23-2 in FIG. 30A are illustrated in FIG. 27 within the corresponding dotted boxes 23-1 and 23-2, respectively. In FIG. 27, the components of the folded cascode 17-1, the loop filter 26-4, the VCO 24-4, and the double-balanced Gilbert mixer 23-2 form a "Primary PLL Loop". Note that in FIG. 30A, (disregarding the buffer 28-1) the same listed components would form the "Primary PLL Loop" which is currently open due to the position of three-way switch SW1.

Switch SW1 is set to form a different PLL loop called the "Initialization PLL Loop". This loop includes components common to "Primary PLL Loop", namely, the loop filter 26-4 and the VCO 24-4 (and the buffer 28-1). However, the "Initialization PLL Loop" uses the new circuit components including a divide-by-two circuit 30-2 and a phase and frequency detector 30-3, to complete the "Initialization PLL Loop". The newly formed "Initialization PLL Loop" includes the phase frequency detector 30-3, the loop filter 26-4, the VCO 24-4, a buffer 28-1, and the divide-by-two circuit 30-2. The "Initialization PLL Loop" sets the operating frequency of the VCO 24-4 to twice the frequency of the $f_0$ frequency tone coupled from the signals of the distribution tree network. The $f_0$ frequency serves as a reference product component for the phase frequency detector 30-3. The phase frequency detector 30-3 compares the reference product component $f_0$ from the distribution tree network with the frequency of the VCO 24-4 after being divided-by-two circuit 30-2. The "Initialization PLL Loop" settles to generate a DC control voltage at node 30-16 at the output of the loop filter 26-4 that causes the VCO to operate at a frequency $2 f_0$.

Figure 30B:
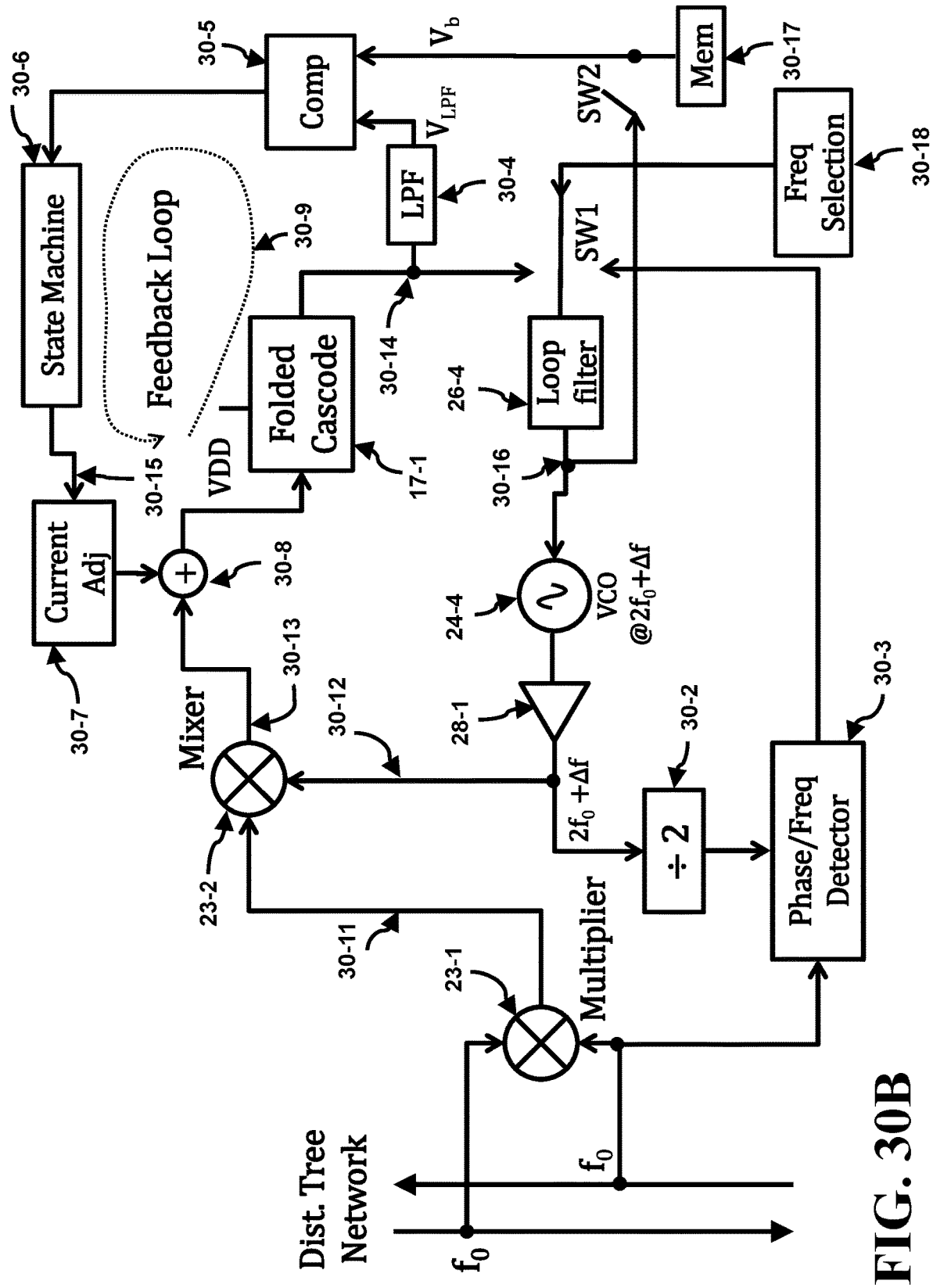
FIG. 30B depicts a second switch configuration to apply the determined loop voltage to a PLL within the multiplier circuit.

Before the SW1 is switched back to create the "Primary PLL Loop", the DC voltage at the output of the folded cascode 17-1 needs to be adjusted to match the DC control voltage of the "Initialization PLL Loop" at the output of the loop filter 26-4, which is stored in the memory block 30-17. To accomplish this, the switches SW1 and SW2 are changed to initialize the DC voltage at the output of the folded cascode. To calibrate out only the DC errors but not the desired phase adding DC component at the input of the VCO, the conditions of the switches SW1 and SW2 are changed as shown in FIG. 30B. SW2 is turned off to disconnect memory 30-17 from the "Initialization PLL Loop". And the "Initialization PLL Loop" is broken by switching the SW1 to a frequency selection block 30-18. The frequency selection block 30-18 changes the DC control voltage 30-16 and the input of the VCO 24-4. As a result, the VCO frequency is shifted from $2 f_0$ by a small amount $\Delta f$ by setting the frequency selection 30-18 to the desired frequency band.

Referring to FIG. 30B, the output 30-13 of the mixer 23-2 draws current from the folded cascode 17-1. As noted previously, the folded cascode has a very large gain with a very sharp transfer curve. The DC voltage of the output 30-14 of the folded cascode is dependent on the signal received from the mixer 23-2 as well as the process variations imposed on the transistors due to the fabrication of the integrated circuit. To compensate for the uncertainty of the DC voltage at the output of the folded cascode, a "feedback loop" formed by the folded cascode 17-1, a low pass filter 30-4, a comparator 30-5, a state machine 30-6, a current adjust circuit 30-7, and a summer 30-8 is formed. It is desirable to set the DC voltage at the output 30-14 of the folded cascode 17-1 to match the DC control voltage Vb stored in the memory 30-17, which was generated for the VCO in the previously described "Initialization PLL Loop".

The comparator 30-5 within the feedback loop compares the DC voltage stored in the memory 30-17 with the DC output voltage at the output of the folded cascode 30-14 via the low pass filter 30-4. The comparator 30-5 compares these two input signals and applies the resultant signal to a sequential state machine 30-6. The sequential state machine produces an output based on the result of the comparator. The output 30-15 from the state machine adjusts the current in the current adjust circuit 30-7 in small incremental steps. The adder 30-8 combines the small incremental currents to the existing current that the folded cascode 17-1 sources to the mixer 23-2. The small incremental currents cause the DC operating point at the output 30-14 of the folded cascode to change and thereby reduce the difference between the signals applied to the inputs of the comparator 30-5. The sequential state machine receives the output of the comparator and if that output is not zero, it increments the current to the adder 30-8. This process continues until the difference between the inputs applied to the comparator 30-5 approach zero. Once the comparator determines that the difference passes zero and becomes negative, the state machine ceases operation and stores the digital state of the current adjust circuit 30-7 in a memory (not shown). The stored result is then continuously applied to the current adjust circuit 30-7 such that the output voltage at 30-14 of the folded cascode 17-1 substantially matches the voltage value stored in the memory block 30-17, which equals the voltage that causes the VCO to operate at a frequency of 2 $f_0$.

Figure 30C:
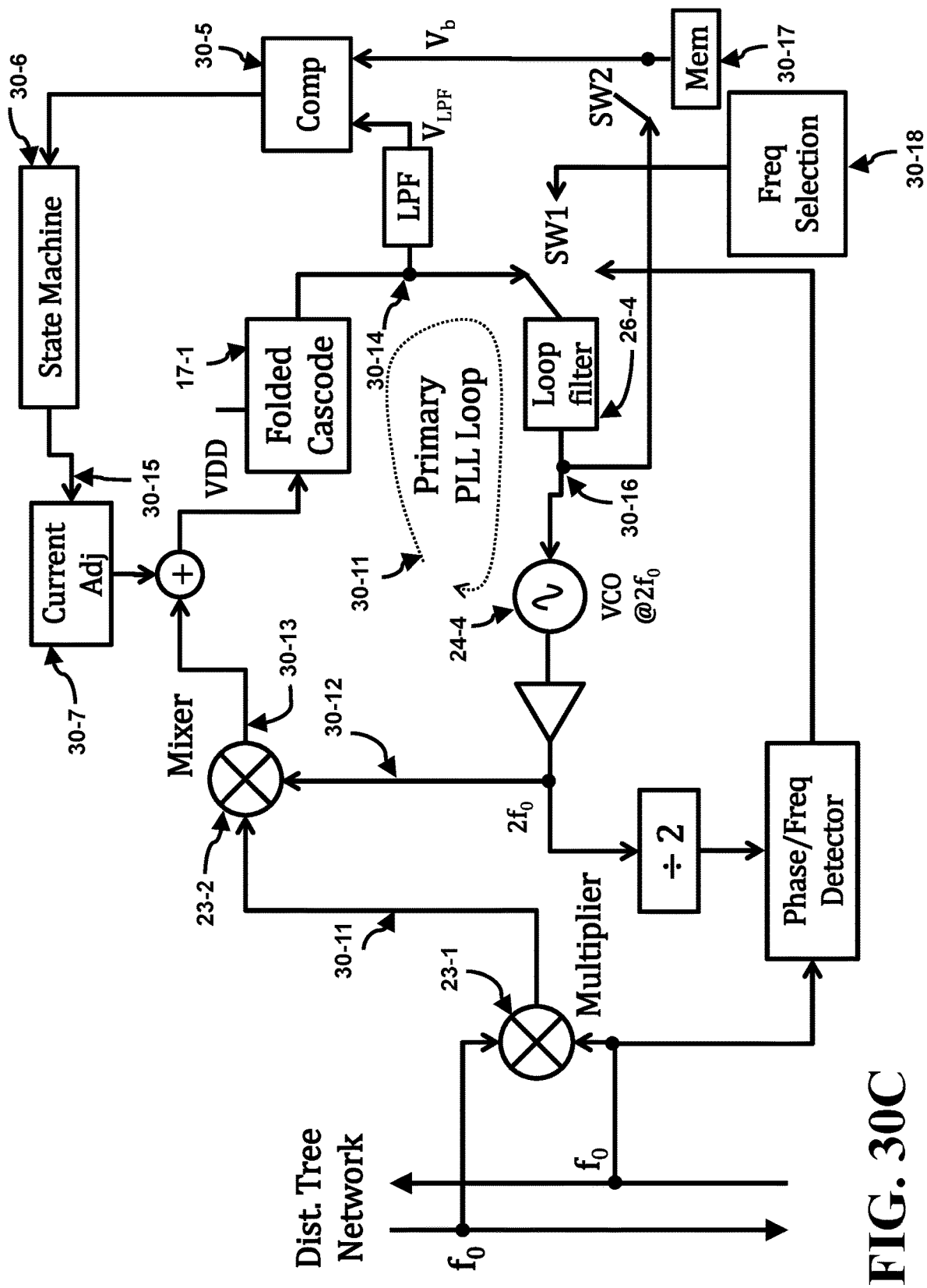
FIG. 30C depicts a third switch position for configuring the phase adder circuit.

Once the DC voltage at the output 30-14 of the folded cascode 17-1 matches the loop control voltage stored at the memory 30-17, the DC error calibration is finished. The control voltage 30-16 is re-set to the value stored in the memory 30-17 by switching switch SW1 into its third position connecting the output of folded cascode 17-1 to the input of loop filter 26-4 as illustrated in FIG. 30C. The new switch position forms the "Primary PLL Loop" as indicated.

With the "Primary PLL Loop" formed in this way, the analog multiplier 23-1 generates three components: a product component at 2 f0, a leakage component at $f_0$, and a DC component, and it applies these signals to the mixer 23-2 via input line 30-11. The mixer 23-2 generates the mixing products on node 30-13. These include the mixing of 2 $f_0$ X DC generating a 2 $f_0$ component, the mixing of 2 $f_0 \times f_0$ generating an $f_0$ component and a 3 $f_0$ component, and the mixing of 2 $f_0 \times 2$ $f_0$ generating another DC component and a 4 $f_0$ component. The "Primary PLL Loop" has a locking range that insures that the "Primary PLL Loop" locks once this PLL loop forms. The DC component at the output 30-16 of the loop filter 26-4 decreases through the feedback action of the "Primary PLL Loop". As the DC component reduces to zero, the phase difference between the 2 $f_0$ signals applied to the inputs of the mixer 23-2 approach 90° and orthogonally phase locks the frequency of the VCO to the reference product component tone at 2 $f_0$ at the output of the analog multiplier 23-1. These calibration steps when performed throughout the entire system ensure that the frequencies of all instances of the phase adders within the entire system are globally identical and phase locked.

Figure 31A:
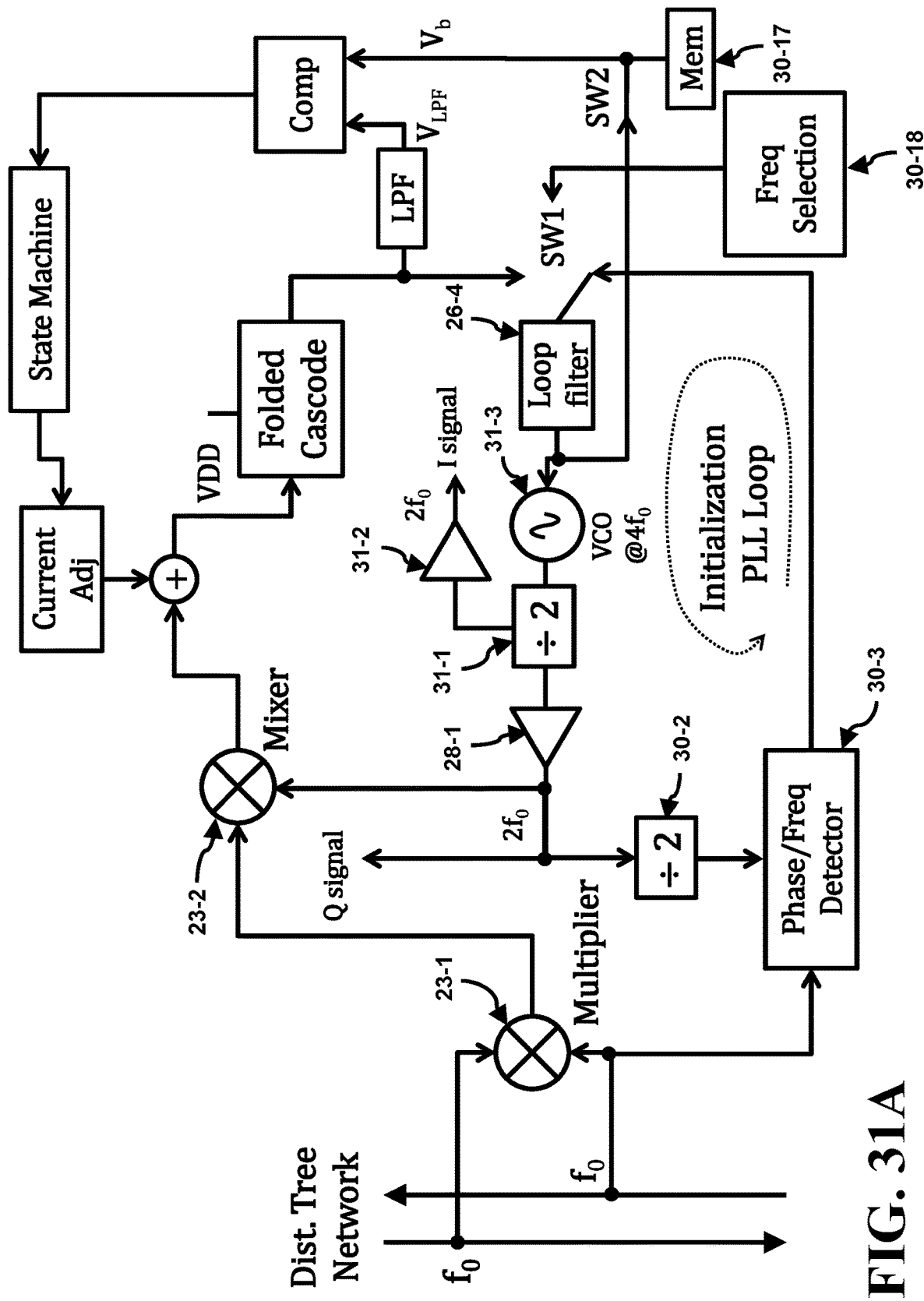
FIG. 31A depicts a first switch configuration to prepare the generation of the loop voltage for a PLL including the voltage controlled oscillator (VCO) operating at 4 $f_o$.
Figure 31B:
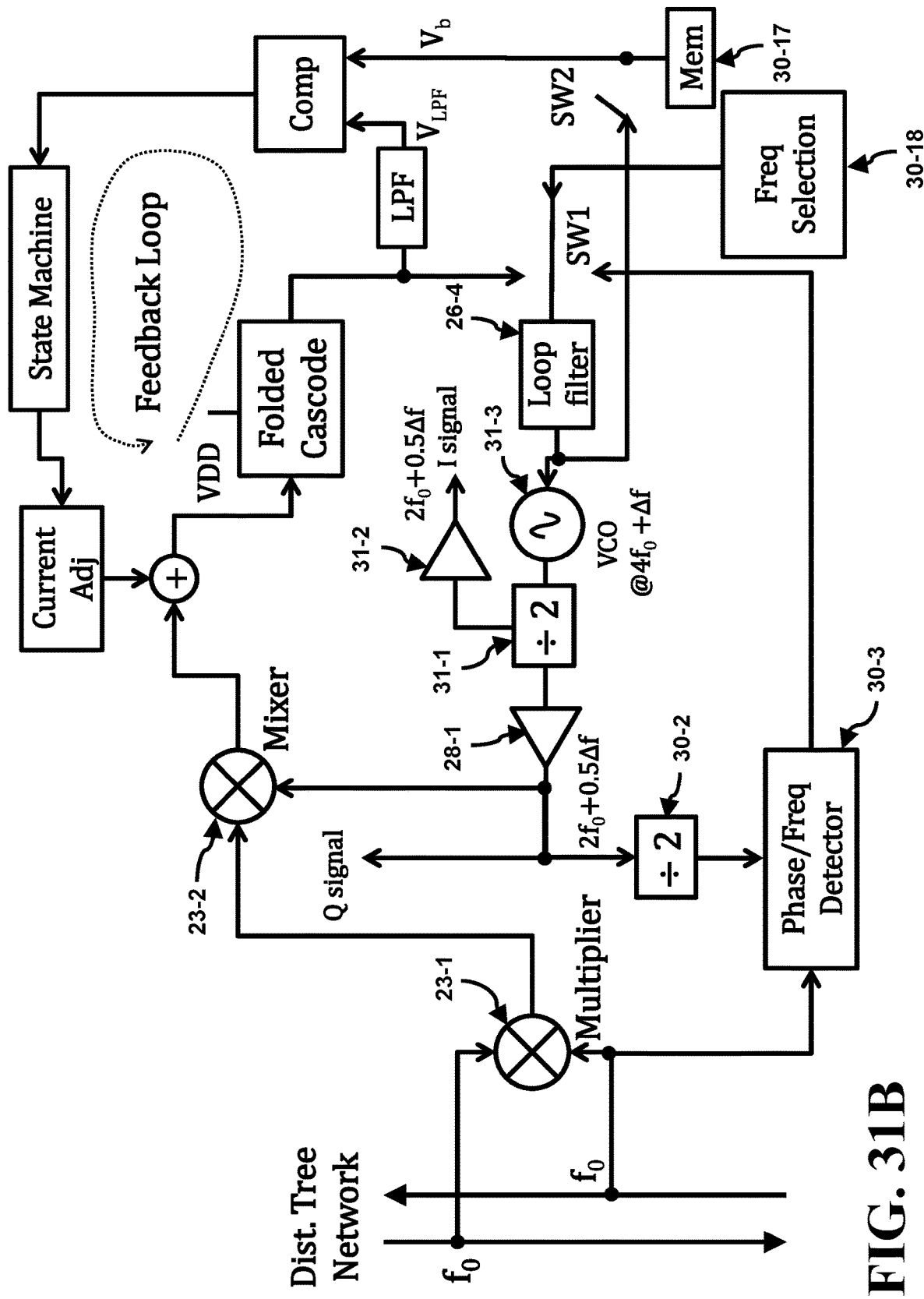
FIG. 31B depicts a second switch configuration for FIG. 31A to apply the determined loop voltage to a PLL within the multiplier circuit.
Figure 31C:
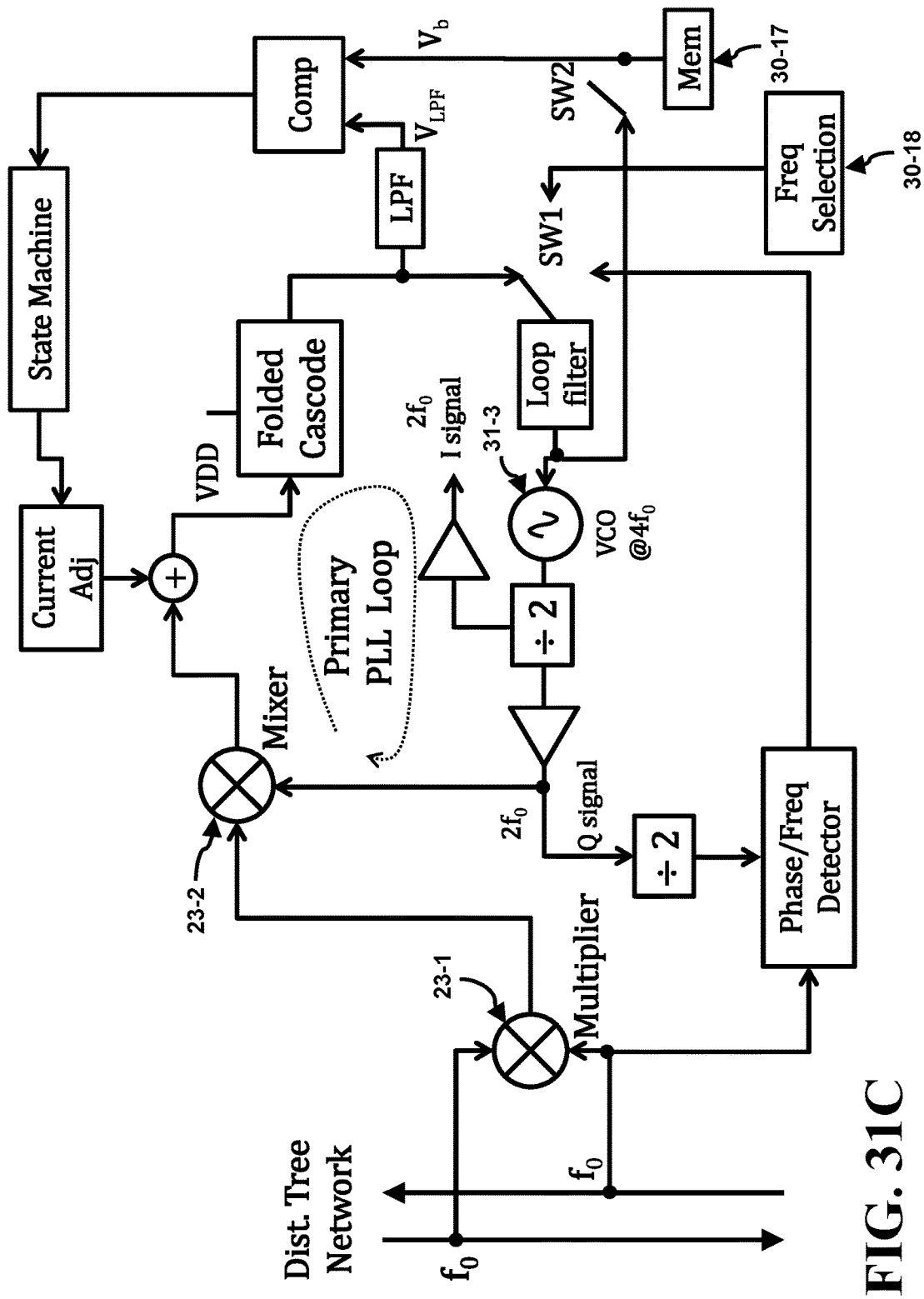
FIG. 31C depicts a third switch position for configuring the phase adder circuit.

FIG. 31A illustrates another embodiment of the circuit presented in FIG. 30A by replacing the 2 $f_0$ VCO 24-4 with a 4 $f_0$ VCO 31-3. The frequency at 4 $f_0$ is divided with a divide-by-two circuit 31-1 to generate I and Q signals each at frequency 2 $f_0$ and separated by 90°. Each of the I and Q signals is buffered by buffers 28-1 and 31-2, respectively. In other respects, the operation of the circuit in FIG. 31A mirrors that of the circuit in FIG. 30A. FIG. 31B illustrates the formation of the DC calibration loop after switches SW1 and SW2 change connectivity. FIG. 31C illustrates the formation of the Primary PLL loop after switches SW1 and SW2 again change connectivity. The circuits operate similar to the circuits illustrated by FIG. 30B and FIG. 30C, except that the VCO phase locks at a frequency of 4 $f_0$ and generates an I and Q signal operating at a frequency of 2 $f_0$.

Figure 32:
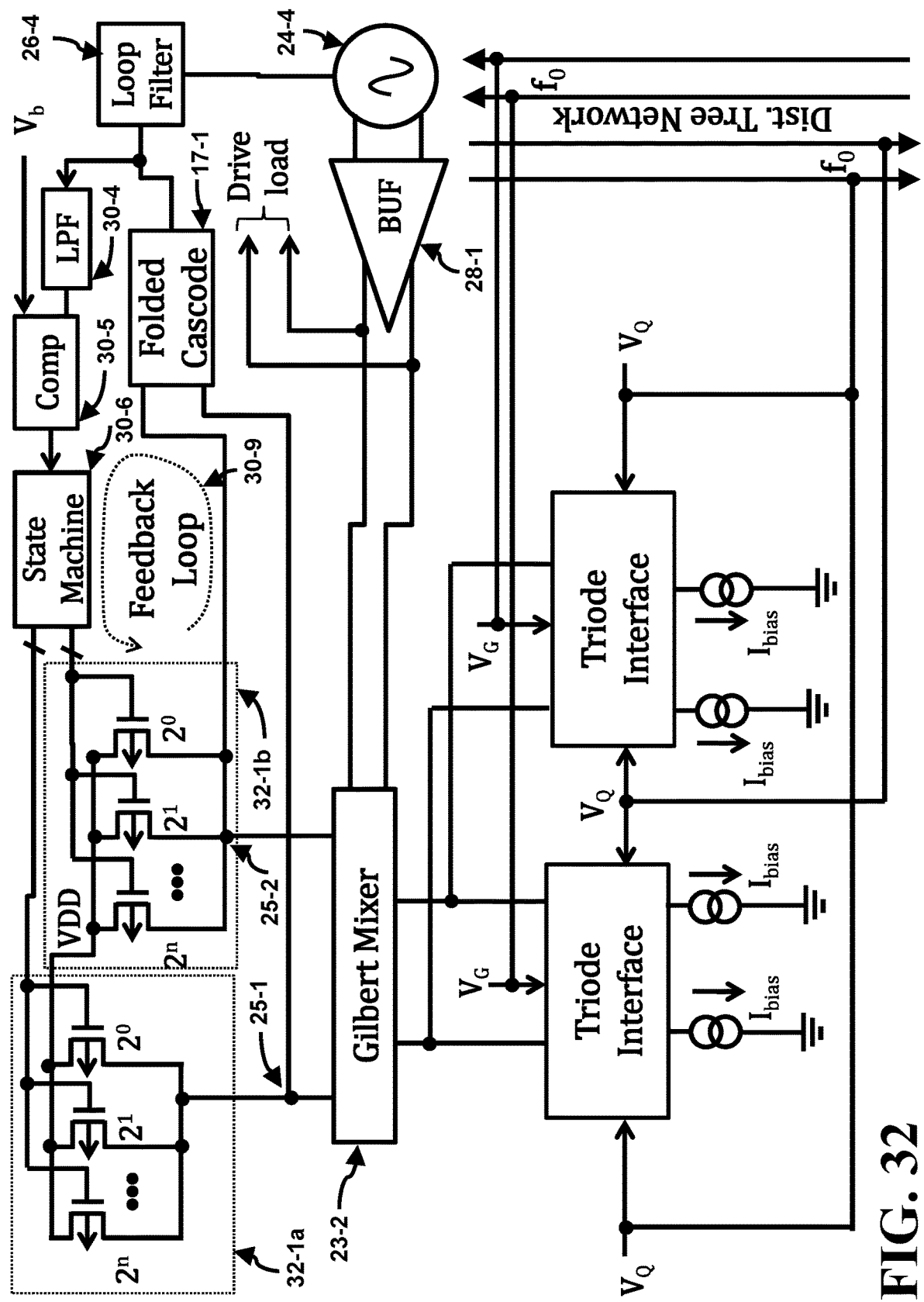
FIG. 32 depicts one embodiment of the feedback loop of FIG. 30 and FIG. 31.

FIG. 32 illustrates an implementation of the system shown in FIG. 30A with the current adjust circuit 30-7 implemented as two current adjust blocks 32-1a and 32-1b that are digital transistor arrays. Also, mixer 23-2 is implemented by a double balanced Gilbert mixer such as Gilbert mixer 25-3 illustrated in FIG. 25; and multiplier 23-1 is implemented by a double balanced triode interface such as double balanced triode interface 8-7 illustrated in FIG. 8A. The state machine 30-6 adjusts the digital weight applied to the gates of the transistors of the digital transistor array. Adjusting the digital weight alters the current through the digital array. These currents adjust the current flowing through the folded cascode 17-1 and alter the output voltage of the folded cascode. The comparator 30-5 compares the voltage difference at its inputs and sends the results to the state machine. The state machine 30-6 takes sequential incremental steps to make changes to the digital transistor array according to the information received from the comparator. The process continues sequentially until the difference at the inputs to the comparator approaches zero and then switches polarities. The state machine stops the sequential comparisons and stores the digital weight in memories (not shown).

Figure 33:
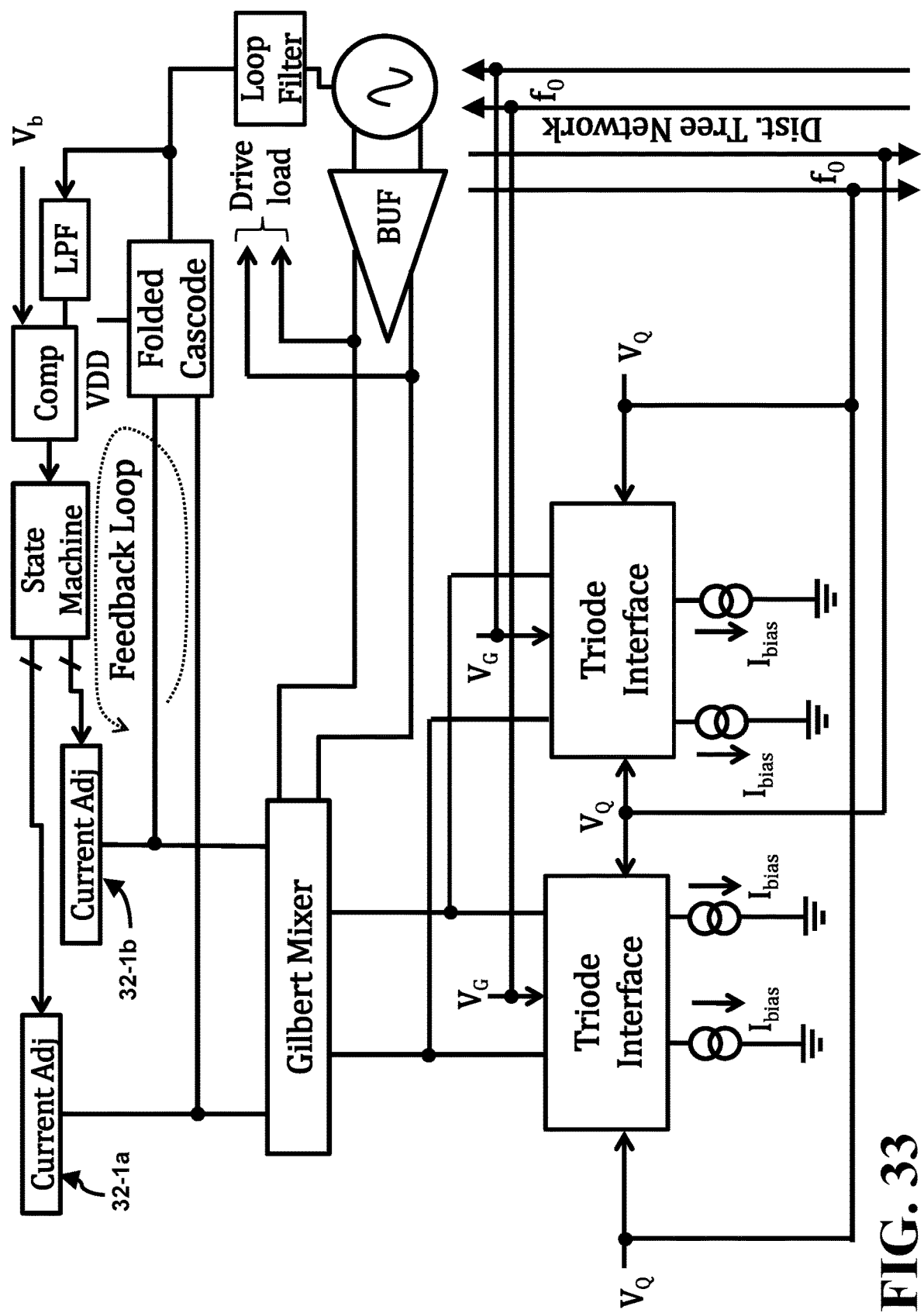
FIG. 33 depicts another embodiment of the feedback loop of FIG. 30 and FIG. 31.

FIG. 33 shows the embodiment of FIG. 32, but with the digital transistor arrays represented by current adjust blocks 32-1a and 32-1b, absent the details of the internal structure of those blocks. In all other respects, the circuit shown in FIG. 33 is the same as what is shown in FIG. 32.

Figure 34:
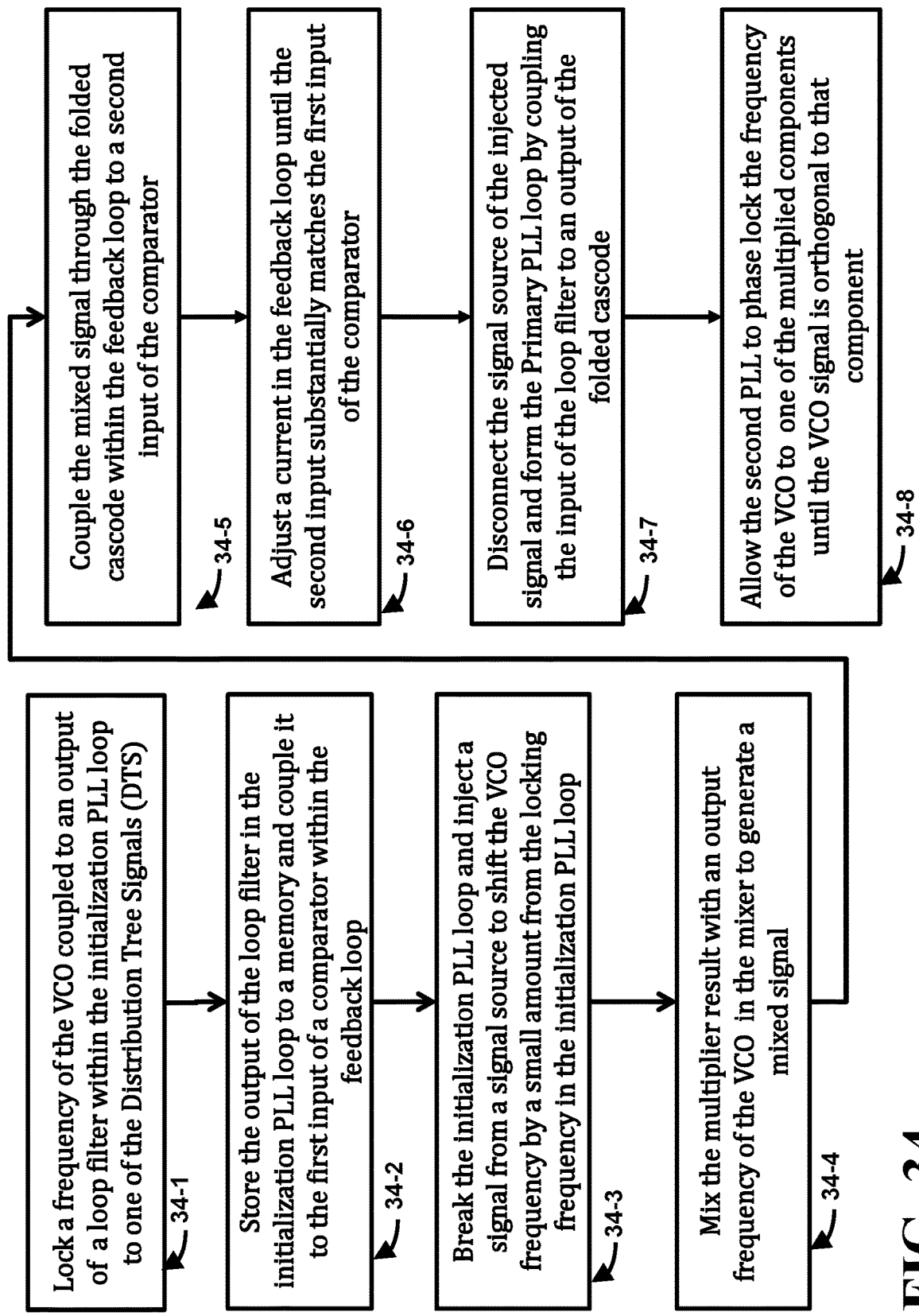
FIG. 34 depicts a flowchart of another embodiment of adjusting the loop voltage of FIG. 30 and FIG. 31.

FIG. 34 presents a flowchart of a computer or processor implemented algorithm for initializing and phase locking the frequency of a VCO to the reference product component $f_0$ coupled from the signals of the distribution tree network. In step 34-1 (and also referring to FIGS. 30A-C), loop filter 26-4 coupled to VCO 24-4 within the initialization PLL loop locks the VCO in frequency to one of the plurality of signals of the distribution tree network (DTN) that is coupled to the phase frequency detector 30-3. The initialization PLL loop includes divider 30-2, phase frequency detector 30-3, loop filter 26-4, and VCO 24-4. The signals of the distribution tree network have a frequency of $f_0$ and the VCO operates at a frequency that is an integer multiple of $f_0$.

In step 34-2, the DC voltage output of the loop filter 26-4 in the first PLL is stored in memory 30-17, and then memory 30-7 is connected to a first input of comparator 30-5 within the feedback loop. The feedback loop includes comparator 30-5, state machine 30-6, current adjust circuit 30-7, folded cascode 17-1, and low pass filter 30-4. The state machine is a sequential machine. Digital operations perform decisions once per clock cycle, unless the state machine halts the sequence operation.

In step 34-3, the initialization PLL loop is broken and the frequency selection block 30-18 is switched into the circuit to change the VCO control voltage to shift the VCO frequency from the locking frequency in the initialization PLL loop from 2 $f_0$ to 2 $f_0+\Delta f$, where $\Delta f$ is a small frequency shift compared to $f_0$.

In step 34-4, mixer 23-2 mixes the signal from the output of the analog multiplier 23-1 with the frequency generated by the VCO 24-4. The mixer 23-2, which can be a double-balanced Gilbert mixer (although other mixer configurations are possible), generates a mixed signal. The VCO output signal couples to the double-balanced Gilbert mixer. Optionally, the buffer 28-1 buffers the VCO output signal for improved capacitance drive characteristics.

In step 34-5, the mixed signal couples through folded cascode 17-1 to a second input of the comparator 30-5. The folded cascode 17-1 provides the current source for the mixer 23-2 and generates an output signal based on the signals coming out of the mixer 23-2. Low pass filter 30-4 filters the output signal and couples the filtered output signal to the second input of the comparator 30-5.

In step 34-6, a current is incrementally introduced into the feedback loop to adjust the second input to the adder 30-8 until the DC output of the folded cascode 17-1 substantially matches the voltage at the first input of the comparator 30-5. The feedback loop contains state machine 30-6, which operates sequentially. Once the comparator 30-5 receives its two inputs, the state machine receives the comparison result of the comparator and decides how to adjust the current into the node between the mixer and a folded cascode such that the differences between the inputs to the comparator reduce. Digitally weighed transistor arrays controlled by the state machine provide the current adjustments. The arrays include transistors placed in parallel and each transistor has a digitally scaled width of 1×, 2×, 4×, etc. The state machine enables the transistors to adjust the overall width of the array. The sequence of the state machine steps through each clock cycle and either increments or decrements the overall width of the transistor array by one minimum transistor width. Each step causes the voltage at the output of the folded cascode to change such that the difference applied to the inputs of the comparator decreases. In the sequential process, the transistor width of the array adjusts every clock cycle. Once the voltage inputs applied to the comparator flip polarity, the state machine stops the sequential process. The digital weight that was determined by the state machine is stored in memory. The memory holds the digital weight and applies this digital weight to the transistor arrays during normal operation.

In step 34-7, switch SW1 disconnects the frequency selection block from the input to the loop filter 26-4 and couples the output of the folded cascode 17-1 to the input of the loop filter 26-4. This switching process also forms the primary PLL loop including the loop filter 26-4, VCO 24-4, buffer 28-1, mixer 23-2, and folded cascode 17-1. Since the voltage at the output of the folded cascode 17-1 substantially matches the voltage at the output of the loop filter 26-4, coupling them minimizes the transient behavior of the primary PLL loop. This allows the newly formed primary PLL loop to operate well within its locking range.

In step 34-8, the primary PLL loop phase locks the 2 $f_0$ frequency of VCO to the 2 $f_0$ component of the multiplied components generated by the analog multiplier 23-1. The mixer 23-2 compares these two frequencies and reduces the DC voltage component at the output of the folded cascode 17-1. As the DC voltage component reduces to zero, the primary PLL loop becomes phase locked.

Other embodiments are within the following claims. For example, a network and a portable system can exchange information wirelessly by using communication techniques such as Time Division Multiple Access (TDMA), Frequency Division Multiple Access (FDMA), Code Division Multiple Access (CDMA), Orthogonal Frequency Division Multiplexing (OFDM), Ultra Wide Band (UWB), Wi-Fi, WiGig, Bluetooth, etc. The communication network can include the phone network, IP (Internet protocol) network, Local Area Network (LAN), ad hoc networks, local routers and even other portable systems. A "computer" can be a single machine or processor or multiple interacting machines or processors (located at a single location or at multiple locations remote from one another). One or more processors that can comprise multiple interacting machines or computers generate these digital or analog control signals. A computer-readable medium can be encoded with a computer program, so that execution of that program by one or more processors to perform one or more of the methods of phase and amplitude adjustment. The claimed semiconductor substrates can be implemented using semiconductors, such as, silicon, germanium, gallium arsenide, III-V semiconductor, etc. Packaged units called chips contain these semiconductor substrates and mount on a circuit board within the system of the phased array. The circuitry formed on the semiconductor substrates can use the technology of CMOS or BiCMOS fabrication.

What is claimed is:

1. A method for initializing a phase adder circuit for use with a signal distribution network having a first line carrying a first signal of a frequency $f_o$ and a second line carrying a second signal of the frequency $f_o$, said phase adder including a multiplier circuit with a first input electrically connected to the first line of the distribution network and a second input electrically connected to the second line of the distribution network, a mixer circuit electrically connected to the multiplier circuit, an amplifier circuit, a low pass loop filter, and a voltage controlled oscillator (VCO) with an input and an output, said method comprising:

during a first phase of operation, determining a reference voltage which when applied to the input of the VCO causes the VCO to produce at its output a signal having a frequency of $nf_0$, where n is a positive integer;

during a second phase of operation, supplying a signal of frequency $nf_o$ to a first input of the mixer;

supplying a signal of frequency ($nf_o+\Delta f$) to a second input of the mixer, wherein n is an integer greater than zero, and $\Delta f$ is a frequency that is smaller than $f_o$; and determining an adjustment signal which when applied to the amplifier circuit causes the amplifier circuit to output a signal having a DC component equal to the reference voltage; and during a third phase of operation, forming a primary phase locked loop (PLL) circuit including the mixer, the amplifier circuit, the low pass loop filter and the VCO; and applying the adjustment signal to the amplifier circuit.

2. The method of claim 1, wherein determining the reference voltage during the first phase of operation comprises forming an initialization PLL circuit including the VCO, the loop filter, and a phase detector having a first input, a second input, and an output, with the first input of the phase detector electrically connected to the first line of the signal distribution network, the second input of the phase detector electrically connected to the output of the VCO, and the output of the phase detector electrically connected to an input of the low pass loop filter.

3. The method of claim 2, wherein supplying the signal of frequency ($nf_o+\Delta f$) to the second input of the mixer during the second phase of operation comprises:

electrically disconnecting the input of the loop filter from the output of the phase detector; and electrically connecting the input of the loop filter to a signal source providing a frequency selection signal that causes the VCO to output a signal of frequency ($nf_o+\Delta f$).

4. The method of claim 3, wherein determining the adjustment signal during the second phase of operation involves incrementally adjusting a bias level that is supplied to the amplifier circuit until a target value is found at which the amplifier circuit outputs the signal having a DC component substantially equal to the reference voltage, wherein the target value is the adjustment signal.

5. The method of claim 4, wherein the amplifier circuit has an input node and wherein adjusting the bias level that is supplied to the amplifier circuit involves adjusting a bias current that is supplied to the input node of the amplifier circuit.

6. The method of claim 3, wherein forming the primary phase locked loop (PLL) circuit during the third phase of operation involves:

electrically disconnecting the input of the loop filter from the signal source providing the frequency selection signal; and electrically connecting the input of the loop filter to the output of the amplifier circuit.

7. The method of claim 1, wherein n is equal to 2.

8. The method of claim 1, wherein $\Delta f$ is much smaller than $f_0$.

9. The method of claim 1, further comprising implementing the multiplier circuit as a double balanced triode interface.

10. The method of claim 1, further comprising implementing the mixer circuit as a double balanced Gilbert mixer.

11. The method of claim 1, further comprising implementing the amplifier circuit as a folded cascode amplifier.

12. The method of claim 1, wherein the first and second signals are sinusoidal signals.

13. The method of claim 1, wherein the signal of frequency $nf_o$ that is supplied to a first input of the mixer during the second phase of operation is a sinusoidal signal and the signal of frequency $(nf_o+\Delta f)$ that is supplied to the second input of the mixer during the second phase of operation is a sinusoidal signal.

14. The method of claim 1, wherein the signal that is produced at the output of the VCO during the first phase of operation is a sinusoidal signal having a frequency of $nf_0$.

* * * * *